US010101498B2

(12) United States Patent
Berard et al.

(10) Patent No.: US 10,101,498 B2
(45) Date of Patent: Oct. 16, 2018

(54) WELL SURVIVABILITY IN MULTIDIMENSIONAL GEOMECHANICAL SPACE

(71) Applicant: Schlumberger Technology Corporation, Sugar Land, TX (US)

(72) Inventors: Thomas Berard, Bracknell (GB); Isabelle Telles, Bracknell (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 418 days.

(21) Appl. No.: 14/845,237

(22) Filed: Sep. 3, 2015

(65) Prior Publication Data

US 2016/0070024 A1 Mar. 10, 2016

Related U.S. Application Data

(60) Provisional application No. 62/046,571, filed on Sep. 5, 2014.

(51) Int. Cl.
*G06F 17/50* (2006.01)
*G01V 99/00* (2009.01)

(52) U.S. Cl.
CPC ........ *G01V 99/005* (2013.01); *G06F 17/5009* (2013.01)

(58) Field of Classification Search
USPC .................. 703/2; 175/40; 76/108.2; 73/788
See application file for complete search history.

(56) References Cited

U.S. PATENT DOCUMENTS

| 6,106,561 | A | 8/2000 | Farmer | |
|---|---|---|---|---|
| 6,543,312 | B2* | 4/2003 | Sullivan | E21B 10/08 175/40 |
| 7,630,914 | B2* | 12/2009 | Veeningen | G06Q 10/06 705/38 |
| 7,693,695 | B2* | 4/2010 | Huang | E21B 10/00 175/39 |
| 8,954,304 | B2* | 2/2015 | Moran | E21B 7/00 703/10 |
| 2003/0106378 | A1* | 6/2003 | Giannakopoulos | G01B 11/16 73/788 |
| 2005/0234690 | A1 | 10/2005 | Mainguy et al. | |
| 2010/0138196 | A1 | 6/2010 | Hui et al. | |
| 2010/0191511 | A1 | 7/2010 | Hsu et al. | |
| 2013/0166264 | A1 | 6/2013 | Usadi et al. | |

(Continued)

OTHER PUBLICATIONS

International Search Report and Written Opinion issued in related PCT application PCT/US2015/048778 dated Nov. 27, 2015, 17 pages.

(Continued)

*Primary Examiner* — Thai Phan
(74) *Attorney, Agent, or Firm* — Mitchell M. Blakely

(57) ABSTRACT

A method can include receiving well path data and geomechanical simulation data; rotating at least a portion of the geomechanical simulation data from geomechanical simulation coordinates to well coordinates associated with the well path data; determining at least one of an axial strain proxy and a shear strain proxy based at least in part on the rotating; and analyzing at least the one of the axial strain proxy and the shear strain proxy.

19 Claims, 25 Drawing Sheets

(56) References Cited

U.S. PATENT DOCUMENTS

2016/0103939 A1\* 4/2016 Kumar ............... G06F 17/5018
                                                          703/1
2017/0205388 A1\* 7/2017 Thomas ............... G01N 33/383

OTHER PUBLICATIONS

Ali Akbar, Anwar, et al, "Watching Rocks Change—Mechanical Earth Modeling", Oilfield Review, Summer 2013, pp. 1-18.
Schlumberger, Well-Centric Geomechanics, "Identify, predict, and prevent costly events and optimally manage your well".
International Preliminary Report on Patentability for the equivalent International patent application PCT/US2015/048778 dated Mar. 16, 2017, 11 pages.

\* cited by examiner

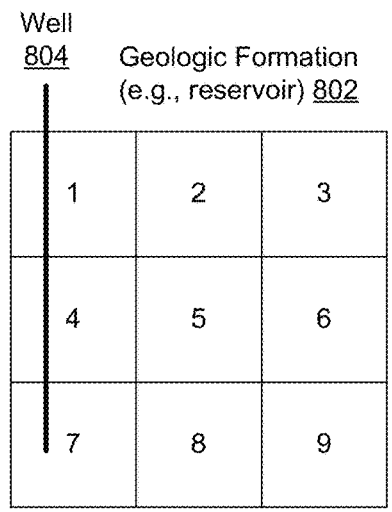

Well 804
Geologic Formation (e.g., reservoir) 802

| | 1 | 2 | 3 |
|---|---|---|---|
| | 4 | 5 | 6 |
| | 7 | 8 | 9 |

Full Matrix for Reservoir and Well 806

| | P S | P S | P S | P S | P S | P S | P S | P S | P S | P |
|---|---|---|---|---|---|---|---|---|---|---|
| 1 | X X<br>X X | X X<br>X X | | X X<br>X X | | | | | | X<br>X |
| 2 | X X<br>X X | X X<br>X X | X X<br>X X | | X X<br>X X | | | | | |
| 3 | | X X<br>X X | X X<br>X X | | | X X<br>X X | | | | |
| 4 | X X<br>X X | | | X X<br>X X | X X<br>X X | | X X<br>X X | | | X<br>X |
| 5 | | X X<br>X X | | X X<br>X X | X X<br>X X | X X<br>X X | | X X<br>X X | | |
| 6 | | | X X<br>X X | | X X<br>X X | X X<br>X X | | | X X<br>X X | |
| 7 | | | | X X<br>X X | | | X X<br>X X | X X<br>X X | | X<br>X |
| 8 | | | | | X X<br>X X | | X X<br>X X | X X<br>X X | X X<br>X X | |
| 9 | | | | | | X X<br>X X | | X X<br>X X | X X<br>X X | |
| | X X | | | X X | | | X X | | | X |

 Diagonal Terms      Off Diagonal Terms

Fig. 8

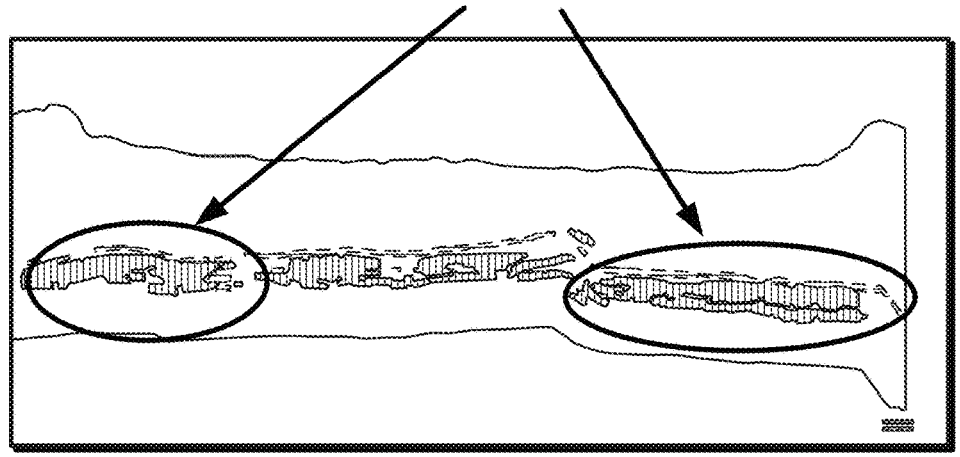
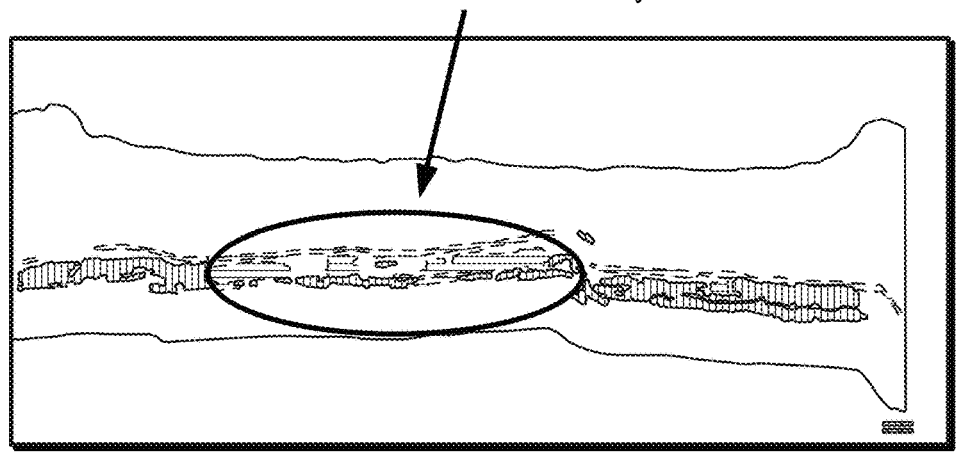
Fig. 14

Vertical Compression 1510
Vertical Compression Due to Production
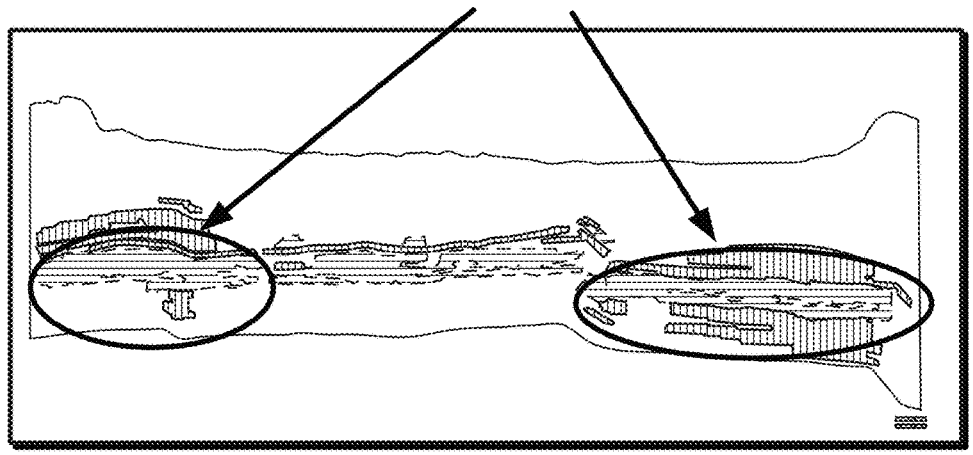
Vertical Compression 1530
Vertical Stretching from Injection
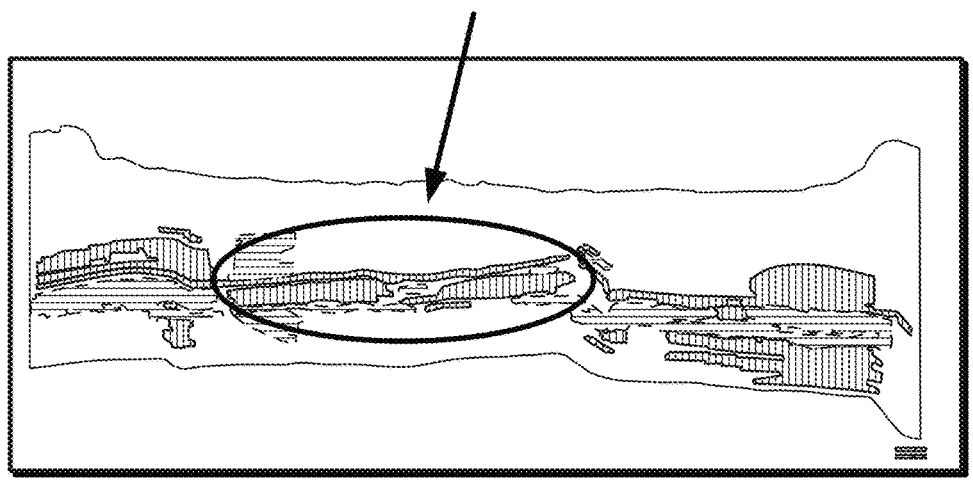
Fig. 15

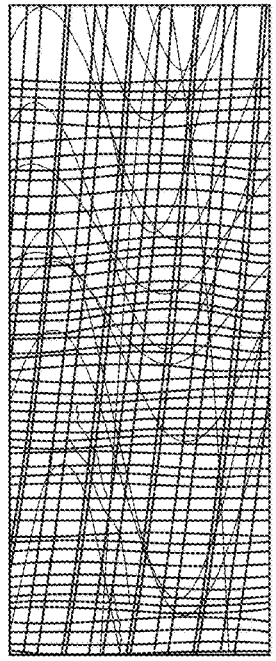
Image Logs  2310
(e.g., FMI, UBI, OBMI)
· Bedding
· Structural
· Fractures ⟨ Natural / Stress-induced
Anisotropy from Sonic  2330
(e.g., Sonic Scanner)
· Intrinsic
  e.g., bedding, layering, crystals, etc.
· Cracks or Fractures
· Differential Stress
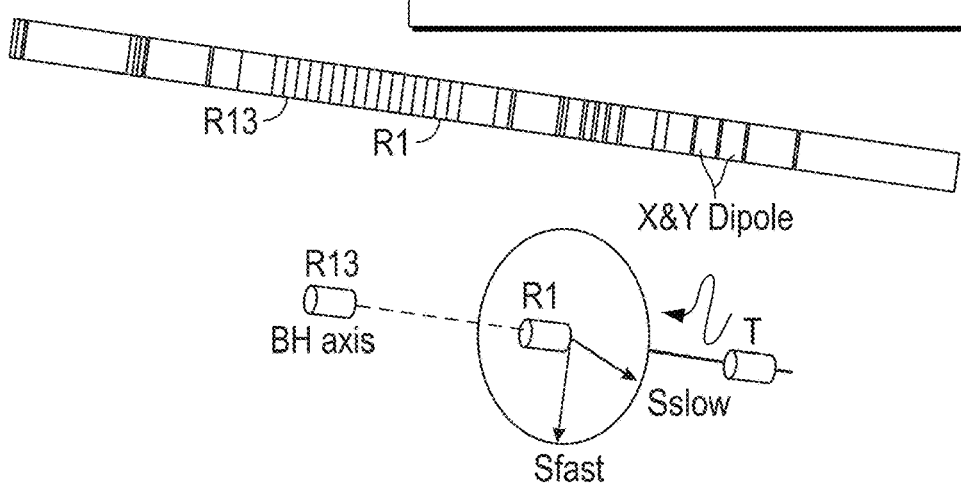
Fig. 23

WELL SURVIVABILITY IN MULTIDIMENSIONAL GEOMECHANICAL SPACE

RELATED APPLICATIONS

This application claims priority to and the benefit of a U.S. Provisional Application having Ser. No. 62/046,571, filed 5 Sep. 2014, which is incorporated by reference herein.

BACKGROUND

A geologic formation can deform over time, for example, responsive to one or more operations such as, for example, injection of material, production of material, etc. For example, injection of fluid into a reservoir may change a stress field and lead to deformation in one manner while production of fluid from a reservoir may change a stress field and lead to deformation in another manner.

SUMMARY

In accordance with some embodiments, a method includes receiving well path data and geomechanical simulation data for a geologic environment; rotating at least a portion of the geomechanical simulation data from geomechanical simulation coordinates to well coordinates associated with the well path data; determining at least one of an axial strain proxy and a shear strain proxy based at least in part on the rotating; and analyzing at least the one of the axial strain proxy and the shear strain proxy.

In some embodiments, an aspect of a method includes assessing structural stability of well casing, well cement or well casing and well cement.

In some embodiments, an aspect of a method includes classifying at least a portion of a well as a member of a class by comparing an axial strain proxy to an axial strain threshold.

In some embodiments, an aspect of a method includes classifying at least a portion of a well as a member of a class by comparing a shear strain proxy to a shear strain threshold.

In some embodiments, an aspect of a method includes classifying at least a portion of a well as a member of a class by comparing an axial strain proxy to an axial strain threshold and by comparing a shear strain proxy to a shear strain threshold.

In some embodiments, an aspect of a method includes updating an axial strain threshold based at least in part on field data, updating a shear strain threshold based at least in part on field data or updating an axial strain threshold and a shear strain threshold based at least in part on field data.

In some embodiments, an aspect of a method includes geomechanical simulation data that include data associated with grid cells of a grid of a geomechanics simulator.

In some embodiments, an aspect of a method includes geomechanical simulation coordinates that are associated with a Cartesian coordinate system and well coordinates that are associated with a cylindrical coordinate system or associated with a different Cartesian coordinate system.

In some embodiments, an aspect of a method includes rotating a local strain tensor, for example, consider rotating a local strain tensor associated with a grid cell that is associated with a portion of geomechanical simulation data.

In some embodiments, an aspect of a method includes rotating a local strain tensor into a set of coordinate axes associated with a location of at least a portion of a path of a well, for example, where the set of coordinate axes can include one axis aligned with a well axis of the well and two axes in a cross-sectional plane of the well.

In some embodiments, an aspect of a method includes geomechanical simulation data that are associated with a time where, for example, the time can be one of a past time, a current time or a future time.

In some embodiments, an aspect of a method includes repeating receiving, rotating, determining and analyzing for one or more different times.

In some embodiments, an aspect of a method includes performing a geomechanical simulation that outputs updated geomechanical simulation data; rotating at least a portion of the updated geomechanical simulation data from geomechanical simulation coordinates to well coordinates associated with well path data; determining at least one of an updated axial strain proxy and an updated shear strain proxy based at least in part on the rotating; and analyzing at least the one of the updated axial strain proxy and the updated shear strain proxy.

In some embodiments, an aspect of a method includes rendering information to a display based at least in part on the analyzing.

In some embodiments, an aspect of a method includes well path data include data for at least one well path.

In some embodiments, an aspect of a method includes well coordinates that correspond to a single well.

In accordance with some embodiments, a system includes a processor; memory; one or more modules stored in the memory where the modules include instructions executable by the processor to instruct the system and wherein the instructions comprise instructions to: receive well path data for a well path and geomechanical simulation data for a geologic environment; rotate at least a portion of the geomechanical simulation data from geomechanical simulation coordinates to well coordinates associated with the well path data; determine, for at least a portion of a well path, at least one of an axial strain proxy and a shear strain proxy; and analyze at least the one of the axial strain proxy and the shear strain proxy.

In accordance with some embodiments, one or more computer-readable storage media include computer-executable instructions to instruct a computing system where the instructions include instructions to: receive well path data for a well path and geomechanical simulation data for a geologic environment; rotate at least a portion of the geomechanical simulation data from geomechanical simulation coordinates to well coordinates associated with the well path data; determine, for at least a portion of the well path, at least one of an axial strain proxy and a shear strain proxy; and analyze at least the one of the axial strain proxy and the shear strain proxy.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

FIG. 8 illustrates an example of a reservoir model and an associated matrix;

FIG. 14 illustrates example plots of pore pressure in a geologic environment;

FIG. 15 illustrates example plots of vertical compression in a geologic environment;

FIG. 23 illustrates examples of data acquisition techniques;

DETAILED DESCRIPTION

Figure 1:
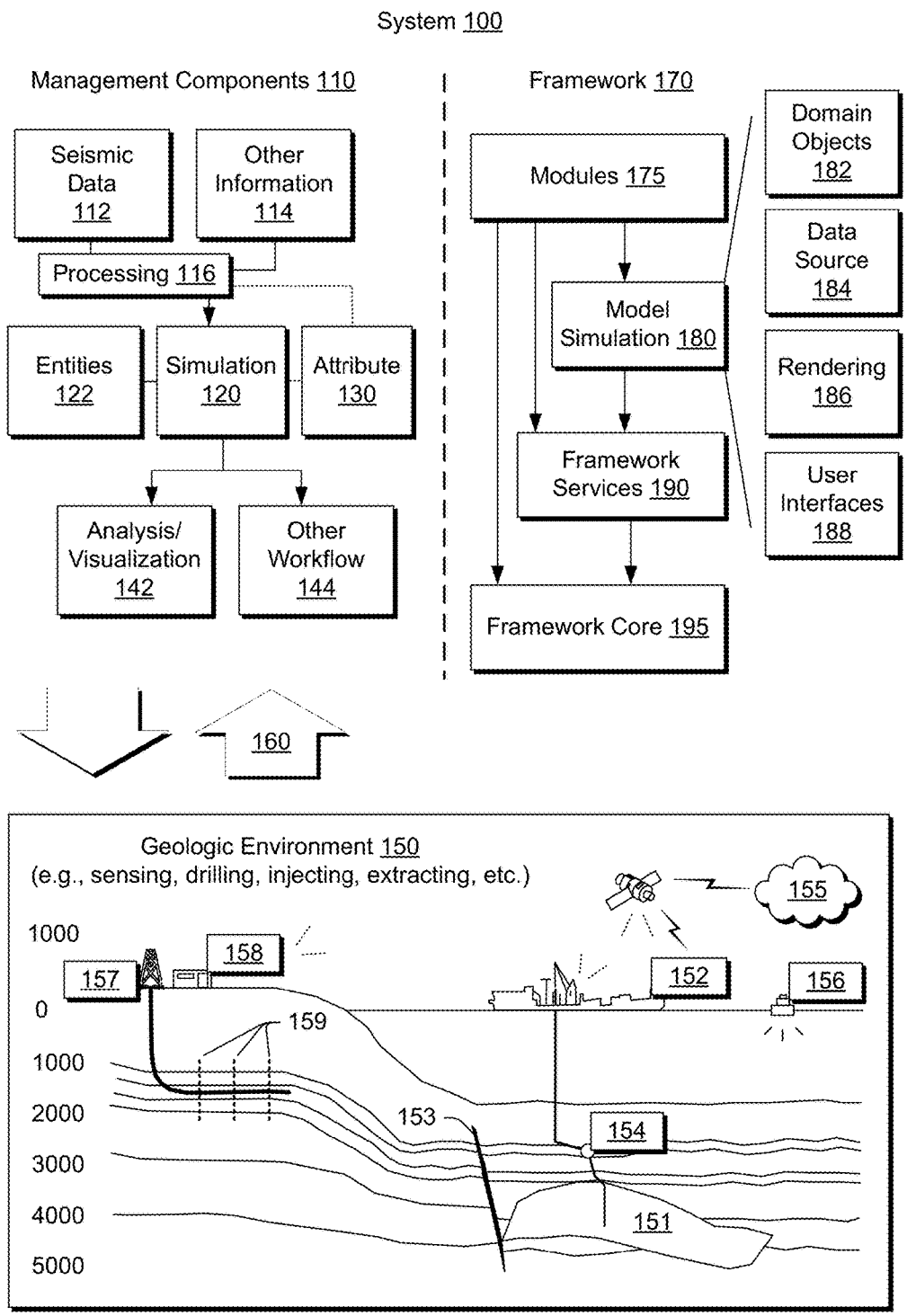
FIG. 1 illustrates an example system that includes various components for modeling a geologic environment and various equipment associated with the geologic environment.

The following description includes the best mode presently contemplated for practicing the described implementations. This description is not to be taken in a limiting sense, but rather is made merely for the purpose of describing the general principles of the implementations. The scope of the described implementations should be ascertained with reference to the issued claims.

As mentioned, a geologic formation can deform over time. Deformation may effect one or more field operations (e.g., drilling, casing, cementing, measuring, production, injection, etc.) and may effect equipment deployed in a borehole or to be deployed in a borehole (e.g., whether cased, uncased, etc.).

As an example, a method can include assessing survivability of a borehole, which may be cased, cemented, cased and cemented, etc. Such a borehole may be an actual borehole, a planned borehole, a borehole to be extended via one or more branches, etc. Survivability of a borehole may be assessed, qualitatively and/or quantitatively, based at least in part on how material deforms.

As an example, a geomechanical simulation of a modeled geologic environment can provide information germane to how material in the geologic environment deforms. Further, where a geologic environment includes a reservoir, a reservoir simulation can provide information germane to material deformation. For example, consider simulating a reservoir where one or more wells inject fluid into and/or produce fluid from the reservoir over some period of time.

As an example, a geologic environment may include a plurality of reservoirs. In such an example, one or more of the reservoirs may be modeled. As an example, a geomechanical model may span at least a portion of a first reservoir and at least a portion of a second reservoir. In such an example, movement of fluid of the first reservoir and/or movement of fluid of the second reservoir may be analyzed with respect to geomechanics. For example, production of fluid of the first reservoir may result in compaction of reservoir rock of the first reservoir that may affect rock associated with the second reservoir. For example, the overburden of the first reservoir may be affected in a manner that also has an effect on the second reservoir. As an example, a geomechanical model may be coupled to a plurality of reservoir models. In such an example, a geomechanics modeling framework that models a geologic environment may be operatively coupled with a reservoir modeling framework or reservoir modeling frameworks where more than one reservoir may be modeled (e.g., as being within the geologic environment).

As an example, where multiple reservoirs exist, wells may extend to each of the reservoirs. As an example, deformation of a reservoir may have an impact on one or more other reservoirs in a geologic environment that includes multiple reservoirs. As an example, reservoirs may be "stacked", for example, one reservoir may be at a first depth (e.g., first depth range) and another reservoir may be at a second depth (e.g., a second depth range). A field development plan may aim to develop reservoirs separately and/or in a coordinated manner. As an example, survivability may be assessed in a geologic environment that includes one or more reservoirs.

As an example, a method can include assessing survivability of a borehole, which may be a well, via information obtained via geomechanical simulation and reservoir simulation of a geologic environment. In such an example, the information may be given with respect to a coordinate system in which the geologic environment is modeled. As an example, a method can include transforming at least a portion of the information to another coordinate system that is local to a borehole (e.g., whether drilled, proposed, planned, etc.). In the coordinate system local to the borehole, such information may be used to calculate one or more metrics to assess survivability of at least a portion of the borehole. For example, an axial strain metric and a shear metric may be calculated that can characterize stretching or shortening and shearing, respectively. Such types of deformation may result in a change of shape of a borehole that may make the borehole unsuitable for one or more purposes. For example, a borehole may become disjointed, kinked, narrowed, misshapen, etc. Such changes may be assessed to determine whether a borehole, quantitatively and/or qualitatively, survives.

Borehole survivability, or well survivability, can be of interest at one or more stages, whether operational in the field or in planning field operations. Time scales of interest may be relatively short, for example, of the order of hours, to relatively long, for example, of the order of decades.

Survivability can be of interest in a decommissioning stage where, for example, one or more wells may be shut down and aim to survive over a time scale that may be of the order of decades (e.g., tens of years), over which a geologic environment may gradually equilibrate.

FIG. 1 shows an example of a system 100 that includes various management components 110 to manage various aspects of a geologic environment 150 (e.g., an environment that includes a sedimentary basin, a reservoir 151, one or more fractures 153, etc.). For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the management components 110 include a seismic data component 112, an additional information component 114 (e.g., well/logging data), a processing component 116, a simulation component 120, an attribute component 130, an analysis/visualization component 142 and a workflow component 144. In operation, seismic data and other information provided per the components 112 and 114 may be input to the simulation component 120.

In an example embodiment, the simulation component 120 may rely on entities 122. Entities 122 may include earth entities, geological objects or other objects such as wells, surfaces, reservoirs, etc. In the system 100, the entities 122 can include virtual representations of actual physical entities that are reconstructed for purposes of simulation. The entities 122 may include entities based on data acquired via sensing, observation, etc. (e.g., the seismic data 112 and other information 114). An entity may be characterized by one or more properties (e.g., a geometrical pillar grid entity of an earth model may be characterized by a porosity property). Such properties may represent one or more measurements (e.g., acquired data), calculations, etc.

In an example embodiment, the simulation component 120 may operate in conjunction with a software framework such as an object-based framework. In such a framework, entities may include entities based on pre-defined classes to facilitate modeling and simulation. A commercially available example of an object-based framework is the MICROSOFT™ .NET™ framework (Redmond, Wash.), which provides a set of extensible object classes. In the .NET™ framework, an object class encapsulates a module of reusable code and associated data structures. Object classes can be used to instantiate object instances for use in by a program, script, etc. For example, borehole classes may define objects for representing boreholes based on well data.

In the example of FIG. 1, the simulation component 120 may process information to conform to one or more attributes specified by the attribute component 130, which may include a library of attributes. Such processing may occur prior to input to the simulation component 120 (e.g., consider the processing component 116). As an example, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results (e.g., simulation results, etc.). As an example, output from the simulation component 120 may be input to one or more other workflows, as indicated by a workflow component 144.

As an example, the simulation component 120 may include one or more features of a simulator such as the ECLIPSE® reservoir simulator (Schlumberger Limited, Houston Tex.), the INTERSECT® reservoir simulator (Schlumberger Limited, Houston Tex.), etc. As an example, a reservoir or reservoirs may be simulated with respect to one or more enhanced recovery techniques (e.g., consider a thermal process such as SAGD, etc.).

In an example embodiment, the management components 110 may include features of a commercially available framework such as the PETREL® seismic to simulation software framework (Schlumberger Limited, Houston, Tex.). The PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, well engineers, reservoir engineers, etc.) can develop collaborative workflows and integrate operations to streamline processes. Such a framework may be considered an application and may be considered a data-driven application (e.g., where data is input for purposes of modeling, simulating, etc.).

In an example embodiment, various aspects of the management components 110 may include add-ons or plug-ins that operate according to specifications of a framework environment. For example, a commercially available framework environment marketed as the OCEAN® framework environment (Schlumberger Limited, Houston, Tex.) allows for integration of add-ons (or plug-ins) into a PETREL® framework workflow. The OCEAN® framework environment leverages .NET™ tools (Microsoft Corporation, Redmond, Wash.) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may include the commercially available OCEAN® framework where the model simulation layer 180 is the commercially available PETREL® model-centric software package that hosts OCEAN® framework applications. In an example embodiment, the PETREL® software may be considered a data-driven application. The PETREL® software can include a framework for model building and visualization. Such a model may include one or more grids.

The model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for application user interface components.

In the example of FIG. 1, the domain objects 182 can include entity objects, property objects and optionally other objects. Entity objects may be used to geometrically represent wells, surfaces, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases. Thus, upon completion of a modeling session, a user may store a project. At a later time, the project can be accessed and restored using the model simulation layer 180, which can recreate instances of the relevant domain objects.

In the example of FIG. 1, the geologic environment 150 may include layers (e.g., stratification) that include a reservoir 151 and that may be intersected by a fault 153. As an example, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1 shows a satellite in communication with the network 155 that may be configured for communications, noting that the satellite may additionally or alternatively include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

As mentioned, the system 100 may be used to perform one or more workflows. A workflow may be a process that includes a number of worksteps. A workstep may operate on data, for example, to create new data, to update existing data, etc. As an example, a workflow may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable in the PETREL® software, for example, that operates on seismic data, seismic attribute(s), etc. As an example, a workflow may be a process implementable in the OCEAN® framework. As an example, a workflow may include one or more worksteps that access a module such as a plug-in (e.g., external executable code, etc.).

Figure 2:
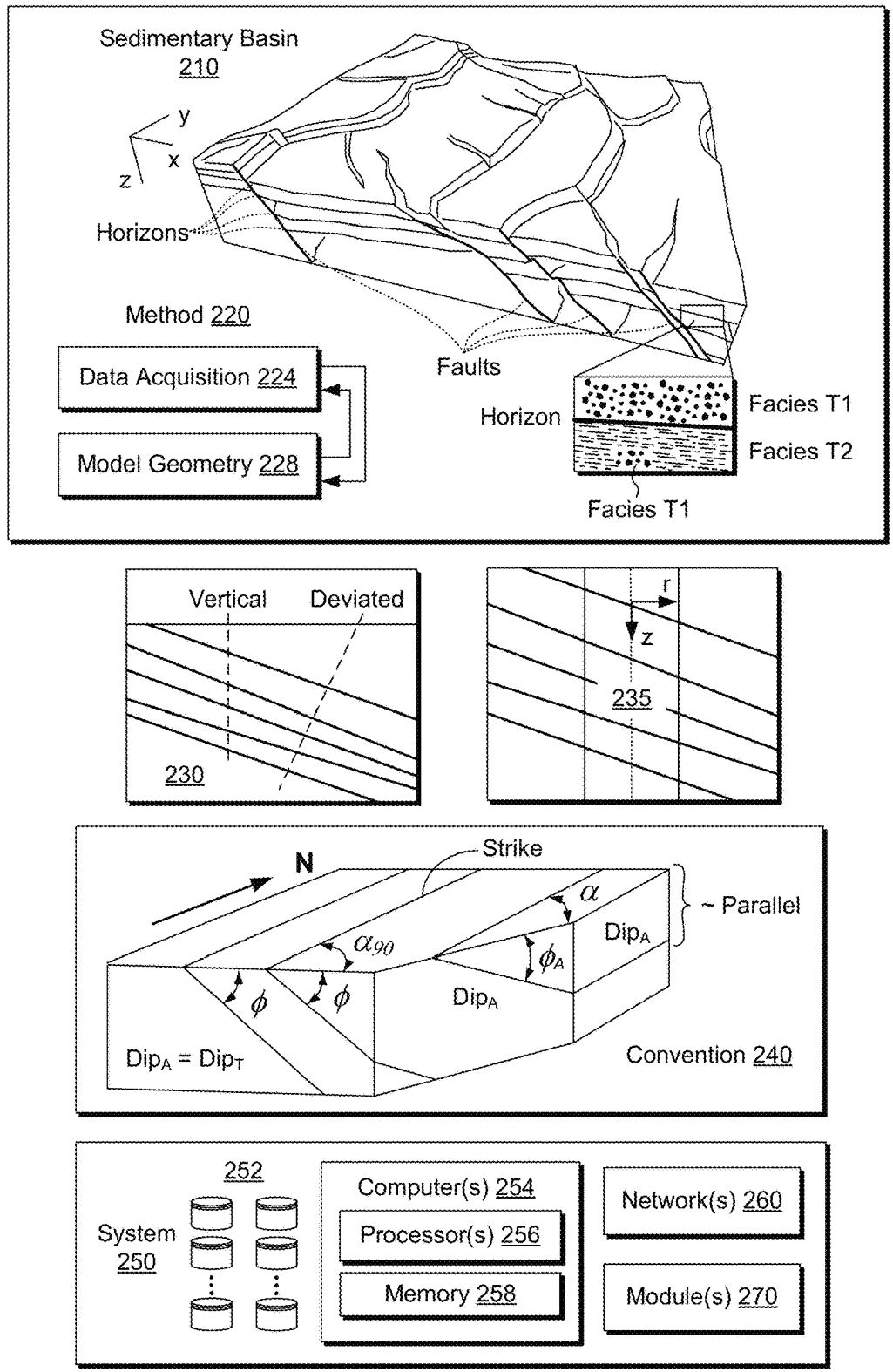
FIG. 2 illustrates an example of a sedimentary basin, an example of a method, an example of a formation, an example of a borehole, an example of a convention and an example of a system.

FIG. 2 shows an example of a sedimentary basin 210, an example of a method 220 for model building (e.g., for a simulator, etc.), an example of a formation 230, an example of a borehole 235 in a formation, an example of a convention 240 and an example of a system 250.

As an example, reservoir simulation, petroleum systems modeling, etc. may be applied to characterize various types of subsurface environments, including environments such as those of FIG. 1.

In FIG. 2, the sedimentary basin 210, which is a geologic environment, includes horizons, faults and facies formed over some period of geologic time. These features are distributed in two or three dimensions in space, for example, with respect to a Cartesian coordinate system (e.g., x, y and z) or other coordinate system (e.g., cylindrical, spherical, etc.). As shown, the model building method 220 includes a data acquisition block 224 and a model geometry block 228. Some data may be involved in building an initial model and, thereafter, the model may optionally be updated in response to model output, changes in time, physical phenomena, additional data, etc. As an example, data for modeling may include one or more of the following: depth or thickness maps and fault geometries and timing from seismic, remote-sensing, electromagnetic, gravity, outcrop and well log data. Furthermore, data may include depth and thickness maps stemming from facies variations (e.g., due to seismic unconformities) assumed to following geological events ("iso" times) and data may include lateral facies variations (e.g., due to lateral variation in sedimentation characteristics).

To proceed to modeling of geological processes, data may be provided, for example, data such as geochemical data (e.g., temperature, kerogen type, organic richness, etc.), timing data (e.g., from paleontology, radiometric dating, magnetic reversals, rock and fluid properties, etc.) and boundary condition data (e.g., heat-flow history, surface temperature, paleowater depth, etc.).

In basin and petroleum systems modeling quantities such as temperature, pressure and porosity distributions within the sediments may be modeled by solving partial differential equations (PDEs) using a finite element method (e.g., or other numerical technique). Modeling may also model geometry with respect to time, for example, to account for changes stemming from geological events (e.g., deposition of material, erosion of material, shifting of material, etc.).

A commercially available modeling framework marketed as the PETROMOD® framework (Schlumberger Limited, Houston, Tex.) includes features for input of various types of information (e.g., seismic, well, geological, etc.) to model evolution of a sedimentary basin.

As shown in FIG. 2, the formation 230 includes a horizontal surface and various subsurface layers. As an example, a borehole may be vertical. As another example, a borehole may be deviated. In the example of FIG. 2, the borehole 235 may be considered a vertical borehole, for example, where the z-axis extends downwardly normal to the horizontal surface of the formation 230.

As to the convention 240 for dip, as shown, the three dimensional orientation of a plane can be defined by its dip and strike. Dip is the angle of slope of a plane from a horizontal plane (e.g., an imaginary plane) measured in a vertical plane in a specific direction. Dip may be defined by magnitude (e.g., also known as angle or amount) and azimuth (e.g., also known as direction). As shown in the convention 240 of FIG. 2, various angles φ indicate angle of slope downwards, for example, from an imaginary horizontal plane (e.g., flat upper surface); whereas, dip refers to the direction towards which a dipping plane slopes (e.g., which may be given with respect to degrees, compass directions, etc.). Another feature shown in the convention of FIG. 2 is strike, which is the orientation of the line created by the intersection of a dipping plane and a horizontal plane (e.g., consider the flat upper surface as being an imaginary horizontal plane).

Some additional terms related to dip and strike may apply to an analysis, for example, depending on circumstances, orientation of collected data, etc. One term is "true dip" (see, e.g., $Dip_T$ in the convention 240 of FIG. 2). True dip is the dip of a plane measured directly perpendicular to strike (see, e.g., line directed northwardly and labeled "strike" and angle $\alpha_{90}$) and also the maximum possible value of dip magnitude. Another term is "apparent dip" (see, e.g., $Dip_A$ in the convention 240 of FIG. 2). Apparent dip may be the dip of a plane as measured in any other direction except in the direction of true dip (see, e.g., $\phi_A$ as $Dip_A$ for angle α); however, it is possible that the apparent dip is equal to the true dip (see, e.g., φ as $Dip_A=Dip_T$ for angle $\alpha_{90}$ with respect to the strike). In other words, where the term apparent dip is used (e.g., in a method, analysis, algorithm, etc.), for a particular dipping plane, a value for "apparent dip" may be equivalent to the true dip of that particular dipping plane.

As shown in the convention 240 of FIG. 2, the dip of a plane as seen in a cross-section perpendicular to the strike is true dip (see, e.g., the surface with φ as $Dip_A=Dip_T$ for angle $\alpha_{90}$ with respect to the strike). As indicated, dip observed in a cross-section in any other direction is apparent dip (see, e.g., surfaces labeled $Dip_A$). Further, as shown in the convention 240 of FIG. 2, apparent dip may be approximately 0 degrees (e.g., parallel to a horizontal surface where an edge of a cutting plane runs along a strike direction).

In terms of observing dip in wellbores, true dip is observed in wells drilled vertically. In wells drilled in any other orientation (or deviation), the dips observed are apparent dips (e.g., which are referred to by some as relative dips). In order to determine true dip values for planes observed in such boreholes, as an example, a vector computation (e.g., based on the borehole deviation) may be applied to one or more apparent dip values.

As mentioned, another term that finds use in sedimentological interpretations from borehole images is "relative dip" (e.g., $Dip_R$). A value of true dip measured from borehole images in rocks deposited in very calm environments may be subtracted (e.g., using vector-subtraction) from dips in a sand body. In such an example, the resulting dips are called relative dips and may find use in interpreting sand body orientation.

A convention such as the convention 240 may be used with respect to an analysis, an interpretation, an attribute, etc. (see, e.g., various blocks of the system 100 of FIG. 1). As an example, various types of features may be described, in part, by dip (e.g., sedimentary bedding, faults and fractures, cuestas, igneous dikes and sills, metamorphic foliation, etc.).

Seismic interpretation may aim to identify and/or classify one or more subsurface boundaries based at least in part on one or more dip parameters (e.g., angle or magnitude, azimuth, etc.). As an example, various types of features (e.g., sedimentary bedding, faults and fractures, cuestas, igneous dikes and sills, metamorphic foliation, etc.) may be described at least in part by angle, at least in part by azimuth, etc.

As shown in FIG. 2, the system 250 includes one or more information storage devices 252, one or more computers 254, one or more networks 260 and one or more modules 270. As to the one or more computers 254, each computer may include one or more processors (e.g., or processing cores) 256 and memory 258 for storing instructions (e.g., modules), for example, executable by at least one of the one or more processors. As an example, a computer may include one or more network interfaces (e.g., wired or wireless), one or more graphics cards, a display interface (e.g., wired or wireless), etc. As an example, imagery such as surface imagery (e.g., satellite, geological, geophysical, etc.) may be stored, processed, communicated, etc. As an example, data may include SAR data, GPS data, etc. and may be stored, for example, in one or more of the storage devices 252.

As an example, the one or more modules 270 may include instructions (e.g., stored in memory) executable by one or more processors to instruct the system 250 to perform various actions. As an example, the system 250 may be configured such that the one or more modules 270 provide for establishing the framework 170 of FIG. 1 or a portion thereof. As an example, one or more methods, techniques, etc. may be performed using one or more modules, which may be, for example, one or more of the one or more modules 270 of FIG. 2.

Figure 3:
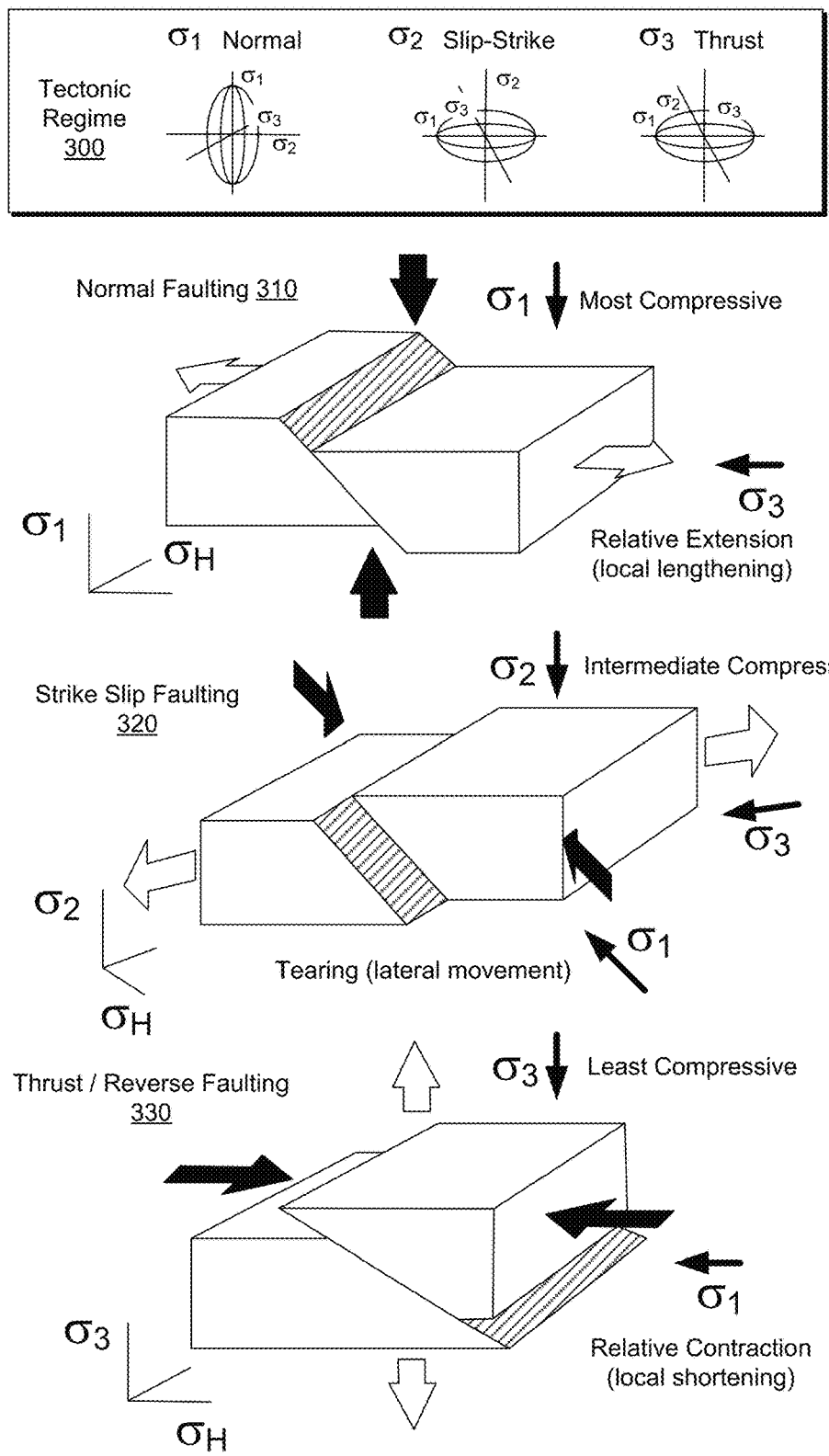
FIG. 3 illustrates an example of a tectonic regime.

FIG. 3 shows an example of a tectonic regime 300 and examples of normal faulting 310, strike slip faulting 320 and thrust or reverse faulting 330. Stress may be defined, for example, as force per unit area acting on a plane. In a solid body, for example, a stress state at a point in the solid body may be described by orientations and magnitudes of three stresses called principal stresses, which are oriented perpendicular to each other (e.g., orthogonal to each other).

As shown in FIG. 3, $\sigma_1$, $\sigma_2$ and $\sigma_3$ are compressive or tensile principal stresses where, in magnitude, 1>2>3. As an example, about a point, the three principal stresses may be shown, or represented, as an ellipsoid where the magnitude of each component defines a maximum along a respective one of the three orthogonal axes. Compressive stress and shortening strain are considered positive in rock mechanics and structural geology because in the Earth the three principal stresses tend to be compressive (e.g., except around underground voids such as caves, very near to the Earth's surface, etc.).

The tectonic regime 300 may be defined by considering one axis being vertical. For example, a normal fault regime corresponds to $\sigma_1$ being vertical, a strike slip fault regime corresponds to $\sigma_2$ being vertical and a thrust or reverse fault regime corresponds to $\sigma_3$ being vertical. The tectonic regime 300 may also define stresses $\sigma_H$, $\sigma_m$ and $\sigma_v$ are the maximum horizontal stress ($\sigma_H$), a minimum horizontal stress ($\sigma_h$) that may be orthogonal to the maximum horizontal stress, and a vertical stress ($\sigma_v$). The orientation of the maximum horizontal stress $\sigma_H$ may be defined by an angle $\theta_H$, which may be local (e.g., for a point or a feature), far field, etc.

As an example, various types of parameters may be germane to field activities such as drilling, well completion, seismic migration velocity model construction, wellbore stability, hydraulic fracturing design and hydraulic fracture monitoring. As an example, as to shale gas reservoirs, knowledge of anisotropy parameters can assist with planning, execution, etc., especially where one or more well configurations may vary over some range between vertical and horizontal.

As an example, information may be acquired about a formation using seismology, for example, to acquire seismic data. As mentioned, seismic data may be processed using a framework such as, for example, the PETREL® framework. As an example, such a framework may include one or more interfaces for receipt of seismic data, imagery data, etc. Such a framework may include one or more modules with instructions executable to process received data. As an example, seismic data may optionally be analyzed to determine one or more parameters.

As an example, flow of fluid into and/or out of a reservoir may be modeled and simulated using a reservoir simulator such as, for example, the ECLIPSE® reservoir simulator or the INTERSECT® reservoir simulator. As an example, geomechanics of a basin, a reservoir, etc. may be modeled and simulated using a framework such as, for example, the VISAGE® framework (Schlumberger Limited, Houston, Tex.). As an example, information may be coupled from simulators, frameworks, etc. For example, flow information from a reservoir simulator may be input to a geomechanics framework that can model response of a geologic environment to flow (e.g., injection flow and/or production flow).

As an example, a framework may include one or more modules that can model stimulation of a geologic environment, for example, to generate one or more fractures. For example, consider the commercially available MANGROVE® framework (Schlumberger Limited, Houston, Tex.), which may be operated in conjunction with one or more other frameworks. The MANGROVE® framework may be operated as a hydraulic fracturing simulator and may be, for example, integrated into one or more seismic-to-simulation workflows (e.g., for conventional and/or unconventional reservoirs) and/or one or more other types of workflows. As an example, the MANGROVE® package may be implemented to grid and model complex fractures, which may be used for reservoir simulation (e.g., via the ECLIPSE® framework, the INTERSECT® framework, etc.).

As an example, stimulation design functionality may be implemented to predict realistic fracture scenarios. As an example, an unconventional fracture model (UFM) may be utilized for simulation of one or more fractures. As an example, a UFM may be utilized to simulate fracture network propagation in a formation with pre-existing natural fractures. In such an example, simulation results may reveal generation and/or reactivation of multiple fracture branches where some of the fracture branches may intersect (e.g., forming a coupled fracture network).

As an example, stimulation modeling may be coupled with geomechanical modeling and/or reservoir modeling. As to geomechanics, as an example, an opening or open fracture (e.g., including fluid, proppant, etc.), can exert stresses on surrounding rock and, for example, one or more adjacent fractures (e.g., a "stress shadow" effect). As an example, fluid in reservoir rock may drain into a fracture, which may alter pressures in the reservoir rock, which may lead to some amount of compaction of the reservoir rock.

As an example, a stress shadow may act to restrict fracture width, which may increase risk of flow restriction (e.g., consider proppant screenout, etc.). As an example, a stress shadow may alter a fracture propagation path, which may affect a fracture network pattern.

As an example, a method may include reservoir modeling, stimulation modeling (e.g., fracture modeling) and geomechanical modeling, for example, to couple flows, fractures and stresses (e.g., as well as strains that may develop over time). As an example, a stimulation framework may be implemented as a part of a workflow that aims to optimize well completion designs. As an example, a stimulation framework may be implemented as part of a workflow that aims to assess well survivability (e.g., as may be affected by one or more fracturing operations, flow in fractures, etc.).

A stimulation design workflow may provide estimates of proppant placement, fracture network dimensions, and reservoir penetration based on formation properties such as, for example, one or more of reservoir fluid rheology, leakoff coefficient, permeability, and closure stress.

As an example, a feedback loop may be implemented to compare simulations to actual results. For example, real-time data, such as that acquired by a hydraulic fracture mapping service (e.g., consider STIMMAP® as a stimulation mapping service) may be compared to simulated results (e.g., to help to optimize treatments as they are being performed). Such comparisons may help improve well planning and reduce operational risks.

As an example, a workflow may include simulating wellbore stability conditions for drilling applications. Stability conditions may include, for example, one or more of mechanical stability and/or chemical stability conditions along a given well trajectory. As an example, stability conditions may concern rock, hydraulic fractures, natural fractures and faults, bedding surfaces, etc.

As an example, the MANGROVE® framework may provide for generation of suitable resolution simulation grids by gridding one or more fracture networks while capturing fracture dimensions and conductivities, as well as tracking the propped and unpropped regions in a network or networks. As an example, unstructured and/or structured gridding tools, as appropriate, may be implemented to help capture geology and fracture stimulation impact.

As an example, one or more of a planar fracture model, a multilayer fracture model, a UFM and a wiremesh model may be implemented for simulating fractures such as, for example, nonplanar complex hydraulic fractures in shale reservoirs and/or "conventional" planar fractures.

As an example, a UFM may be coupled to numerical modeling framework, for example, for simulating complex fracture geometries, while accounting for reservoir heterogeneity, stress anisotropy, and stress-shadow effects. Such an approach may model hydraulic fracture interactions with natural fractures while solving for fracture propagation mechanics and proppant transport. As to a wiremesh model, it may include a mathematical representation of a hydraulic fracture network, which may, for example, provide for estimation of proppant placement and fracture network dimensions.

As an example, hydraulic fracture simulator models may model fracture growth into layers above and/or below a pay zone, for example, along with bi-wing fracture extension. As an example, the MULTIFRAC™ package (Schlumberger Limited, Houston Tex.) may provide for simultaneous multizone fracturing simulations (e.g., with simultaneous initiation and extension of multiple hydraulic fractures).

Figure 4:
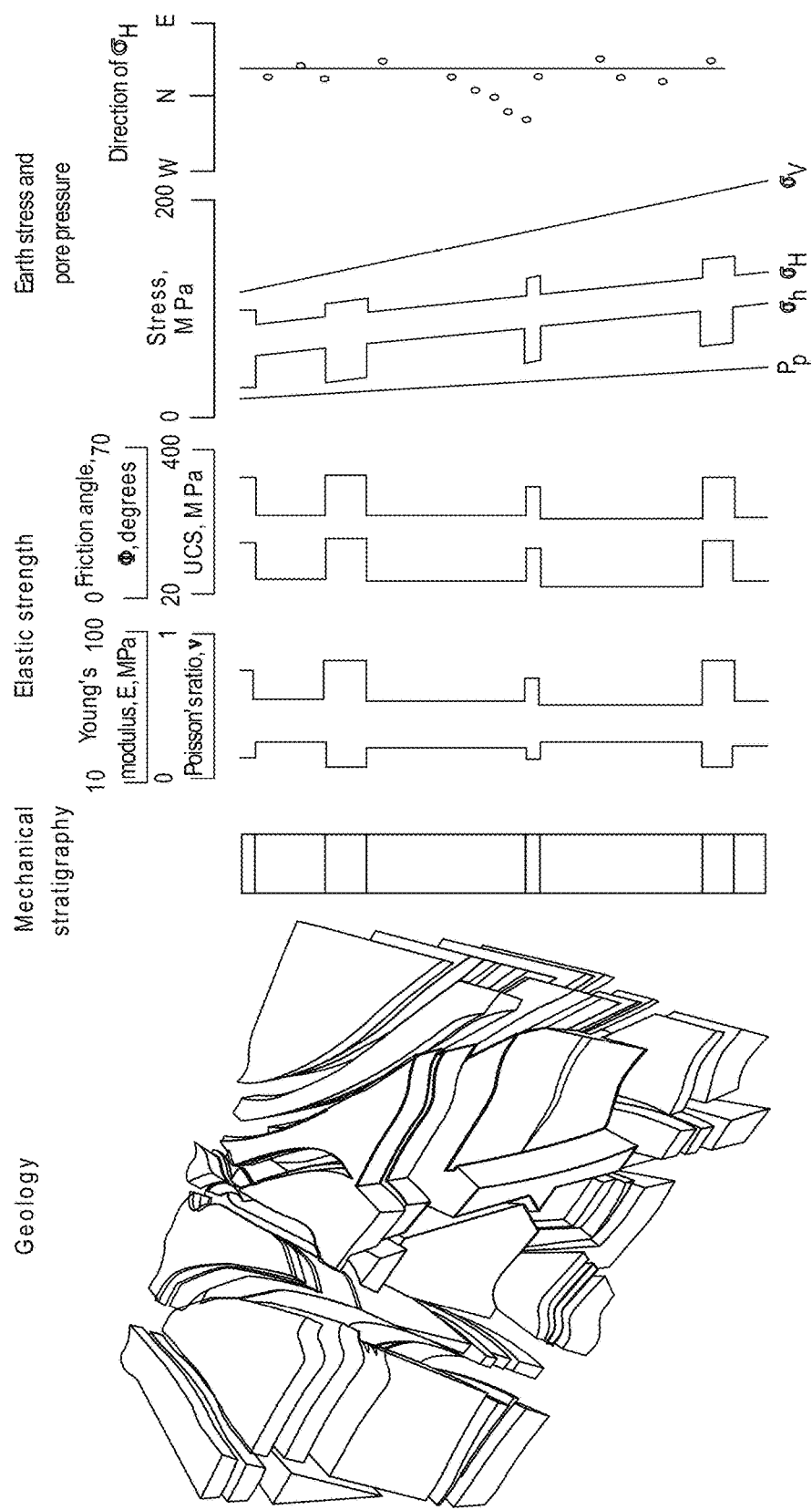
FIG. 4 illustrates an example of a model of a geologic environment and associated information.

FIG. 4 shows an example of a model 410 of a geologic environment. As shown, the model 410 is stratified where various types of information exist for the strata. For example, FIG. 4 shows information about facies types and local deformation mechanisms from which profiles of elastic and rock-strength parameters such as, for example, unconfined compressive strength (UCS) may be determined. Such parameters may be used, for example, to estimate pore pressure, minimum and maximum horizontal stresses and vertical stress.

The model 410 of FIG. 4 may be a mechanical earth model (MEM) suitable for use in a geomechanics simulation workflow. For example, the model 410 may be an expanded view of a finite element model suitable for use in the VISAGE® framework for performing geomechanical simulations.

Figure 5:
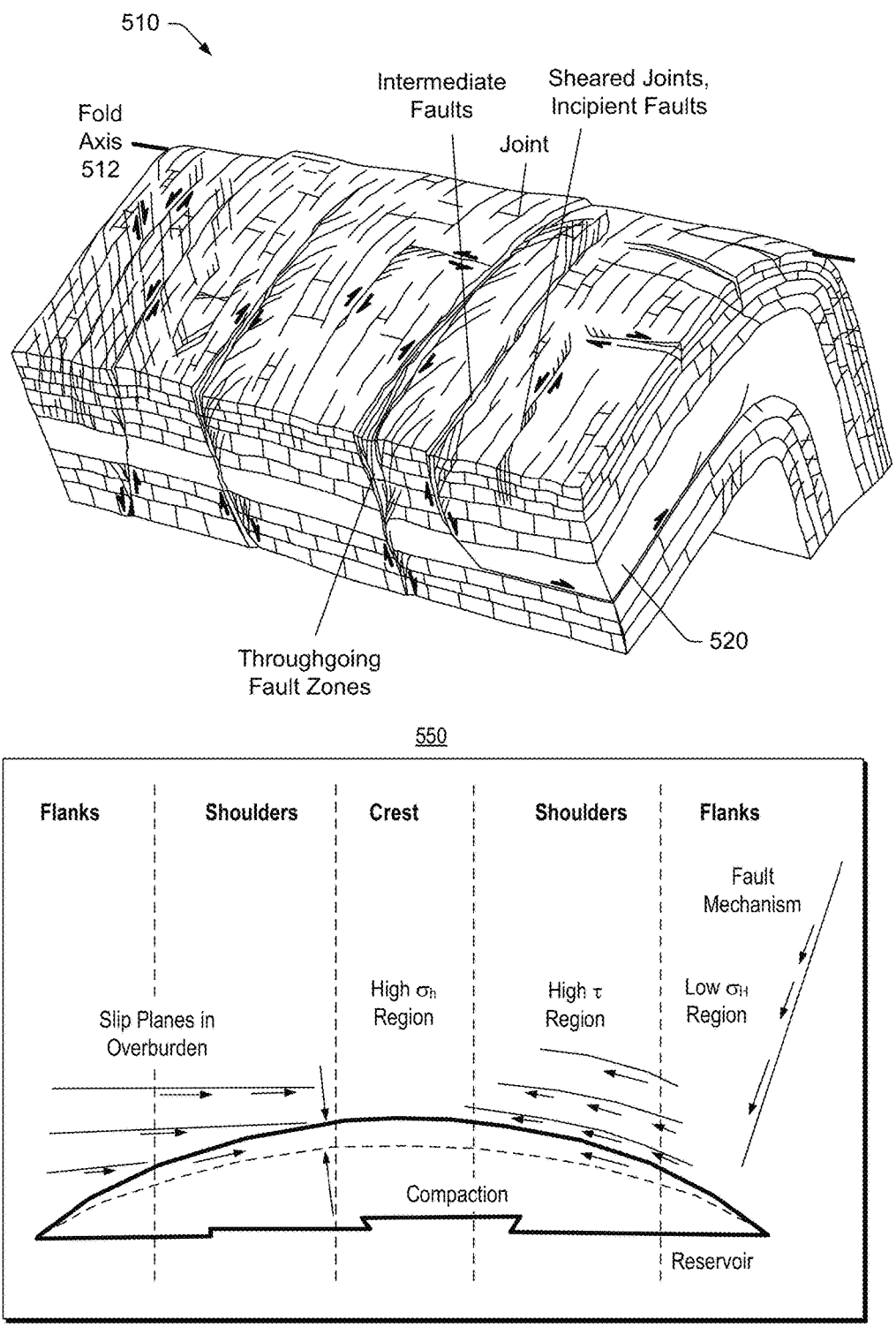
FIG. 5 illustrates examples of geologic environments.

FIG. 5 shows an example of a geologic environment 510 that includes folds, faults and fractures along an anticline 520. In folded rocks, faults and fractures may be oriented, for example, parallel or perpendicular to a fold axis. Fractures may form in response to stress, joints may form by means of tensile stresses and faults may form by means of shear stresses. Deformation over time may cause fractures to extend and, for example, change direction of motion along fracture planes. Faults and fractures may be stratabound and, for example, confined to a single layer or they may be or become throughgoing where they may cross sedimentary sequences and span one or more formations within a geologic environment. Connectivity may range from isolated individual fractures to widely spaced fracture swarms or corridors, which may be interconnected fracture networks.

As to exploration and development, vertical and/or deviated wells (e.g., horizontal wells, etc.) may be drilled into an environment. For example, substantially horizontal wells may be drilled parallel to a fold axis 512 as illustrated in the geologic environment 510 to increase the well's ability to intersect fractures. As an example, a method may include analyzing stability and/or instability of one or more bores in an environment that may include one or more of the features of the geologic environment 510.

FIG. 5 illustrates various examples of forces (see, e.g., arrows) that may be present in a geologic environment. As an example, production and/or injection of a reservoir or reservoirs in such an environment may alter forces, particularly over time as production and/or injection may occur and/or after production and/or injection may have occurred. Where one or more wells exist and/or are planned in such an environment, an understanding of survivability with respect to time may be beneficial. In particular, where one or more proxies may be determined using strain tensor information, a method may be capable of analyzing a number of wells for a number of times. For example, consider analyzing survivability of a well over a period of time where the well may be used for injection, over a period of time where the well may be used for production, over a period of time where the well may be shut down, etc.

FIG. 5 also shows an example of a region of a geologic environment 550. In the environment 550, fluid production and injection may alter a pressure field in a reservoir. Such processes may affect the state of stress and, for example, lead to deformation in the reservoir as well as surrounding rock. Such field changes can impact integrity of one or more existing and/or planned wells. Where a well fails, it may no longer fulfill its intended function or functions (e.g., access, isolation, production, injection, etc.). As an example, a function of a well may be for a period time, for example, depending on stage of operation, exploration, appraisal, field development, field decommissioning, etc. For example, a production well may become an injection well or vice versa. As an example, injection may include injection of waste water, etc., which may occur for an extended period of time. As an example, a treatment well (e.g., for stimulation treatment) may utilized for injection and then may be utilized for production. In various examples, pressures, temperatures, types of fluids moved in a well, etc., may change. As an example, during production, a well may start generating a large water fraction, which may impact separation of hydrocarbons from produced fluid. In such an example, one or more field operations may be performed to isolate at least a portion of the well (e.g., via plugging via a component, cement, etc.). As an example, a survivability analysis may assess whether an isolated portion may survive or fail over a period of time.

As mentioned, pore pressure may change over time as well as porosity. As an example, a model may include a dual approach to porosity where a matrix value (e.g., a rock matrix) is assigned to a region or regions and where fractures, faults, etc. may be assigned more specific values (e.g., as discontinuities in a matrix, etc.). For example, a model may include one or more matrix regions and one or more discrete fracture networks. Deformation may affect porosity values, pore pressures, etc. As an example, factors such as temperature and circulation may also affect material characteristics and be intertwined with deformation. Permeability in a region may depend on one or more factors, for example, relationships may exist between porosity and permeability.

As an example, a casing failure may occur after a period of production, which may be of a time scale of months or years. For example, consider wells drilled into a subsea floor environment to access a reservoir where production occurred for X years and where the sea floor subsided by Y meters. In such an example, a percentage of the wells may fail due to forces and displacements acting on their respective casings (e.g., casings, casing and cement, etc.). As an example, a metric may be determined that characterizes a relationship between vertical and lateral movement, for example, for 10 meters of vertical movement of a reservoir boundary (e.g., compaction) a subsequent 1 meter of horizontal movement may occur around shoulders of a reservoir.

As an example, production can cause rock to compact in the reservoir and cause rock to stretch in the overburden. Such processes may cause a casing to fail through shortening in a producing interval of a well or stretching in an overburden interval of a well. Thus, a well may experience multiple types of phenomena over its trajectory. As an example, a method may include analyzing phenomena with respect to an overburden portion of a well's trajectory and analyzing phenomena with respect to a reservoir portion of a well's trajectory. In such an example, the method may include predicting risk and/or type of failure(s) that may occur in such portions of a well's trajectory.

As a field compacts, flexure of the compacting field can cause slippage along weak lithologies or discontinuities (e.g., unconformities, interfaces between formations, interfaces of faults, fractures, etc.). Such processes may cause structural failure through shearing of a well's casing. As an example, shearing of a well's casing may result from an injection process. For example, high pressure injection can expand a portion of a reservoir which result in shearing along rock interfaces.

As an example, well survivability may be analyzed on a field scale or on a wellbore scale. At a field scale, compaction and subsidence (e.g., as associated with production) and/or dilation and upheaval (e.g., as associated with injection) may be calculated via analytical or numerical techniques (e.g., finite element method, etc.). Such approaches can provide information germane to whether one or more well trajectories are susceptible to strain. As an example, an approach may include analyzing changing stresses and deformations on a wellbore scale to design a well's casing in an effort to ensure it can withstand local deformations.

As an example, an approach may include identifying one or more wells on a field scale that may be prone to shearing, for example, based on knowledge of one or more fault locations. Such an approach may optionally be implemented relatively rapidly compared to a large scale model-based approach that includes solving systems of equations numerically (e.g., consider a finite element method model, etc.).

In practice, an ability to rapidly identify wells at risk of failure, whether existing wells or planned wells, can facilitate field development (e.g., drilling, production, injection, etc.). As an example, a method may provide for "scanning" a number of wells (e.g., actual and/or proposed) for well survivability. For example, a method can include analyzing tens of wells or, for example, over one hundred wells, as to their risk of failure, expected useful life, etc.

As an example, a method can include for one or more wells, accounting for wellbore scale detail. For example, a method can include assessing a well's azimuth and inclination along one or more portions of its trajectory (e.g., overburden portion, reservoir portion, vertical portion deviated portion, horizontal portion, etc.).

As an example, a method can include receiving information from a field scale model. For example, consider a method that includes receiving strain tensor information via reservoir-geomechanics simulation. In such an example, the strain tensor may be rotated by azimuth and inclination to determine an axial strain and shear strain, for example, at intervals, points, etc. of one or more well trajectories in a field.

As an example, a method can include receiving geomechanics information associated with a geologic environment where the information includes localized stain tensor values in a first coordinate system, receiving well trajectory information that defines at least in part a second coordinate system and transforming at least a portion of the localized strain tensor values from the first coordinate system to the second coordinate system. In such an example, the transformed values may be associated with at least a portion of a well trajectory. For example, a "log" may be rendered to a display that illustrates well depth and one or more stress, strain, displacement, etc., values that are based at least in part on geomechanical simulation results (e.g., based at least in part on strain tensor values).

As an example, a "log" may be a time log, for example, for a specific time or for a period of times. As an example, a time or times may be associated with at least one drilling time of a wellbore, at least one completion time of a wellbore, at least one production time of a well, at least one injection time of a well, a lifetime of well, etc.

As an example, a value may be calculated based on a "birthdate" of a well, which for an existing well may be the completion date of at least a portion of its trajectory as drilled and/or as completed (e.g., with one or more of casing, cement, etc.). As to a planned well, a birthdate may be received as a future time and a risk of failure for at least a portion of that well may be determined at the future time and/or at yet another more distant future time.

As an example, a method can include analyzing the effect of strain with respect to time for at least a portion of a well. For example, after one year of production, deformation may be of the order of centimeters. In such an example, a deformation rate may increase such that after a period of ten years, deformation may exceed a meter. As an example, such deformation and/or deformation rates may be used to analyze survivability of at least a portion of a well and, for example, determine an expected lifetime (e.g., a functional lifetime, etc.) of at least a portion of a well.

As an example, where a leg is drilled from an existing well or planned to be drilled from an existing well and/or a planned well at a time after drilling a parent wellbore, a method can include analyzing geomechanical phenomena in a coordinate system that corresponds to a leg (e.g., or legs).

In such an example, a leg may be associated with a coordinate system that differs from that of a parent portion of a well. In such an example, a method can include transforming, for example, localized strain tensor values to assess a leg that branches from the parent portion of the well. In such an example, a method may include determining where and/or in what direction to drill a leg (e.g., or legs).

As an example, a method can include implementing one or more types of threshold values, for example, to identify one or more wells, portions of wells, etc. with respect to longevity, risk of failure, etc. As an example, consider a threshold value or values that correspond to identifying onset of deformation and/or failure via deformation. In such an example, the threshold value or values may be used to determine which wells and at what depth intervals such wells may be susceptible to casing deformation and/or failure. As an example, a method can include flagging one or more wells (e.g., or portions thereof) and, for example, rendering information to a display. As an example, flagged wells may be compared to observed deformations in a field (e.g., field information that may indicate a well or a portion of a well has failed, etc.).

As an example, a method can include setting threshold values for axial strain and shear strain that indicate, for example, when failure occurs. As an example, values may be given within a range. For example, consider values that may include a range of about 1 percent to about 2.5 percent axial shortening as corresponding to increasing likelihood of failure. As to a stretching threshold, such a range may be observed for elongation of a well. As an example, a range may be used for axial shortening and another range may be used for elongation or, for example, a common range may be utilized. As an example, one or more threshold values may be used to classify at least a portion of a well, for example, into one or more classes where such classes may be associated with survivability, optionally with respect to one or more purposes (e.g., for production, for tool access, etc.).

As an example, a portion of a well may be classified into a class that is a low risk class where further analysis may be foregone. As an example, a portion of a well may be classified into a class that is a high risk class, which may call for further analysis. As an example, a method can include classifying wells or portions of wells into classes and then performing further analysis of particular wells and/or portions of wells based at least in part on membership in a class. Such an approach may be utilized to screen a number of wells and to reduce an amount of further analysis (e.g., to conserve computational resources, time, etc.).

As an example, a casing of a well can tend to withstand a higher degree of compression compared to tension. As an example, a method can include setting a threshold value for the onset of tensile failure through stretching (e.g., stretching of casing). As an example, a method may account for casing grade, casing diameter, casing wall thickness, etc., as having at least some effect on when material failure occurs. As an example, a stretching threshold may be in a range that may be about a percent, for example, consider a range less than about one percent. As to shortening, as an example, consider a range of about that of elongation or, for example, a smaller range of about 0.3 percent to about 0.7 percent as to likelihood of onset of failure through shortening may be used.

As an example, a threshold may correspond to a maximum axial strain before failure. As an example, a relationship that links the Young's Modulus of a casing and stress and strain experienced by the casing may be utilized, for example, consider a relationship that involves longitudinal (or axial) strain as it focuses on axial deformation.

As an example, a threshold value for onset of shear failure may optionally be based at least in part on history matching with data. As an example, a minimum shear strain to cause casing deformation may be derived via observation, mechanical modeling, etc., and used as a threshold value. For example, consider a value of the order of less than a tenth of one percent of shear strain (e.g., about 0.022 percent of shear strain).

Referring again to FIG. 5, the environment 550 illustrates how a portion of a field may compact. For example, flexure of a compacting field can cause slippage between weak lithologies or discontinuities. Such phenomena may cause structural failures as to one or more wells, for example, via shearing of a well casing, etc. As an example, a method can include analyzing information as to well survivability, for example, on a field scale and on a wellbore scale. In such an example, on a field scale, total compaction and subsidence may be determined (e.g., analytically and/or numerically). Such information may shed light on whether one or more well trajectories are susceptible to high strains. As an example, a method can include analyzing stresses and deformations on a wellbore scale (e.g., optionally over time) to understand how a well's casing may respond to local deformations. As an example, a method may include modeling paths to understand where to place wells, including, for example, well attack angles, trajectories, etc.

As an example, a method can include determining one or more of an axial strain proxy and a shear strain proxy. Such a method may include analyzing one or more proxies, for example, to screen one or more wells on a field scale for survivability. Such proxies may be determined, for example, via information from a simulated coupled reservoir-geomechanical model. For example, consider a grid-based model (e.g., a finite element model, etc.) that includes grid cells (e.g., elements). In such an example, a path of an actual well or a prospective well may pass through various grid cells. Such grid cells may be associated with "local" information such as strain (e.g., and/or stress). In such an example, information of a grid cell may be transformed from a model coordinate system to a well coordinate system as part of a method that can provide one or more proxies that may be germane to well survivability (e.g., for an actual well and/or a proposed well). As an example, an actual well may pass through a space associated with a grid cell and a proposed well may be planned along a path that may pass through a space associated with that same grid cell or a different grid cell. As an example, one or more proxies may be analyzed as to axial strain and shear strain along well trajectories and, for example, compared to one or more threshold values, for example, associated with a risk of onset of casing deformation.

As an example, one or more of an axial strain proxy and a shear strain proxy may be determined along a well's trajectory and analyzed to determine if a well is experiencing large stretching or elongation (e.g., or likely to experience an amount of stretching or elongation) or shortening strains and/or if there is shearing perpendicular to the well's path. As an example, when planning one or more new wells, a method can include predicting which wells or well trajectories will last longer (e.g., given production, injection, etc., functions of such wells over time). Such a method can include assessing one or more proposed wells to determine which has a lesser risk of collapse. For example, some may have an estimated longevity of a few years; whereas, others may have a longevity of about five years or more. Where a planned well appears to be in a type of formation that makes it at a heightened risk of collapse in a period of time that may be unacceptable, a method can include engineering the well (e.g., via an engineering plan) to provide integrity that may aim to extend the period of time such that it is deemed acceptable. As an example, a method can include revise an operation schedule to mitigate risk of collapsing of one or more wells.

As an example, a method may include sampling at a particular distance. As an example, a sampling distance (e.g., sampling increment) may be dynamic and change depending on value of a proxy. For example, if a change is noticed for a large sampling distance, further sampling may occur for a region with a smaller sampling distance.

As an example, strain tensor values may be provided, for example, optionally as output of a geomechanical earth model (MEM). For example, consider output of a simulation run using the VISAGE® framework. As an example, for a cell-based model, individual cells may include associated strain tensor values. As an example, information may include values as to how much strain will develop with respect to two or more times. For example, for a well drilled at time X and for a well at time Y, these times may be considered start time (e.g., "birthdates") and time may run for an analysis of each of these wells from such a start time (e.g., as a time zero for each well, which may be a drilling time, a time for a well to be drilled, etc.). As an example, an analysis may be performed over one or more "time windows", for example, from a start date of a well, to a future date, to a failure date, to an end-of-use date, etc. During a time window, relevant strain may occur that can impact well integrity. As an example, a method may include analyzing survivability (e.g., risk of failure, longevity, etc.) at one or more points in time that define periods of time (e.g., time windows) for a well or a portion of a well. As an example, a method can include considering a period time to which at least a portion of a well is being exposed to deformation (e.g., consider an amount of deformation between two times).

As an example, a method can include aligning a strain tensor with a well's trajectory. For example, consider implementing a rotation matrix defined by a well's inclination and azimuth angles. As an example, consider rotating along a y-axis by inclination and along a z-axis by azimuth at an individual sampling point along a well trajectory. As an example, a transpose of such a matrix may be multiplied by a given strain tensor (e.g., strain tensor values) to provide a new strain tensor, for example, in a local coordinate system along the well's trajectory.

As an example, stress, strain, etc. may be represented on a scale associated with a basin, a scale associated with a reservoir, and a scale associated with a borehole. As an example, stress, strain, etc. may be represented with respect to a coordinate system. As an example, a method may involve representing stress, strain, etc. given in one coordinate system to another coordinate system. As an example, a borehole may be defined at least in part via a Cartesian coordinate system and/or a cylindrical coordinate system, for example, via an axis, a radius and an azimuthal angle (e.g., 0 degrees to 360 degrees). As an example, a borehole (e.g., or well) may be defined with an axis (e.g., a longitudinal axis) substantially aligned along a longitudinal axis of the borehole and another axis (e.g., a radial axis perpendicular to the longitudinal axis), substantially aligned toward top-of-hole (TOH). In such an example, a third axis may be orthogonal to the other two axes. In such an example, the coordinate system of the borehole may be a local Cartesian coordinate system. As an example, a transform may transform a strain tensor from a first Cartesian coordinate system to a second Cartesian coordinate system. In such an example, the second Cartesian coordinate system may change along a trajectory of a borehole (e.g., a well). As an example, a second coordinate system may be a cylindrical coordinate system that may change along a trajectory of a borehole (e.g., a well).

As an example, a basin and/or a reservoir may be represented via a Cartesian coordinate system (e.g., consider geographic coordinates) or, for example, via a spherical coordinate system. As an example, locations along a borehole may be represented via coordinates in one or more coordinate systems. For example, such locations may be represented in a coordinate system associated with a basin, a reservoir, etc. and may be represented in a "local" coordinate system (e.g., consider a direct and/or meandering path along a borehole in cylindrical coordinates). As an example, a local coordinate system may be a Cartesian coordinate system that differs from a Cartesian coordinate system associated with a basin, a reservoir, a grid of a simulator, etc.

Figure 6:
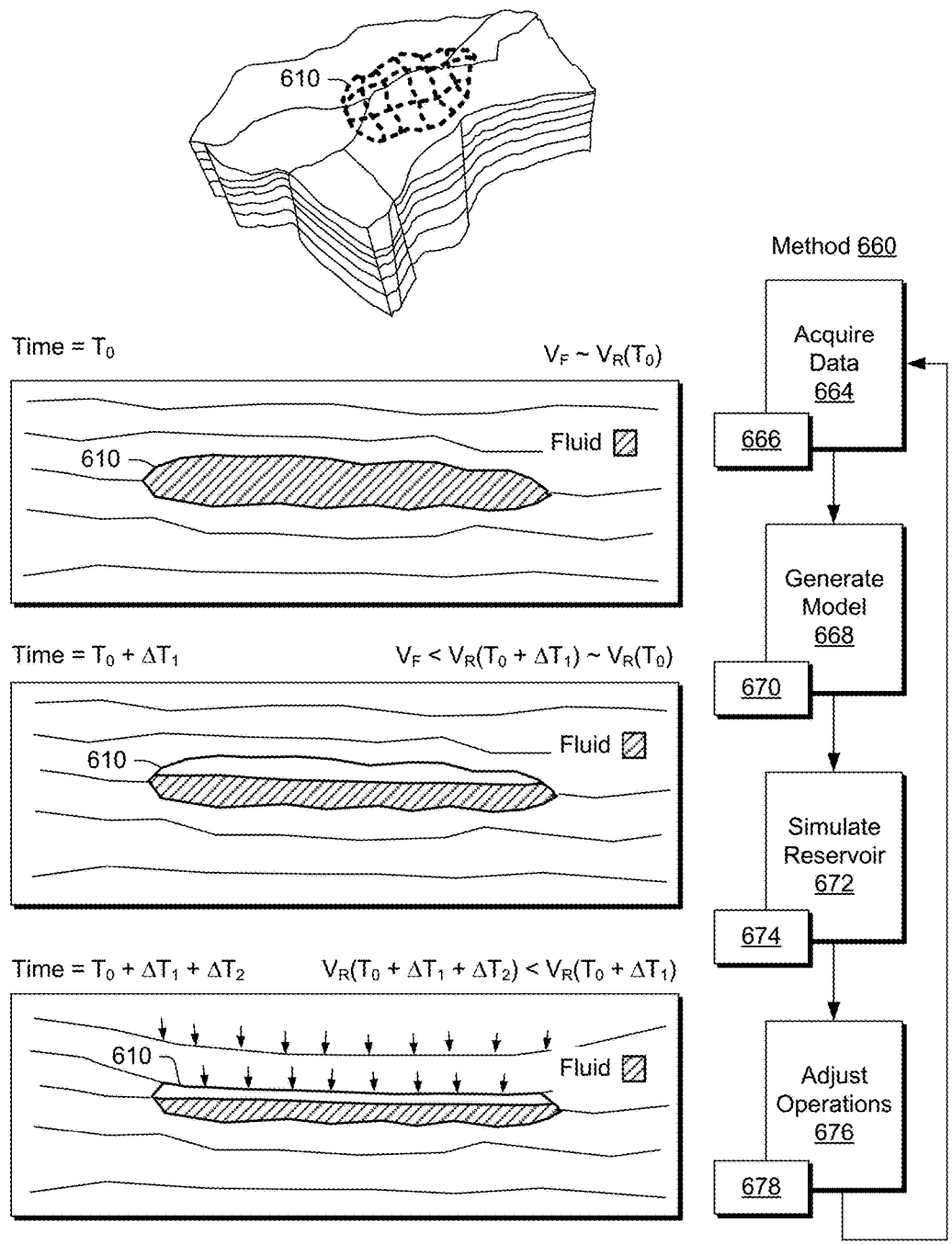
FIG. 6 illustrates examples of equations and an example of a method.

FIG. 6 shows a production scenario over time with respect to a reservoir 610. At time $T_0$, the reservoir is shown as being relatively full of fluid and the volume of the fluid $V_F$ being approximately equal to the volume of the reservoir $V_R$ (e.g., for simplicity, assuming that the fluid is not in a porous matrix). During production, fluid is extracted from the reservoir such that at a subsequent time, the volume of the fluid is less than the volume of the reservoir. In the example of FIG. 6, a void is shown to represent the difference in these volumes. Where the fluid extracted had acted to provide support to geological structure, the absence of the fluid support changes the force balance and, as shown, at a later time, the reservoir experiences some deformation.

As mentioned with respect to FIG. 5, deformation may occur in a reservoir as well as in surrounding rock. For example, operations performed with respect to a reservoir may cause deformation of the overburden. In such an example, where a well trajectory passes through at least a portion of the overburden, that portion of the well trajectory may be subject to phenomena that may differ from that of a portion of the well trajectory that is within reservoir rock. As an example, drawdown of a reservoir via production may impact one or more faults in the overburden (see, e.g., FIGS. 4 and 5), which may cause one or more wellbore failures in the overburden.

As an example, for fluid in a porous matrix, a geological process may be more accurately represented as one of stress and strain. Specifically, as fluid is extracted from the interstitial spaces of the porous rock, the force balance changes and the stress causes the rock to experience strain. As an example, fluid may be liquid, gas or a combination of liquid and gas. For example, fluid saturation may be gas saturation or liquid saturation. Fluid saturation may include both gas saturation and liquid saturation. Accordingly, a module may include instructions to determine gas saturation and liquid saturation.

FIG. 6 also shows an example of a method 660 that includes an acquisition block 664 for acquiring data, a generation block 668 for generating a model, a simulation block 672 for simulating reservoir changes and an adjustment block 676 for optionally adjusting one or more operations related to the reservoir. The adjustment block 676 may adjust a process related to injection or extraction of material, adjust a data acquisition process, adjust a downstream process for processing of extracted material, adjust an upstream process for processing of material to be injected, etc. Such adjustments may be made via electronic communications (e.g., instructions, signals, etc.) or by manual operations (e.g., observation of simulation results and manual adjustment of a process). Such adjustments may be optionally incorporated in one or more of the blocks of the system 100 of FIG. 1.

As an example, a model may provide for assessment of well survivability with respect to time in a formation. As an example, such a model may be implemented as part of a workflow, for example, to develop a resource, etc.

As an example, a system may allow for analysis and prediction of instabilities in formations, for example, to enable a workflow that may include acquiring data to characterize a given formation properties (existence, orientation of planes of weakness, far field stress) and outputting information germane to one or more operations (e.g., planned, on-going, already performed, etc.).

As an example, a model (e.g., a geomechanical model) may provide for modeling and predicting well survivability in formations. As an example, such a model may be implemented using one or more computing devices.

As an example, a workflow can include analyzing and predicting well survivability in wells drilled in a formation. Such a workflow may include acquiring data to characterize a given formation properties (existence, orientation of planes of weakness, far field stress, etc.), modeling instabilities, analyzing modeling results, modifying operational parameters to avoid or manage the instability, etc.

As an example, one or more lateral bores may be used for performing one or more fracturing operations, which, in turn, may alter one or more characteristics of a formation germane to bore/well survivability. As an example, a method may include re-analyzing survivability with respect to one or more bores/wells after performing a fracturing operation (e.g., consider a stage in a series of stages of a fracturing scheme). As an example, a method may include re-analyzing survivability with respect to one or more bores/wells after a period of drainage of fluid from a drainage area (e.g., consider a drainage area associated with a fractured region). As an example, data may be obtained from regional knowledge, outcrop data or use of an analog. As an example, data may be obtained via one or more data acquisition schemes, for example, consider one or more of seismic data acquisition, logging, wireline logging, logging while drilling (LWD), laboratory data acquisition, drilling data acquisition, mud weight data acquisition, etc. As an example, data may be quantitative or qualitative. As an example, data may include noting of observations that may occur during a drilling operation, a completion operation, etc. As an example, injection of fluid, proppant, etc., as may be associated with a fracturing operation can result in some amount of deformation and/or alteration of how deformation may occur over time. As an example, one or more effects of a fracturing operation (e.g., hydraulic fracturing) may be accounted for in assessing well survivability, etc.

As an example, a model may include equations, for example, as part of an algorithm for predicting wellbore failure as a function of one or more proxies.

As an example, a method may include comparing results of modeling with observed failure information and, for example, updating input to the model accordingly.

As an example, a method may provide for rapid screening of well survivability risks within a 4D reservoir geomechanical space (e.g., three-dimensions spatially and one-dimension temporally, in time). As an example, a method may be implemented via one or more frameworks such as, for example, the PETREL® framework, the OCEAN® framework, the VISAGE® framework, the INTERSECT® framework, the ECLIPSE® framework, the MANGROVE® framework, etc.

As an example, a geomechanics simulator may be configured to perform simulations based at least in part on finite elements, for example, via a finite element technique (e.g., a finite element method (FEM)). As an example, consider a geomechanics simulator such as the VISAGE® finite-element geomechanics simulator (e.g., of the VISAGE® framework). As an example, a method may be implemented via execution of instructions stored in memory (e.g., via one or more processors). As an example, instructions and a computing system may be considered to be a "simulator". As an example, consider the VISAGE® simulator, which may perform simulations that may assist with planning for and mitigating risks. As an example, a method may include identifying risks, assessing risks, etc.

As an example, a geomechanics simulator may include modules for modeling compaction and subsidence; well and completion integrity; cap-rock and fault-seal integrity; fracture behavior; thermal recovery; $CO_2$ disposal; etc.

As an example, a seismic-to-simulation framework such as the PETREL® framework, optionally in combination with the OCEAN® framework, may include features that facilitate data flows and that provide graphical user interfaces that support geomechanics simulation, configuration and results visualization.

As an example, a workflow may include receiving information in one or more of multiple data types, for example, to create multidimensional geomechanics property and stress models, or add geomechanics data to augment existing reservoir subsurface models. Integration of seismic-to-simulation workflows capabilities with geomechanics workflow capabilities may aid in geomechanics model development, for example, to generate a model (e.g., via integration with one or more of geophysics, geology, petrophysics, and reservoir data).

As an example, a workflow may include creating an initial structural and properties model (e.g., using reservoir geomechanics), which may be input to a geomechanics numerical simulator. As an example, such a workflow may integrate PETREL® framework and VISAGE® geomechanics simulator functionalities, optionally in an OCEAN® framework.

As an example, a geomechanics simulator may be operatively coupled to a reservoir simulator. For example, the VISAGE® framework simulator may be operatively coupled to the ECLIPSE® framework reservoir simulator (e.g., for one-way and two-way coupling). For example, in one-way coupling, the ECLIPSE® framework simulator may model flow of fluids in a reservoir and calculate pressure, temperature, and saturation changes that result. In such an example, the VISAGE® framework simulator may use calculated results of the ECLIPSE® framework simulator to perform 3D static and/or 4D flow-, pressure-, and temperature-coupled calculations for rock stresses, deformations, and failure. As an example, two-way coupling between the ECLIPSE® framework and VISAGE® framework simulators may allow permeability and/or porosity updating of a reservoir model at one or more selected time-steps, as well as, for example, updating of mechanical properties in the geomechanics model to account for effects such as changing saturations, water softening, water weakening (e.g., as in chalk reservoirs), etc. As an example, a method can include updating permeability or updating permeability and porosity. As an example, deformation may impact porosity (e.g., compaction reducing porosity).

As an example, where a model may be large (e.g., millions of elements), or coupled to reservoir simulation, a computing system may be configured to perform parallel geomechanics simulation runs, for example, using local or remote clusters. As an example, a process (e.g., for single machines and/or multicore clusters) may be managed by a framework that can permit seamless workflows. As an example, a reservoir simulation may be run using at least in part parallel processing.

A geomechanics simulator may include one or more modules that can model faults, fractures, etc. As an example, one or more modules may provide for handling of highly heterogeneous models (e.g., where high-degree complexity that exists in a geological model may be maintained throughout a geomechanics analyses).

As an example, a geomechanics simulator may include one or more modules for 3D and 4D geomechanics simulation, for example, across one or more portions of a field's lifecycle. Such capabilities may allow geoscientists and engineers to assess and mitigate potential geomechanics problems affecting well and completions, stimulation, production, injection, and field management.

A PETREL® reservoir geomechanics package may be implemented, for example, as an integrated environment for multi-dimensional preproduction geomechanics modeling or for 4D geomechanics modeling of fields under operation. As an example, finite-element geomechanics simulation (e.g., via the VISAGE® framework simulator) may be combined with one or more other interpretation and modeling workflows (e.g., within a PETREL® framework).

As an example, a reservoir geomechanical model may include horizontal grid cell dimensions in a range of about 50 m to about 200 m, and, as an example, vertical grid cell dimensions may optionally be smaller, for example, of the order of a few meters to tens of meters. As an example, one or more single dimensional (e.g., 1 D) geomechanical models may include log-scale resolution along a bore (e.g., a well, etc.) for a region proximate to the bore. As an example, a workflow may be constructed that can integrate functionality that may be available in a number of applications, for example, to consume 3D geomechanical input for drilling and completion analyses at well sector scale.

As an example, an approach may include implementation of a fracture design application such as the MANGROVE® framework, which may include one or more modules for unconventional fracture modeling (e.g., for hydraulic fracture design and evaluation).

Fluid production and injection can alter a pressure field in a reservoir and, in certain cases, a temperature field around producers and/or injectors. Such perturbations may affect the state of stress and lead to deformation, for example, in a reservoir and/or in the surrounding rocks. Wells embedded in such deforming rock masses may deform and may eventually collapse or be destroyed, which can result in their failure to provide access, isolation, injection and/or production.

As an example, a method may include assessing complexities associated with 3D structure (e.g., optionally faults, fractures, etc.) and, for example, heterogeneity in material properties and/or pressures distributions.

As an example, a method can include modeling of deformation at a field scale and evaluating how such deformation may impact completion integrity risk at a well scale. As an example, a method may provide entry (proxy) tools that can allow for rapid screening of well survivability risks in multiple dimensions, optionally including time (e.g., consider three dimensions in space and one in time).

As mentioned, strain can develop over time. As an example, in a fracturing operation, the period of time may be relatively short and may optionally be considered to be substantially instantaneous when compared to strain that may develop over a production time scale (e.g., months to years).

As an example, a seismic survey may be performed at one time and at another time. In such an example, data acquired from the seismic surveys may be used to assess deformation. As an example, deformation may occur at one or more time scales. For example, phenomena may operate to cause a fault to slip with a relatively large displacement with respect to time and other phenomena may operate to cause compaction with relatively small displacement with respect to time.

As an example, a method can include acquiring data such as one or more of satellite data, GPS data, dipmeter data, radioactive marker data, intelligent marker data (e.g., RFID-based, etc.), etc. As an example, data may be acquired at one or more times, which may be considered time-lapse data. As an example, a seismic survey may be performed in a time-lapse manner. Such a survey may acquire multidimensional data where one of the dimensions is temporal (e.g., time). For example, consider 4D seismic data that includes three spatial dimensions and a time dimension.

As an example, an approach may account for various reservoir geomechanical conditions. As an example, a method may process information that may be germane to stability of a number of wells. For example, a field scale analysis may provide for output of stability information for a number of wells of the order of about 10 or more (e.g., over one hundred).

As an example, a rapid analysis tool may allow for processing a numbers of wells (e.g., existing and/or planned) for a number of multidimensional simulation time-steps (e.g., 4D analysis) and, for example, mapping of one or more of lower/higher risk wells/depth intervals over time. As an example, consider a method implemented via a computing system that can output survivability information for about one hundred wells in less than one hour of computation time.

As an example, a method can include processing 4D reservoir geomechanical results (e.g., a strain field) over time, along well trajectories. Such processing itself can include positioning (e.g., rotating) an ambient strain tensor from geographical coordinates to well coordinates. As an example, log profiles of axial and a shear strains, in such a well coordinate system, may be produced that may then be taken (e.g., as proxies) for well survivability risks. As an example, a method can include comparing output(s) against one or more thresholds, for example, to identify one or more wells and, for example, depth intervals along one or more wells where survivability risks may be relatively lower and/or higher.

As an example, a threshold or thresholds may include one or more of default values, values input via a user interface, values determined via computations with respect to data (e.g., observed historical data), etc. As an example, one or more thresholds may be associated with a particular proxy. For example, a threshold may be relatively small for shearing of a casing compared to how much strain a casing may endure before failure. As an example, a threshold may be operation-based, for example, tailored to a particular function of a well. As an example, a threshold may be for stretching, another threshold may be for compaction and yet another threshold may be for shear. As an example, a threshold may be associated with a type of construction, a type of cement, a type of casing material, etc.

As an example, a method may include receiving well trajectory data (e.g., including time/date of a well and/or portions thereof) and geomechanics simulation data. For example, geomechanics simulation data may include data that corresponds to a multidimensional gridded representation of a subsurface region where the grid may define grid cells with data. For example, consider strain tensor data associated with a plurality of grid cells. In such an example, individual grid cells may be associated with strain tensor data, in geographical coordinates, at one or more times. For example, consider a pre-production time associated with a pre-production state of a subsurface region that includes one or more reservoirs and one or more times associated with production states (e.g., one or more times after which an initial flow of fluid has commenced).

As an example, an individual well may be defined using information such as locations. For example, along an individual well, locations may be received (e.g., optionally defined by a user) where the locations may be a series of points (e.g., regularly spaced sampling points). In such an example, for a location, a grid cell (e.g., element, volume, etc.) in which the point is located may be identified. As an example, for the particular identified grid cell, the local strain tensor may be rotated from geographical coordinates to a set of coordinate axes associated with (e.g., attached to) the local well orientation. For example, one axis aligned with the well axis, and the other two, mutually perpendicular axes (e.g., orthogonal), in a cross-sectional plane, with an azimuth reference set, e.g., top-of-hole or "TOH"). Once such a rotation has been completed, the axial strain can emerge, and a shear strain can be defined, for example, as the norm of two off-plane shear components. In such an example, these may be referred to as the axial and shear strain proxies, respectively.

As an example, a method may be performed iteratively and/or in parallel with respect to locations for an individual well and/or for multiple individual wells. As an example, an analysis may be repeated at individual locations along a well. As an example, a method may include determining log profiles of axial and shear strain proxies along one or more individual wells, for example, at one or more simulation time steps. As an example, a simulation that runs forward in time may, at one or more points in time, output "proxies" for one or more wells. In such an example, where proxy values may be compared to one or more thresholds, the simulation may flag one or more wells, or portions thereof, that may exhibit risk or risks of failure (e.g., and/or one or more other conditions associated with and/or derived from one or more proxy values).

Figure 7:
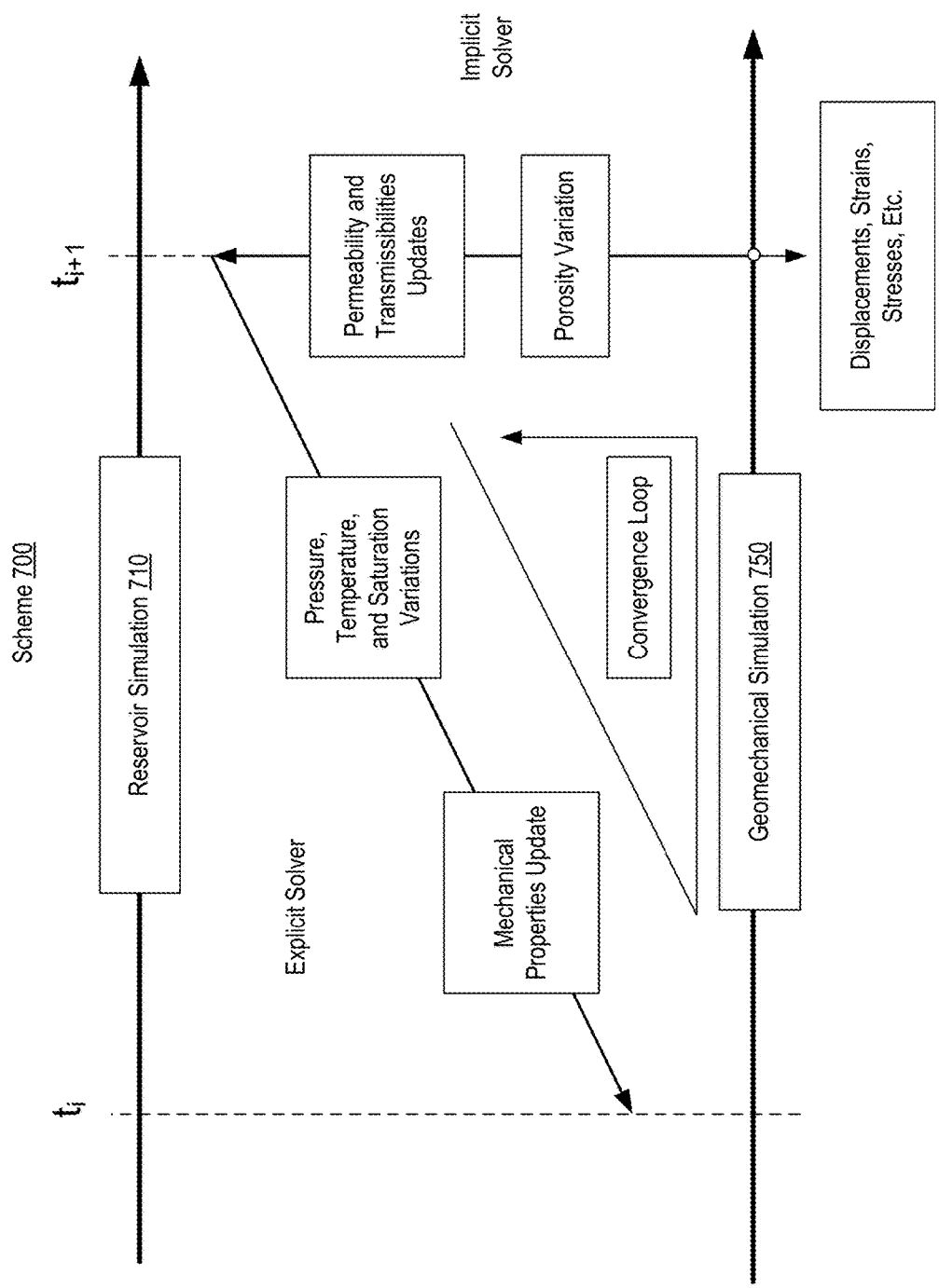
FIG. 7 illustrates an example of a method.

FIG. 7 shows an example of a scheme 700 that includes reservoir simulation 710 and geomechanical simulation 750. The scheme 700 provides for coupling of reservoir simulation 710 and geomechanical simulation 750 where a reservoir simulator can calculate changes in pressure, temperature and saturation over one time step and input results into a previous time step of a geomechanics simulator to update mechanical properties and reservoir permeability. The geomechanics simulator can calculate displacements, strains and changes in stress associated with changes in one or more of pressure, temperature and saturation. As an example, two-way coupling can update reservoir permeabilities and porosities.

In such staggered coupled simulations, a liaison can be established at selected time-steps between the geomechanics simulator and the reservoir simulator. The geomechanics simulator can solve for change in stress, strain, and displacements associated with changes in fluid pressures, temperatures, and/or saturations. The reservoir simulator can solve for change in fluid pressures, in temperatures, and/or in saturations associated with, for example, a prescribed production and/or injection schedule and with changes in porosities and/or in permeabilities. As an example, a coupling scheme can include one-way coupling and two-way coupling, depending on whether information is passed from a reservoir simulator to a geomechanics simulator, or if information is also passed from a geomechanics simulator back to a reservoir simulator. Former information may include fluid pressures, temperatures, and/or saturations, for example, either absolute or incremental relative to a previous time-step. As illustrated in FIG. 7, geomechanical model properties may be updated accordingly. For example, the Young's modulus may be updated following a change in fluid pressure, when the Young's modulus is expected to be sensitive to effective confining stress, or rock strength may be updated following a change in water saturations, when exposure to water is expected to weaken the rock. Information passed from a geomechanics simulator to a reservoir simulator may include changes in porosities and/or changes in both porosities and permeabilities (e.g., based at least in part on calculated strains).

FIG. 8 shows an example of a geologic formation 802 and a well 804 and an example of a corresponding matrix 806 (e.g., a Jacobian matrix of derivatives, etc.). As shown, the geologic formation 802 is spatially discretized into nine cells that are regularly ordered in space as three layers with three cells in each layer. In the simplistic representation of the geologic formation 802 of FIG. 8, the cells are numbered 1 to 9 and their corresponding equations for pressure (P) and saturation (S) can be represented readily in the matrix 806 as diagonal terms and various off diagonal terms that may define a band-width (e.g., a banded matrix). For example, cell 1 has neighboring cells 2 and 4 that result in off diagonal terms (see, e.g., the entries in column 1, rows 2 and 4). In the example of FIG. 8, the presence of the well 804 introduces additional terms to the system of equations for the geologic formation 802. As shown, these additional terms appear along a border of the matrix 806 as associated with cells 1, 4 and 7. Thus, the matrix 806 includes diagonal terms and various off diagonal terms that may collectively define a band-width as well as border terms that may define a border width.

As explained with respect to FIG. 8, characteristics of a spatial grid (e.g., structured, unstructured, etc.) can dictate how equations are setup in a simulator (e.g., matrix size, condition, sparseness, etc.), which may impact computational resource demands, computation time, convergence, etc. As an example, a structured grid may provide a matrix (e.g., a Jacobian matrix) that may be less sparse, more "organized", etc., when compared to a matrix associated with an unstructured grid. Based on such factors, a reservoir simulator may be configured to perform simulations of geologic formations represented by structured grids.

Figure 9:
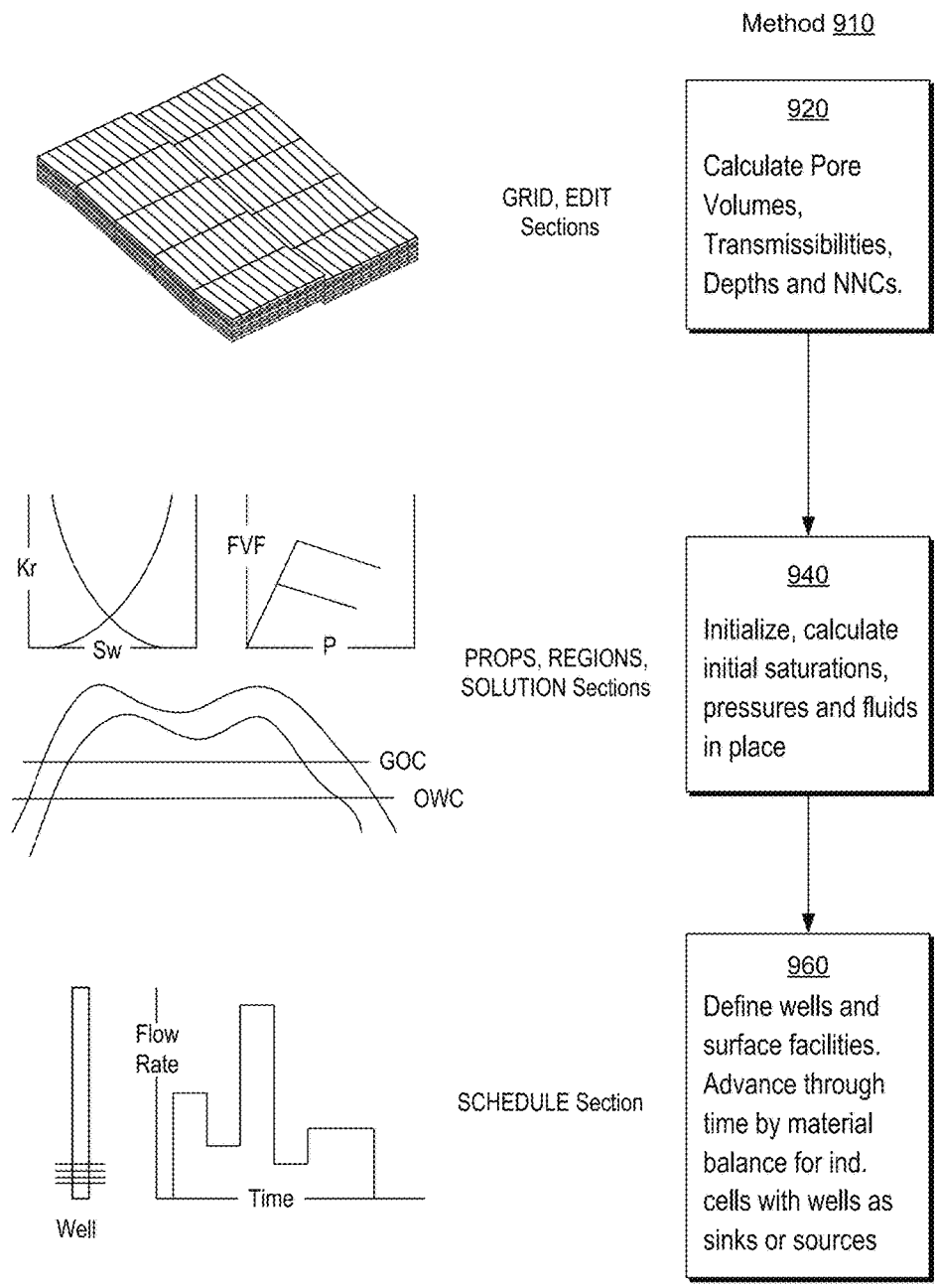
FIG. 9 illustrates an example of a method.

FIG. 9 shows an example of a method 910 that includes a calculation block 920 for calculating pore volumes, transmissibilities, depths and NNCs, an initialization and calculation block 940 for initializing and calculating initial saturations, pressure and fluids in place, and a definition and time progression block 960 for defining one or more wells and surface facilities and advancing through time, for example, via material balances for individual cells of a grid cell model of a geologic formation (e.g., with the one or more wells as individual sinks and/or sources).

As an example, a grid cell model can include grid cells where properties are defined with respect to a position or positions of a grid cell. For example, a property may be defined as being at a centroid of a grid cell. As an example, consider cell properties such as porosity (e.g., a PORO parameter), permeability in an x-direction (e.g., a PERMX parameter), permeability in a y-direction (e.g., a PERMY parameter), permeability in a z-direction (e.g., a PERMZ parameter) and net-to-gross ratio (e.g., NTG) being defined as averages for a cell at a center of a cell. In such an example, the directions x, y and z may correspond to directions of indices (e.g., I, J and K) of a grid that may model a geologic formation.

As to the initialization and calculation block 940, for an initial time (e.g., to), saturation distribution within a grid model of a geologic formation and pressure distribution within the grid model of the geologic formation may be set to represent an equilibrium state (e.g., a static state or "no-flow" state), for example, with respect to gravity. As an example, to approximate the equilibrium state, calculations can be performed. As an example, such calculations may be performed by one or more modules. As an example, a reservoir simulator may include a module for initialization using data to compute capillary and fluid gradients, and hence fluid saturation densities in individual cells of a grid model that represents a geologic formation.

Initialization aims to define fluid saturations in individual cells such that a "system" being modeled is in an equilibrium state (e.g., where no external forces are applied, it can be that no fluid flow takes place in a reservoir, a condition that may not be obeyed in practice). As an example, consider oil-water contact and assume no transition zone, for example, where water saturation is unity below an oil-water contact and at connate water saturation above the contact. A cell (e.g., or grid cell) may represent a point or points in space for purposes of simulating a geologic formation. Where an individual cell represents a volume and where that individual cell includes, for example, a center point for definition of properties, within the volume of that individual cell, the properties may be constant (e.g., without variation within the volume). In such an example, that individual cell includes one value per property, for example, one value for water saturation. As an example, an initialization process can include selecting a value for individual properties of individual cells.

As an example, saturation distribution may be generated based on one or more types of information. For example, saturation distribution may be generated from seismic information and saturation versus depth measurements in one or more boreholes (e.g., test wells, wells, etc.).

As mentioned, a reservoir simulator may advance in time. As an example, a numeric solver may be implemented that can generate a solution for individual time increments (e.g., points in time). As an example, a solver may implement an implicit solution scheme and/or an explicit solution scheme, noting that an implicit solution scheme may allow for larger time increments than an explicit scheme. Times at which a solution is desired may be set forth in a "schedule". For example, a schedule may include smaller time increments for an earlier period of time followed by larger time increments.

A solver may implement one or more techniques to help assure stability, convergence, accuracy, etc. For example, when advancing a solution in time, a solver may implement sub-increments of time; however, an increase in the number of increments can increase computation time. As an example, an adjustable increment size may be used, for example, based on information of one or more previous increments.

As an example, a numeric solver may implement one or more of a finite difference approach, a finite element approach, a finite volume approach, etc. As an example, the ECLIPSE® framework reservoir simulator can implement central differences for spatial approximation and forward differences in time. As an example, a matrix that represents grid cells and associated equations may be sparse, diagonally banded and blocked as well as include off-diagonal entries.

As an example, a solver may implement an implicit pressure, explicit saturation (IMPES) scheme. Such a scheme may be considered to be an intermediate form of explicit and implicit techniques. In an IMPES scheme, saturations can be updated explicitly while pressure is solved implicitly. Another type of scheme is a fully implicit scheme (e.g., fully implicit method, FIM). Examples of variations of such schemes include sequential FIM schemes, sequential explicit schemes, etc. Various types of schemes exist, which may be implemented using one or more types of numerical techniques (e.g., finite difference, finite element, finite volume, etc.).

As governing equations tend to be non-linear (e.g., compositional, black oil, etc.), a Newton-Raphson type of technique may be implemented, which includes determining derivatives, iterations, etc. For example, a solution may be found by iterating according to the Newton-Raphson scheme where such iterations may be referred to as non-linear iterations, Newton iterations or outer iterations. Where one or more error criteria are fulfilled, the solution procedure has converged, and a converged solution has been found. Thus, within a Newton iteration, a linear problem is solved by performing a number of linear iterations, which may be referred to as inner iterations.

As an example, a solution scheme may be represented by the following pseudo-algorithm:

```
// Pseudo-algorithm for Newton-Raphson for systems
initialize(v);
do {
    //Non-linear iterations
    formulate_non_linear_system(v);
    make_total_differential(v);
    do {
        // Linear iterations:
        update_linear_system_variables(v);
    }
    while((linear_system_has_not_converged(v));
    update_non_linear_system_after_linear_convergence(v);
}
while((non_linear_system_has_not_converged(v))
```

As an example, a solver may perform a number of inner iterations (e.g., linear) and a number of outer iterations (e.g., non-linear). As an example, a number of inner iterations may be of the order of about 10 to about 20 within an outer iteration while a number of outer iterations may be about ten or less for an individual time increment.

As an example, a method can include a reception block for receiving data, a simulation block for simulating physical phenomena and an output block for outputting results. Such a method may include gridding (e.g., or meshing) a multidimensional space that represents a geologic environment and performing, for example, one or more processes, techniques, etc., to generate a solution or solutions as to physical phenomena associated with the geologic environment. As an example, one or more field operations in a geologic environment may be undertaken based at least in part on such a solution or solutions (e.g., drilling, injecting, producing, fracturing, etc.).

Figure 10:
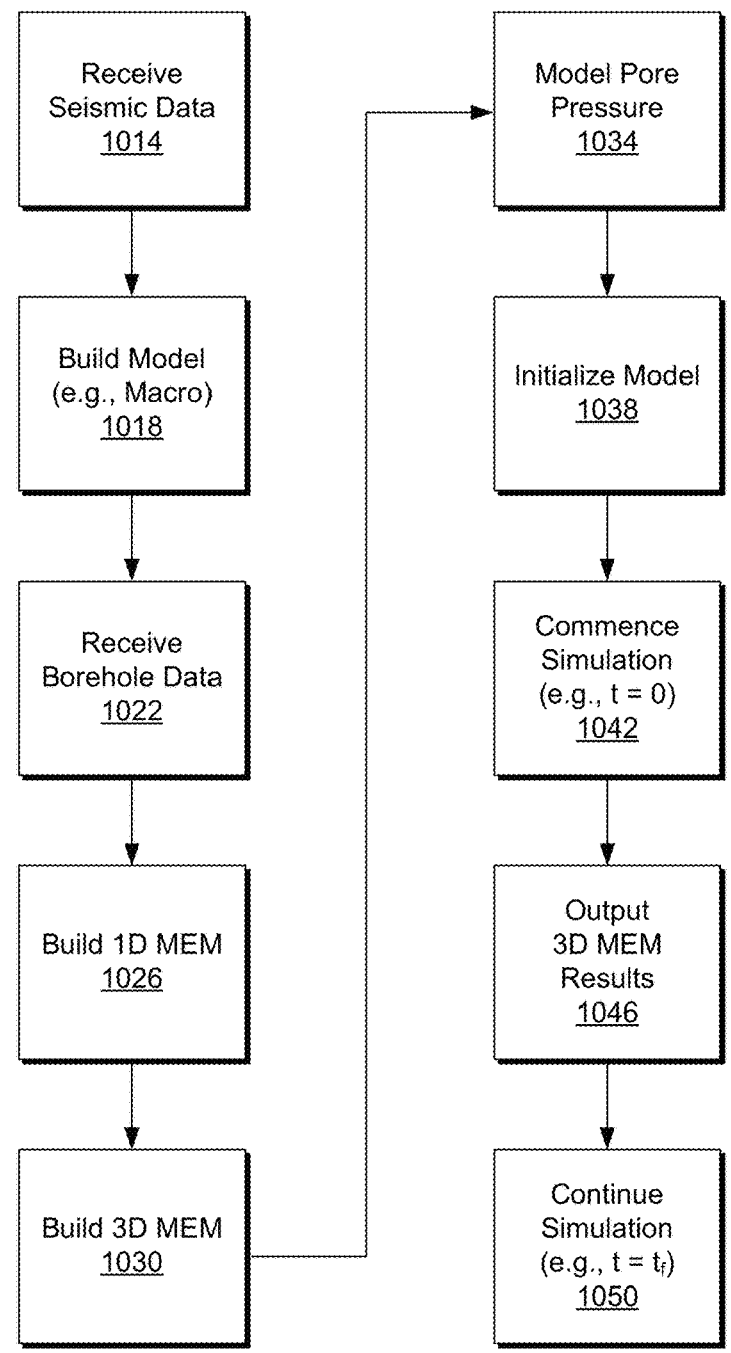
FIG. 10 illustrates an example of a method.

FIG. 10 shows an example of a method 1010 associated with geomechanical simulation. As shown in the example of FIG. 10, the method 1010 can include a reception block 1014 for receiving seismic data, a build block 1018 for building a model (e.g., a macro-scale model), a reception block 1022 for receiving borehole data, a build block 1026 for building one or more 1D mechanical earth models (MEMs) based at least in part on at least a portion of the borehole data (e.g., for one or more boreholes), a build block 1030 for building a 3D MEM, a model block 1034 for modeling pore pressure within the 3D MEM, an initialization block 1038 for initializing the 3D MEM, a commencement block 1042 for commencing geomechanical simulation, an output block 1046 for outputting results of the geomechanical simulation for at least a portion of the 3D MEM and a continuation block 1050 for continuing to simulate behavior, for example, for one or more future times.

As an example, the method 1010 can include implementing a geomechanics simulator such as that of the VISAGE® framework. As an example, the method 1010 may include implementing one or more seismic analysis features such as one or more of those of the PETREL® framework. As an example, borehole data may be available through a scanner tool (e.g., a sonic scanning too), a pressure measurement tool, a dynamic formation probe tool, an imager tool, etc.

Figure 11:
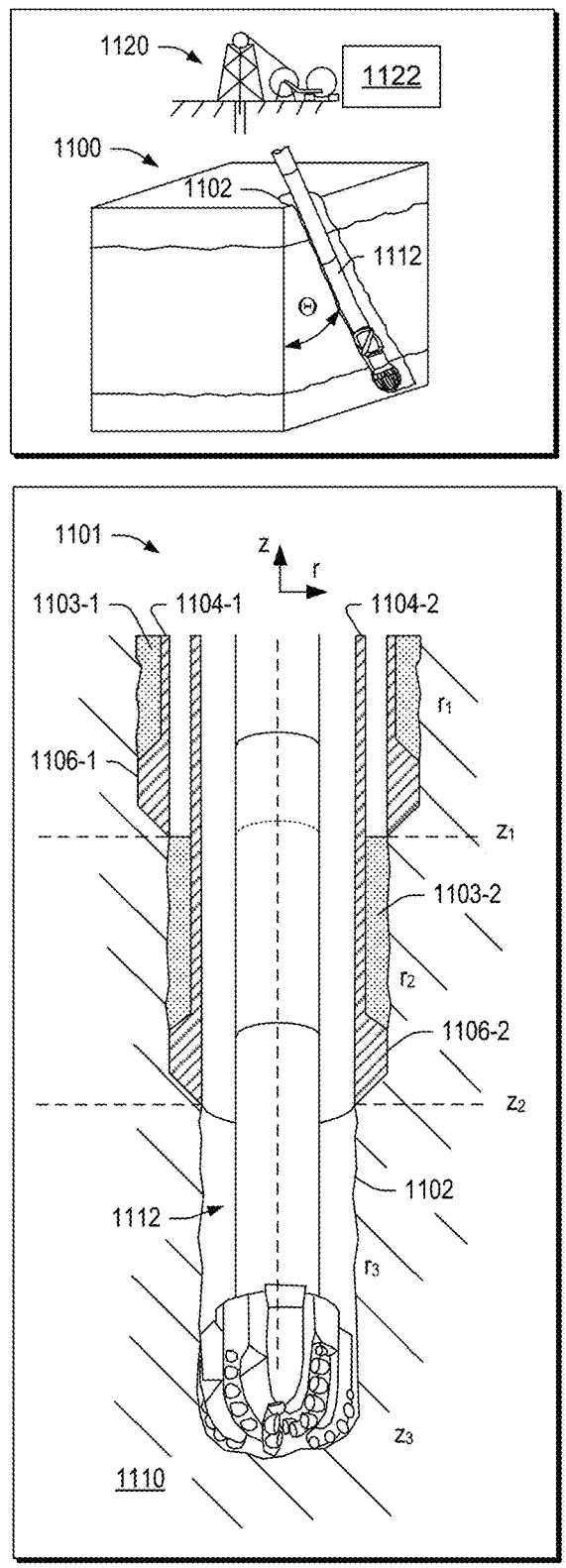
FIG. 11 illustrates an example of an environment, examples of equipment and examples of boreholes that can include casing and cement.

FIG. 11 shows an example of an environment 1100, an example of a portion of a completion 1101 and an example of equipment 1120. As an example, the equipment 1120 may include a rig, a turntable, a pump, drilling equipment, pumping equipment, equipment for deploying an assembly, a part of an assembly, etc. As an example, the equipment 1120 may include one or more controllers 1122. As an example, a controller may include one or more processors, memory and instructions stored in memory that are executable by a processor, for example, to control one or more pieces of equipment (e.g., motors, pumps, sensors, etc.). As an example, the equipment 1120 may be deployed at least in part at a well site and, optionally, in part at a remote site.

FIG. 11 shows the environment 1100 as including a subterranean formation into which a bore 1102 (e.g., a borehole) extends where a tool 1112 such as, for example, a drill string is disposed in the bore 1102. As an example, the bore 1102 may be defined in part by an angle ($\Theta$); noting that while the bore 1102 is shown as being deviated, it may be vertical (e.g., or include one or more vertical sections along with one or more deviated sections). As shown in an enlarged view with respect to an r, z coordinate system (e.g., a cylindrical coordinate system), a portion of the bore 1102 includes casings 1104-1 and 1104-2 having casing shoes 1106-1 and 1106-2. As shown, cement annuli 1103-1 and 1103-2 are disposed between the bore 1102 and the casings 1104-1 and 1104-2. Cement such as the cement annuli 1103-1 and 1103-2 can support and protect casings such as the casings 1104-1 and 1104-2 and when cement is disposed throughout various portions of a wellbore such as the wellbore 1102, cement may help achieve zonal isolation.

In the example of FIG. 11, the bore 1102 has been drilled in sections or segments beginning with a large diameter section (see, e.g., $r_1$) followed by an intermediate diameter section (see, e.g., $r_2$) and a smaller diameter section (see, e.g., $r_3$). As an example, a large diameter section may be a surface casing section, which may be three or more feet in diameter and extend down several hundred feet to several thousand feet. A surface casing section may aim to prevent washout of loose unconsolidated formations. As to an intermediate casing section, it may aim to isolate and protect high pressure zones, guard against lost circulation zones, etc. As an example, intermediate casing may be set at about 2000 meters and extend lower with one or more intermediate casing portions of decreasing diameter. A so-called production casing section may extend below an intermediate casing section and, upon completion, be the longest running section within a wellbore (e.g., a production casing section may be hundreds of meters in length). As an example, production casing may be located in a target zone where the casing is perforated for flow of fluid into a bore of the casing.

Prior to introducing cement into an annulus between a bore and a casing, calculations may be performed to estimate an amount of cement sufficient to fill the annulus, for example, for purposes of sealing off a casing segment. Accuracy of an estimate as to the amount of cement as well as issues in a process of introducing cement may, for example, result in occasional voids or gaps (e.g., regions where cement is lacking).

As an example, a string may include one or more tools such as, for example, a logging while drilling (LWD) tool, which may carry one or more transmitters and one or more receivers. For example, the SONICSCOPE™ tool marketed by Schlumberger Limited (Houston, Tex.) carries a wideband multipole transmitter and wideband receivers. As an example, a tool may include circuitry to sense information as to regions proximate to a bore. As an example, a tool may include circuitry to determine one or more cement-related parameters (e.g., extent of cement, cement quality, voids, etc.). As an example, a controller may include an interface to receive information from one or more sensors.

For a field, a borehole, an environment, one or more completions, equipment, etc., may be the same or differ from those illustrated in FIG. 11. FIG. 11 serves as an example of types of processes and equipment that may be involved in developing a field, shutting down a field, planning development, planning shut down, etc.

Figure 12:
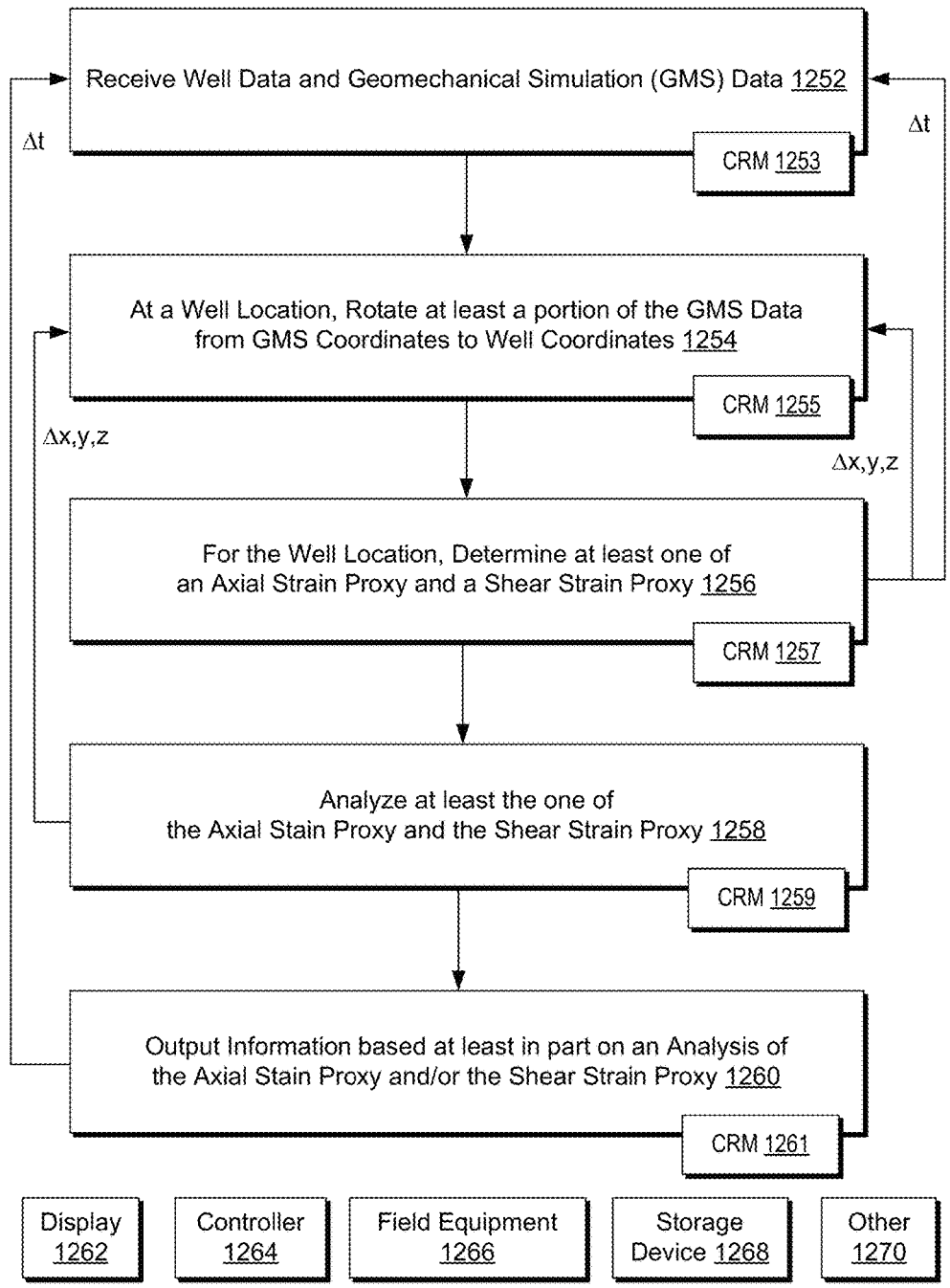
FIG. 12 illustrates an example of a method.

FIG. 12 shows an example of a method 1250 that includes a reception block 1252 for receiving well data and geomechanical simulation (GMS) data, a rotation block 1254 for rotating at least a portion of the GMS data from GMS coordinates to well coordinates (e.g., for a well location), a determination block 1256 for determining at least one of an axial strain proxy and a shear strain proxy (e.g., for the well location), an analysis block 1258 for analyzing at least the one of the axial strain proxy and the shear strain proxy, and an output block 1260 for outputting information based at least in part on an analysis of the axial strain proxy and/or the shear strain proxy (e.g., based on output from the block 1258). As shown in the example of FIG. 12, the output block 1260 may include outputting to a display 762, a controller 1264, field equipment 1256 (e.g., satellite, surface, subsurface, etc.), a storage device 768 and/or one or more other devices.

As shown in FIG. 12, one or more loops may exist, for example, to perform one or more iterations that may consider different locations, different wells, different times, etc.

The method 1250 is shown along with blocks 1253, 1255, 1257, 1259 and 1261, which may represent computer-readable non-transitory storage media that are not carrier waves and that include computer-executable instructions to instruct a computing system to perform operations. As an example, the blocks 1253, 1255, 1257, 1259 and 1261 may be modules such as modules of the modules 270 of the system 250 of FIG. 2. As an example, the blocks 1253, 1255, 1257, 1259 and 1261 may be stored in memory, for example, consider the memory 258 of the system 250 of FIG. 2, the controller 1264 of FIG. 12, etc.

As an example, a method can include receiving well path data and geomechanical simulation data for a geologic environment; rotating at least a portion of the geomechanical simulation data from geomechanical simulation coordinates to well coordinates associated with the well path data; determining at least one of an axial strain proxy and a shear strain proxy based at least in part on the rotating; and analyzing at least the one of the axial strain proxy and the shear strain proxy. In such an example, the well path data can include well location data and well orientation data. As an example, well orientation data can be or include angles. For example, consider inclination angle and azimuth angle. In the aforementioned method, analyzing can include assessing structural stability of well casing, well cement or well casing and well cement.

As an example, analyzing may include classifying at least a portion of a well as a member of a class by comparing an axial strain proxy to an axial strain threshold and/or classifying at least a portion of a well as a member of a class by comparing a shear strain proxy to a shear strain threshold. As an example, a method can include classifying at least a portion of a well as a member of a class by comparing an axial strain proxy to an axial strain threshold and by comparing a shear strain proxy to a shear strain threshold. As an example, a method can include updating an axial strain threshold based at least in part on field data, updating a shear strain threshold based at least in part on field data or updating an axial strain threshold and a shear strain threshold based at least in part on field data. In such an example, field data may be data indicative of a state of collapse of at least a portion of a well. For example, field data may be data acquired via a downhole tool, a lack of flow, pressure readings, etc.

As an example, a class may be associated with a risk or risks. For example, where an axial strain proxy at a location along a well path exceeds an axial strain threshold, that location may be at risk of collapse. In such an example, the risk may be classified qualitatively and/or quantitatively. For example, a risk may be low, medium or high. As an example, classifying may include determining an amount by which a proxy exceeds a corresponding threshold or by which proxies exceed corresponding thresholds. For example, where a proxy does not exceed a threshold, a class may be a low risk class, where a proxy exceeds a threshold by X percent, a class may be a medium risk class and where a proxy exceeds a threshold by Y percent, a class may be a high risk class.

As an example, a system can include a processor; memory; one or more modules stored in the memory where the modules include instructions executable by the processor to instruct the system and where the instructions include instructions to: receive well path data for a well path and geomechanical simulation data for a geologic environment; rotate at least a portion of the geomechanical simulation data from geomechanical simulation coordinates to well coordinates associated with the well path data; determine, for at least a portion of a well path, at least one of an axial strain proxy and a shear strain proxy; and analyze at least the one of the axial strain proxy and the shear strain proxy.

As an example, one or more computer-readable storage media (that are not signals) that include computer-executable instructions to instruct a computing system can include instructions to receive well path data for a well path and geomechanical simulation data for a geologic environment; rotate at least a portion of the geomechanical simulation data from geomechanical simulation coordinates to well coordinates associated with the well path; determine, for at least a portion of the well path, at least one of an axial strain proxy and a shear strain proxy; and analyze at least the one of the axial strain proxy and the shear strain proxy.

As an example, a method may include modeling of poromechanics, which may refer to continuum mechanics and acoustics associated with behaviors of fluid-saturated porous media. A porous medium or a porous material may be a solid (e.g., a matrix) permeated by an interconnected network of pores (e.g., voids) that may be filled with a fluid (e.g., liquid or gas). A matrix and pore network may, for example, be considered continuous so as to form two interpenetrating continua. As an example, a porous medium with a solid matrix that is elastic that includes pore fluid that is viscous may be referred to as being poroelastic. As an example, a poroelastic medium may be characterized by its porosity, permeability as well as properties of its constituents (e.g., solid matrix and fluid(s)).

As an example, a model may be a geomechanical model. As an example, a geomechanical model may be or include one or more of an elastic model, a poroelastic model, a poromechanical model, a thermomechanical model, etc.

As an example, a method may be implemented that can include modeling one or more thermal phenomena. Such a method may apply to a high pressure and/or high temperature operation. For example, a harsh environment may be classified as being a high-pressure and high-temperature environment (HPHT). A so-called HPHT environment may include pressures up to about 138 MPa (e.g., about 20,000 psi) and temperatures up to about 205 degrees C. (e.g., about 400 degrees F.), a so-called ultra-HPHT environment may include pressures up to about 241 MPa (e.g., about 35,000 psi) and temperatures up to about 260 degrees C. (e.g., about 500 degrees F.) and a so-called HPHT-hc environment may include pressures greater than about 241 MPa (e.g., about 35,000 psi) and temperatures greater than about 260 degrees C. (e.g., about 500 degrees F.). As an example, an environment may be classified based in one of the aforementioned classes based on pressure or temperature alone. As an example, an environment may have its pressure and/or temperature elevated, for example, through use of equipment, techniques, etc. For example, a SAGD operation may elevate temperature of an environment (e.g., by 100 degrees C. or more).

As an example, a method may include analyzing a formation in a manner that accounts for operation of one or more pieces of equipment in the borehole. For example, consider a pump such as an electric submersible pump (ESP), which may alter pressure, fluid flow, etc. as fluid is pumped by the pump. As an example, an analysis may determine stability and/or instability of a borehole during operation, after operation, etc. of such a pump. As another example, consider a downhole steam generator that may generate steam in a borehole. An analysis may determine well survivability during operation, after operation, etc. of such equipment.

As an example, a system can include a processor; memory operatively coupled to the processor; and one or more modules that include processor-executable instructions stored in the memory to instruct the system to receive well data and geomechanical simulation (GMS) data, rotate GMS data from GMS coordinates to well coordinates (e.g., for a well location), determine at least one of an axial strain proxy and a shear strain proxy (e.g., for the well location), analyze at least the one of the axial strain proxy and the shear strain proxy, and output information based at least in part on an analysis of the axial strain proxy and/or the shear strain proxy.

As an example, one or more computer-readable storage media (that are not signals) can include processor-executable instructions to instruct a system where the instructions include instructions to receive well data and geomechanical simulation (GMS) data, rotate GMS data from GMS coordinates to well coordinates (e.g., for a well location), determine at least one of an axial strain proxy and a shear strain proxy (e.g., for the well location), analyze at least the one of the axial strain proxy and the shear strain proxy, and output information based at least in part on an analysis of the axial strain proxy and/or the shear strain proxy. As an example, a system can receive data and/or a model via an interface or interfaces, which may receive data from a storage device of the system, a storage device coupled to the system, etc. (e.g., via a network or networks).

Figure 13:
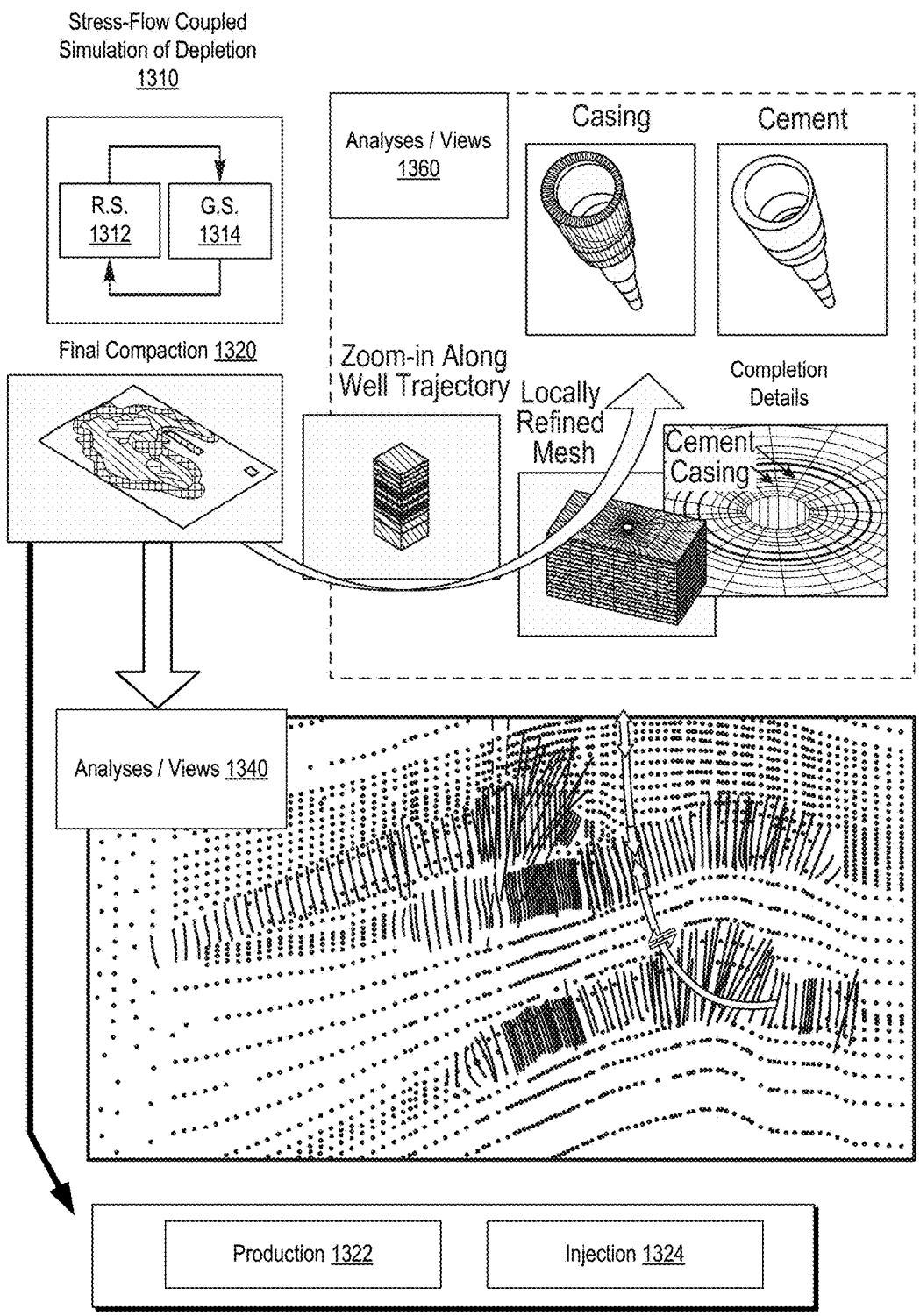
FIG. 13 illustrates an example of a method, examples of graphical user interfaces and examples of analysis techniques.

FIG. 13 shows an example of a stress-flow coupled simulation of depletion of a resource from a reservoir 810 that may include coupling features of a reservoir simulator 1312 (e.g., consider the ECLIPSE® framework reservoir simulator, the INTERSECT® framework simulator, etc.) and a geomechanics simulator 1314 (e.g., consider the VISAGE® framework simulator, etc.). As an example, one or more other frameworks may be included in such a simulation (e.g., as part of a workflow, etc.).

As illustrated in FIG. 13, as an example, a final compaction 1320 may be determined for a particular point in time. As an example, an analysis 1340 may be performed to determine borehole (e.g., well) related risks (e.g., survivability, stability, instability, etc.) on a macro scale and/or an analysis 1360 may be performed to determine borehole (e.g., well) related risks (e.g., survivability, stability, instability, etc.) on a micro scale. For example, a micro scale may include determining information on a resolution associated with a casing, cement, etc. of a completion (e.g., a completed portion of a borehole, etc.). As an example, a method can include visualizing information via a borehole path, for example, as a fly-through a geologic environment along a borehole path. In such an example, a visualization may include displaying wall related information such as stress, strain, etc. As an example, information associated with stability, instability, risk of collapse, etc. may be displayed.

FIG. 13 also shows information associated with production 1322 and with injection 824. As an example, a method may account for production and/or injection.

As an example, the analysis 1360 may include generating a locally refined mesh. As an example, a method can include performing an analysis on a macro scale to identify various risks and then performing an analysis on a smaller scale (e.g., micro scale) to further assess such risks. For example, a method may include the analysis 1340 followed by the analysis 1360.

As an example, a method can include flagging a depth interval as being at risk and then calling for a more detailed analysis, for example, via accessing one or more modules of a framework. As an example, an analysis can start by specifying a set of materials and completions, for example, by entering a casing grade, type of cement, etc. In such an example, survivability may be assessed where, for example, if unacceptable, one or more parameters may be updated (e.g., via expert advice, a database, etc.). For example, consider updating to make a well safer, casing thicker, cement softer, etc., and then performing another analysis or analyses to see which proposed approach may withstand the expected loading. Such a method may provide insight into design of wells, well engineering, etc.

As to the analysis 1340, it may be referred to as a rapid analysis, for example, in comparison to the analysis 1360. As an example, the analysis 1340 may analyze a plurality of wells, for example, consider analyzing over one hundred wells for a plurality of simulation times steps while screening individual wells as to survivability (e.g., at one or more depth intervals, etc.). Results of the analysis 1340 may lead to a more focused approach to the analysis 1360. As an example, an analysis may be performed for existing and/or planned wells. As an example, an analysis for planned wells may be implemented to select one or more proposed wells from a plurality of candidates where such a selection may be based at least in part on one or more survivability related criteria.

FIGS. 14 and 15 shows plots 1410 and 1430 and plots 1510 and 1530, respectively, as to changes in pore pressure and vertical strain in the two coupled time steps of separated in time by a number of years (e.g., about three years).

The plots 1410, 1430, 1510 and 1530 correspond to strain tensor information from a pre-constructed reservoir-geomechanics model. In this example, a 3D MEM was initialized to year 2000 where production began in 2003 with subsequent injection following in 2006. Field wide stresses and strains were calculated at two coupled time steps of 2006 and 2009. The field examined included 102 producing wells and 26 water injection wells. The plots 1410 and 1430 are for pore pressure and the plots 1510 and 1530 are for vertical strain at the coupled times. A comparison of the pressure field and vertical strain field shows that the reservoir expands as caused by injection while producing areas experience compaction.

Figure 16:
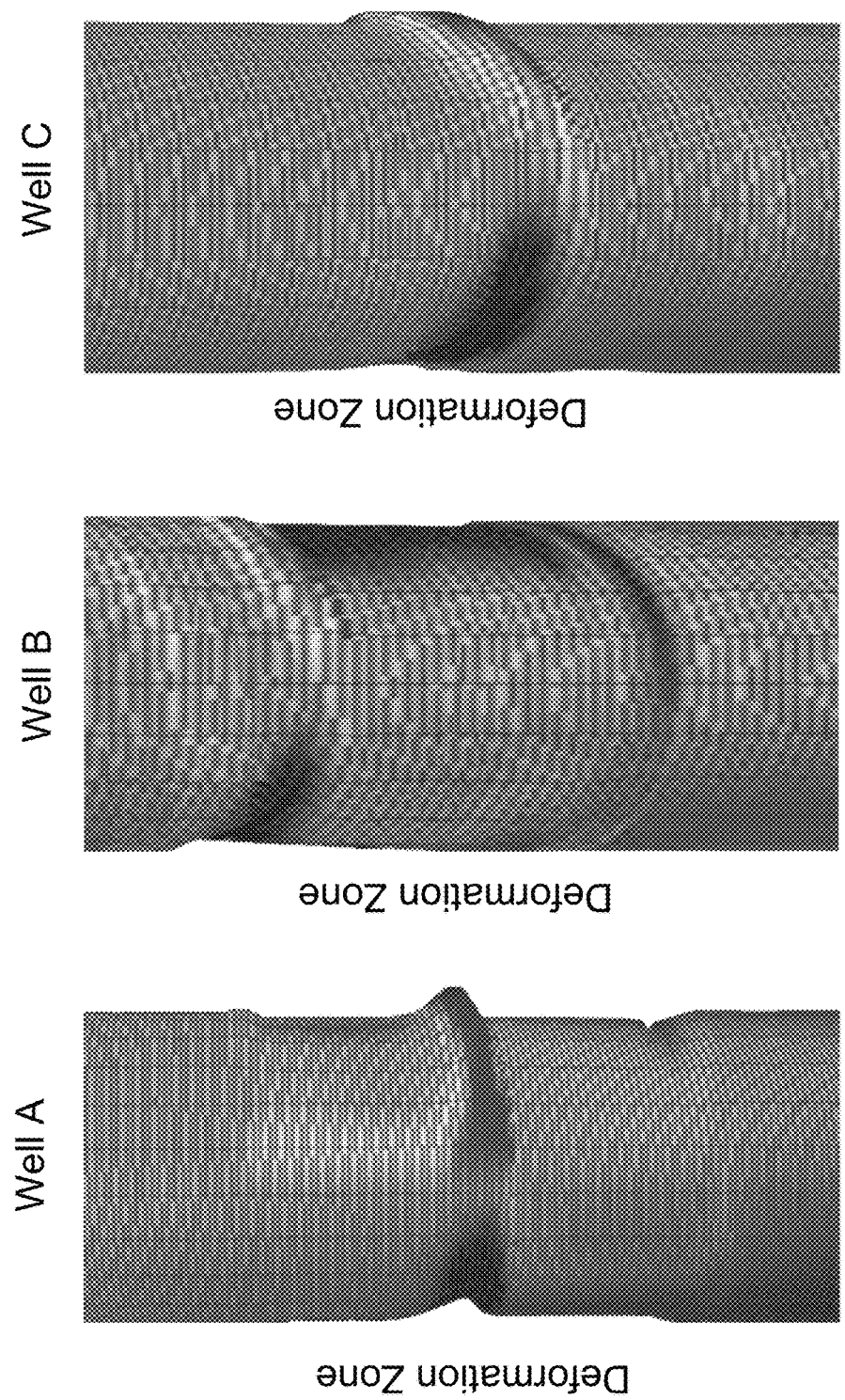
FIG. 16 illustrates examples of wellbore deformation.

FIG. 16 shows information for Well A, Well B and Well C. Specifically, the information pertains to casings for deformed Wells A, B and C where they were deformed by up to about 8 cm. The length of the deformation intervals were in an approximate range from about 0.3 m to about 8 m.

As an example, strain field may change over time, for example, in response to operations such as injection and/or production. As mentioned, deformation may occur, which may include stretching and/or shortening.

As an example, strain information may be available on a grid scale that includes grid cells with horizontal dimensions of about 50 to about 200 meters (e.g., consider about 100 meters) and vertical dimensions of about a few meters to a few tens of meters; noting that outside a reservoir region, the dimensions may be larger (e.g., more coarse).

As an example, a method can include receiving such strain information and determining how much stretching, shortening and shearing may be occurring with respect to a local well trajectory. As an example, a strain field may be specified in coordinates such as E, N and vertical (up). For example, such coordinates may be implemented in the PETREL® framework (e.g., seismic-to-simulation framework). A transform may transform strain information to a local coordinate system for a location along a well trajectory (e.g., for an actual well or a planned well). Such a transform may rotate a strain tensor to a coordinate system attached to a well (e.g., a radial direction, a top-of-hole direction and an axial direction). An axial strain proxy may allow for an assessment of stretching of a well trajectory or shrinking/shortening of a well trajectory while a shear strain proxy may allow for an assessment of a shift in an axis of a well trajectory (e.g., offsetting of a well axis).

Figure 17:
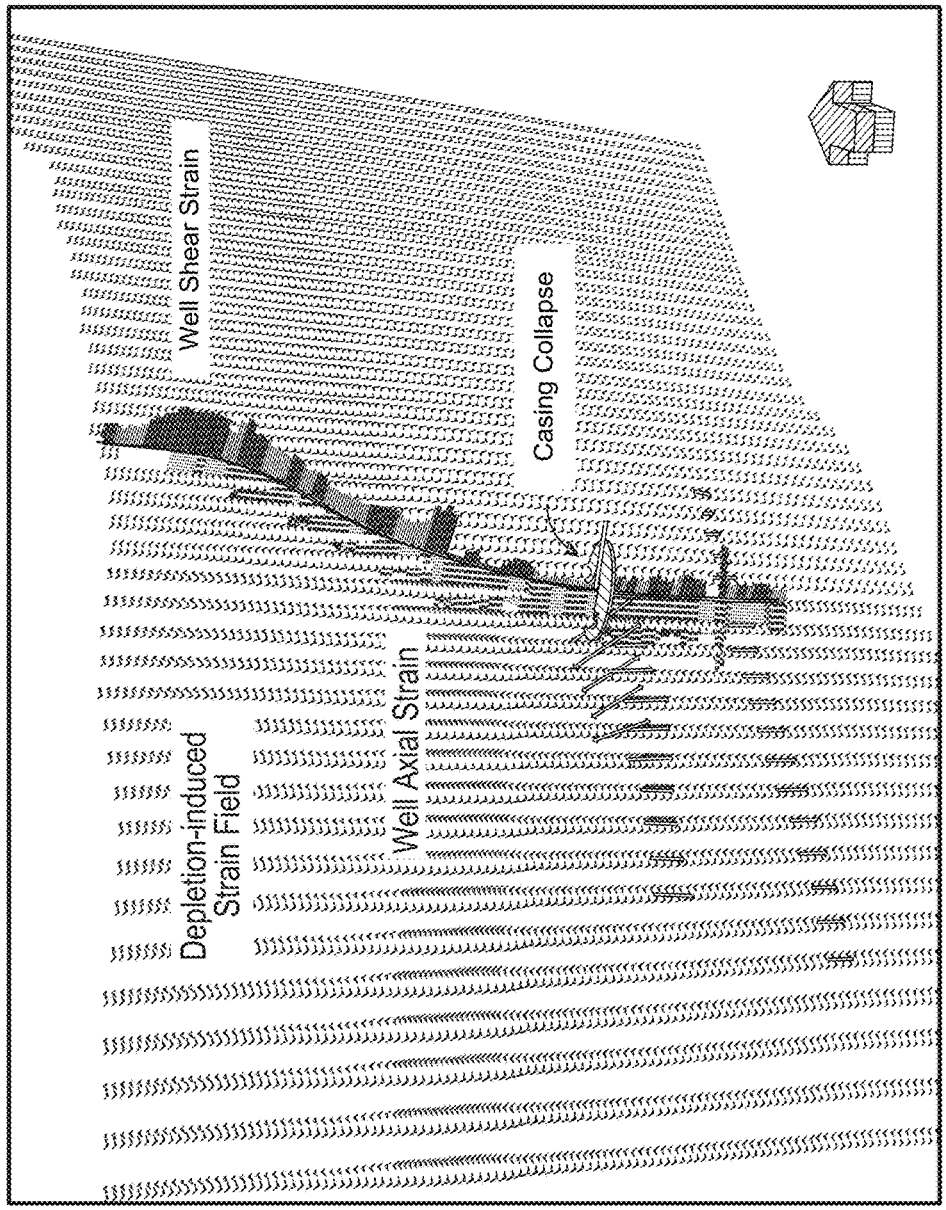
FIG. 17 illustrates an example of a graphical user interface, for example, as rendered to a display via a computing system.

FIG. 17 shows a graphical view of an example of an identified casing collapse in a geologic environment. Such a view may be rendered as a graphical user interface that provides for navigation, interaction, etc., of information. FIG. 17 shows various details as to well "shear" strain (e.g., via proxy information) and as to well "axial" strain (e.g., via proxy information). As illustrated, shortening and/or stretching may be provided using quantitative information based at least in part on a proxy (e.g., in a color scale, for example, from blue as shortening to green as stretching). As an example, shear strain may be illustrated using a scale as to magnitude of shear strain, for example, via a mono or multi-color scale. As an example, a graphical user interface (GUI) may include a control that allows a user to navigate and zoom-in on a region of a borehole, which may illustrate a portion of a borehole with more particularity, optionally in a coordinate system associated with the borehole (e.g., a local coordinate system that may be a cylindrical, a Cartesian or other coordinate system). For example, a control may represent information for a location in one coordinate system to another coordinate system, which may provide for a better representation of particular information.

In the example of FIG. 17, the data may correspond to axial and shear strain proxies along a well with, in the background, a depletion-induced strain field in a vertical slice of the field.

As an example, resulting profiles of axial and shear strain proxies may be compared, for example, against one or more pre-defined thresholds. Such a process may facilitate identification of one or more wells (e.g., and/or one or more depth intervals along a well or wells) over which one or more proxy values exceed a certain threshold or thresholds. As an example, such thresholds may be decided based on the literature, on modeling analysis, or calibrated based on observed well collapse events. As an example, a modeling analysis may be implemented to train one or more thresholds, for example, as to failure of a completed borehole (e.g., at least a portion of a casing, etc.).

As an example, a method may be applied to issue early warnings regarding survivability risks along existing wells or planned wells. For existing wells, results may, for example, help plan for monitoring and intervention. For planned wells, a method may, for example, help design a trajectory that is relatively safer, from a survivability standpoint. As an example, an advanced analysis may be performed over a flagged depth interval or intervals (see, e.g., the analysis 1360 of FIG. 13). For example, well design and/or well engineering workflows may implement an analysis based at least in part on flagged information.

As an example, elements of a model of a geologic environment may optionally be assigned well trajectory information. In such an example, an analysis may include determining which elements may be more suitable than others for one or more well trajectories. For example, where a model includes overburden and where well trajectories are expected to be substantially vertical in the overburden, elements of the overburden may be assigned well trajectory information as to such orientations where an analysis can output one or more values that characterize the elements as to their suitability for placement of one or more vertical wells (e.g., through at least a portion of the overburden). While vertical orientation is mentioned, one or more other orientations may be assigned (e.g., horizontal, 40 degrees to NE, etc.). As an example, a method can include screening regions of a geologic environment as to their expected survivability for a well or wells oriented in a particular manner in such regions. As an example, a region may be an element of a model (e.g., a grid cell), a collection of elements, etc.

Figure 18:
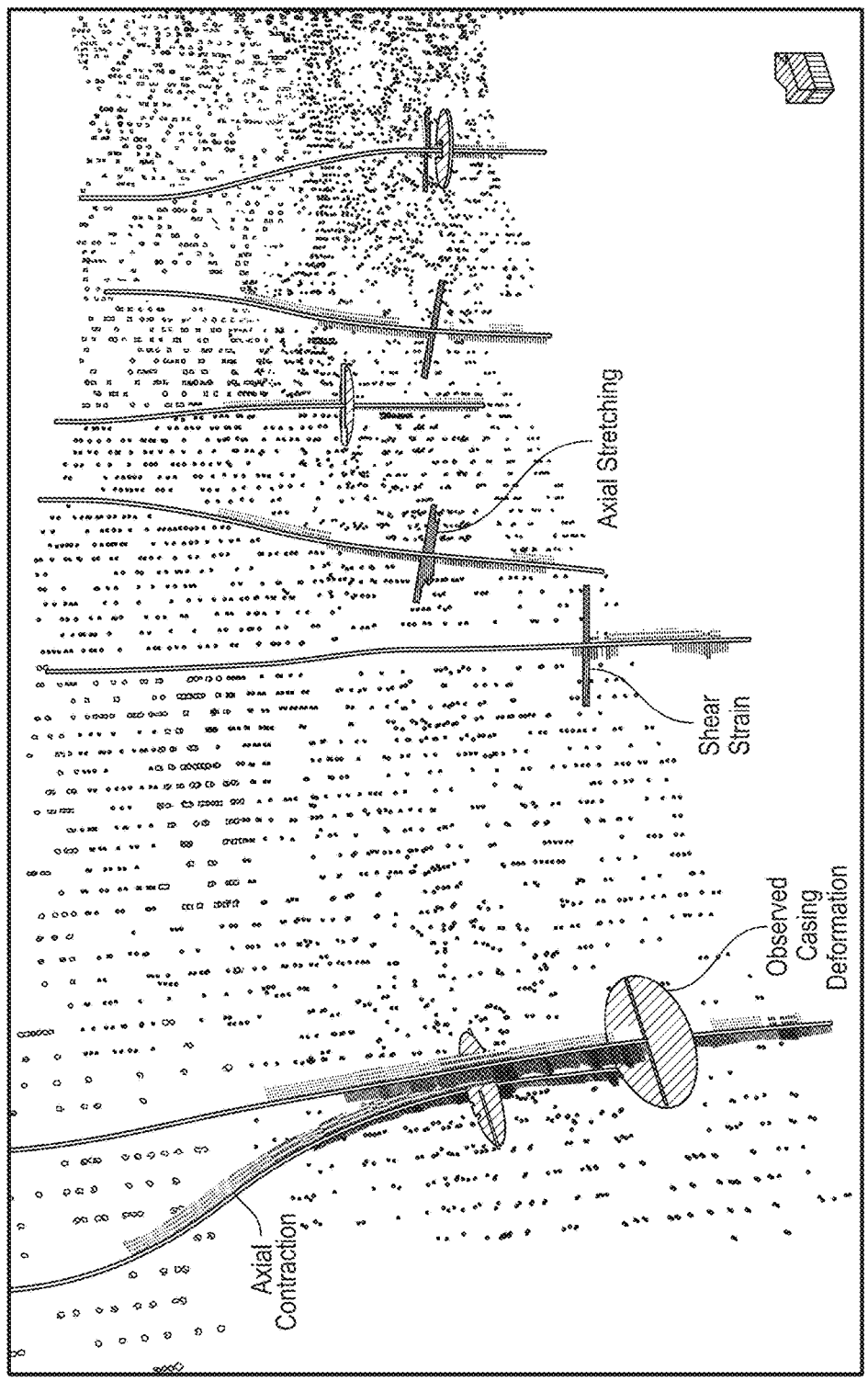
FIG. 18 illustrates an example of a graphical user interface, for example, as rendered to a display via a computing system.

FIG. 18 shows a graphical view of results of axial and shear strains, from a particular time step, along well trajectories of deformed wells and non-deformed wells. Such a view may be rendered as a graphical user interface that provides for navigation, interaction, etc., of information. As shown, there is axial stretching within an injected interval.

The results shown in FIG. 18 correspond to axial and shear strain from the 2009 time of the example corresponding to FIGS. 14, 15, 16 and 17 where such values are indicated along well trajectories of deformed wells and non-deformed wells. Logs are illustrated as extending from a trajectory in a three-dimensional space to indicate shear strain and to indicate axial strain. As shown in FIG. 18, axial stretching can occur within an injected interval. Intervals of relatively high shear strain can occur, for example, with observed casing deformation; noting that some "non-deformed" wells can also experience intervals of relatively high shear strain.

Figure 19:
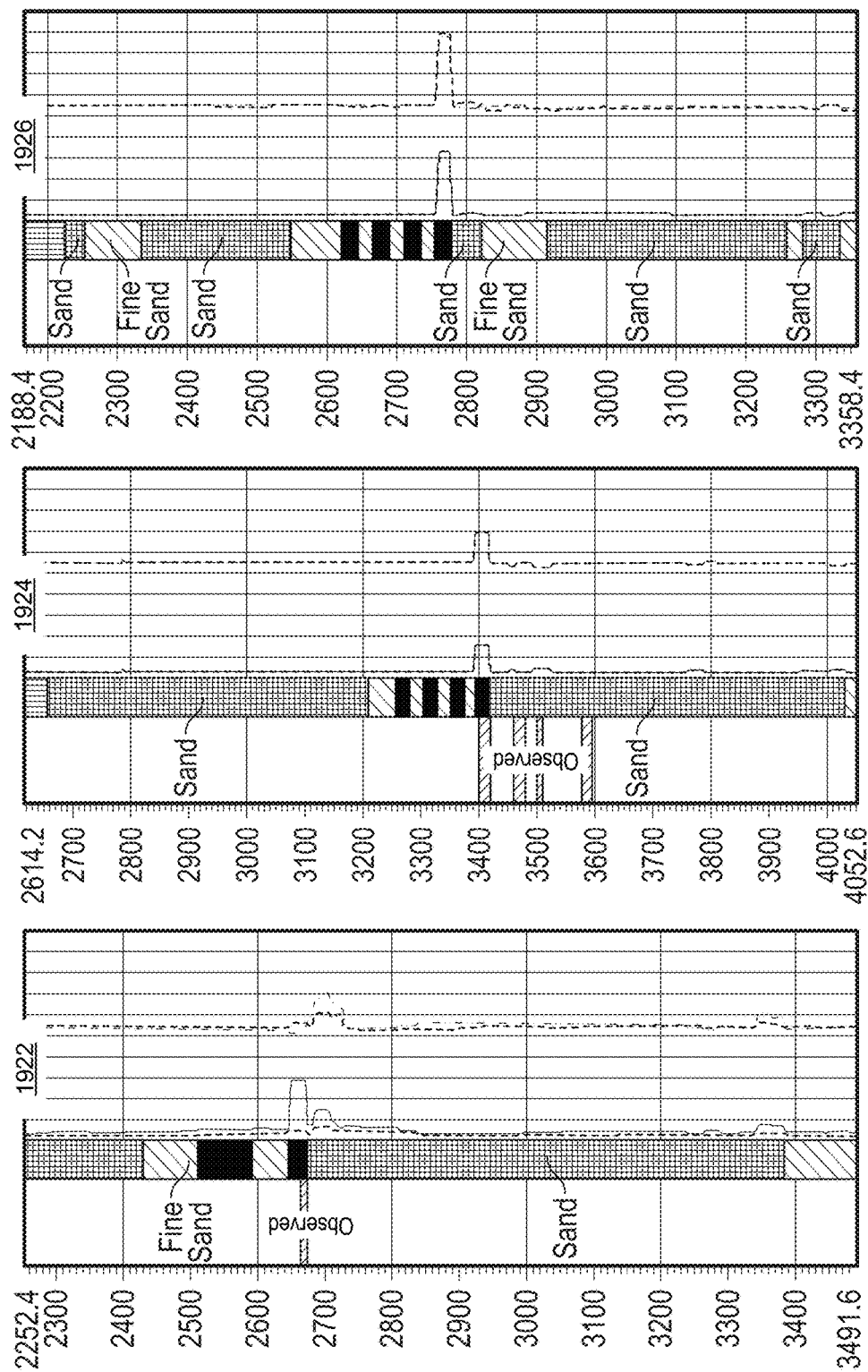
FIG. 19 illustrates examples of graphical user interfaces that can display information as to well survivability and risks in an environment.

FIG. 19 shows plots 1922, 1924 and 1926 of axial and shear strains for a first time (dashed lines) and a second time (solid lines) in a well log format. These results are shown across both producing sandstone intervals with the chert/shale interval marked by the zone via solid black boxes in the lithology band. The intervals in the left track of each log represent the observed deformation.

As an example, a graphical user interface may include one or more graphical controls for generation of, rendering of, navigation of, control of, etc. one or more logs such as one or more of the plots 1922, 1924 and 1926 of FIG. 19. For example, survivability information may be rendered with respect to trajectory length, well depth, etc. As an example, information may be rendered along with information from a wellbore tool (e.g., lithology information, wellbore imagery, etc.).

As an example, a wellbore tool may include equipment for assessing casing and/or cement. As an example, a method may include identifying an interval of a well that may be susceptible to failure due to its geomechanical environment and directed a wellbore tool to acquire data at and/or near the identified interval. For example, output of risk information as to collapse may be input to a wellbore tool that may be controlled in an automated, manual or semi-automated manner. In such an example, one or more identified intervals may be used to automatically direct the wellbore tool to acquire data, may be used to instruct an operator to direct the wellbore tool to acquire data or may be used in a semi-automated manner by an operator to direct the wellbore tool to acquire data.

Figure 20:
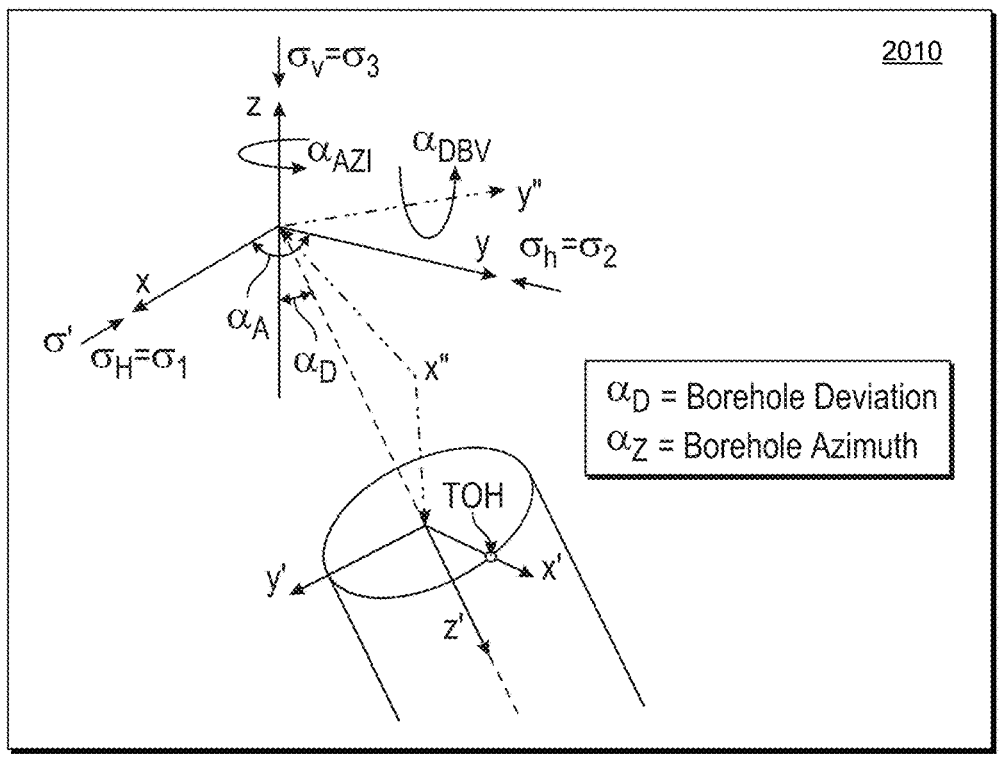
FIG. 20 illustrates an example of a bore and a coordinate system.
Figure 21:
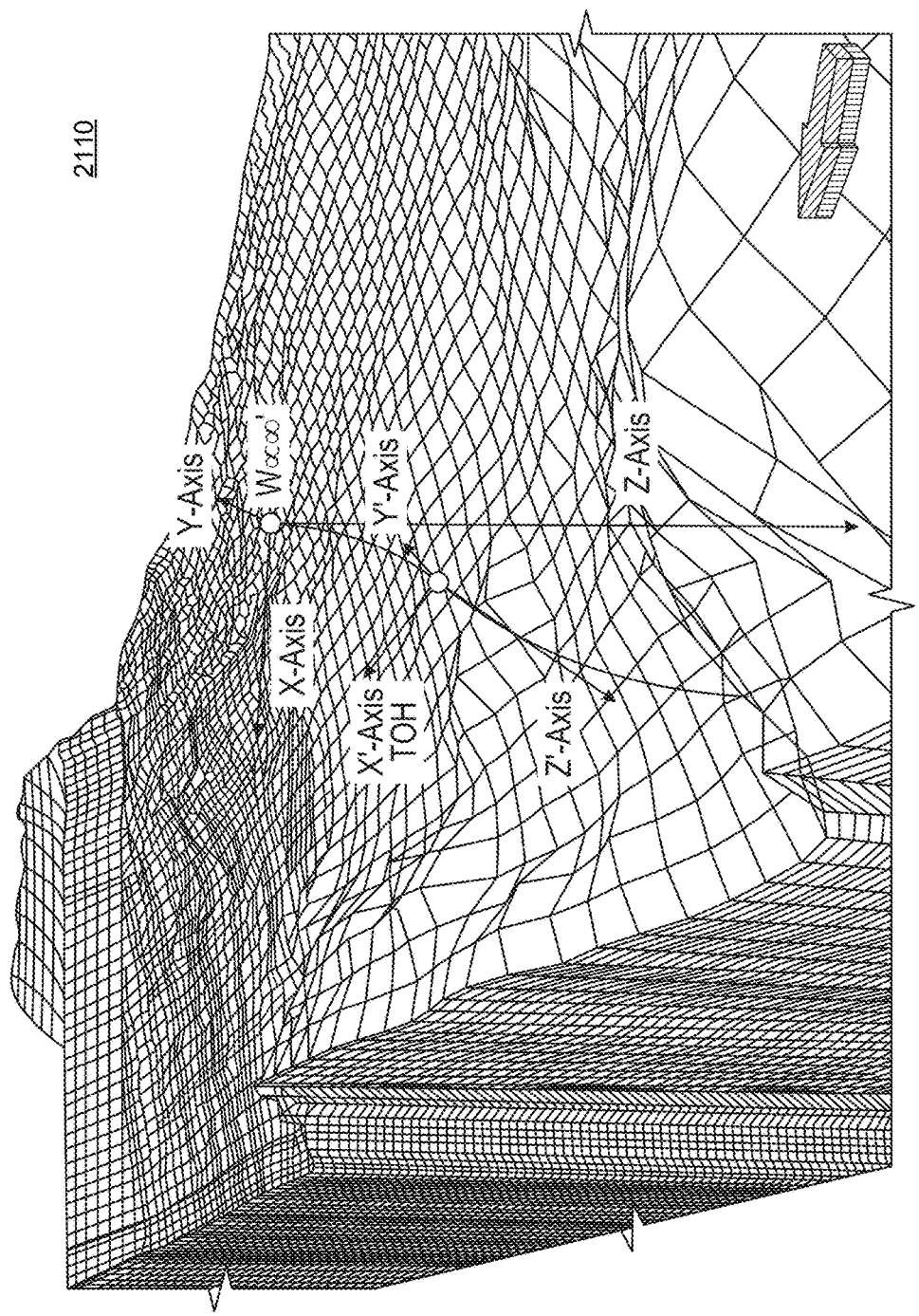
FIG. 21 illustrates an example of a bore and examples of coordinate systems.

FIG. 20 shows an example graphic 2010 of a wellbore in a formation and FIG. 21 shows an example, graphic 2110 of a wellbore in a formation. The graphic 2010 shows borehole deviation and borehole azimuth and the graphic 2110 shows a field's coordinate system rotated onto a local point on a well's trajectory where it remains in relation to its top of hole (TOH). In particular, a mesh is illustrated (e.g., a set of grid cells) with a trajectory (e.g., consider a model mesh such as a finite element method model mesh, etc.). As an example, the field's coordinate system may be rotated onto a local point on a well's trajectory, for example, to compute one or more of an axial strain proxy and a shear strain proxy. In the examples of FIGS. 20 and 21, the TOH of the strain tensor is in relation to the z'-axis.

As an example, a method can provide for relatively rapid screening of well survivability. In such an example, local results of a field scale model may be processed with well information to provide well sector details. As an example, well information can include inclination and azimuth of trajectories of wells in a field. A method may include generating values for axial strain and shear strain along at least a portion of a well trajectory.

As an example, strains may be based on deformations of rock masses, for example, where a continuum approach may be applied via a numerical technique that includes a mesh that spatially represents a geologic environment as a number of cells (e.g., consider cell volume of an individual cell defined by the mesh as corresponding to a rock mass, etc.).

A strain tensor from a reservoir-geomechanical model along with inclination and azimuth of a well may be used such that shear strain and axial strain of a geomechanical model can be utilized for one or more tasks such as well planning, flagging wells based on one or more thresholds, etc. As an example, a method may include flagging one or more wells and/or one or more of their intervals prone to risk of casing collapse. As an example, a method can include classifying a well as a member of a class and then flagging the well based at least in part on the class. For example, where a class is a high risk class, a corresponding portion of a well or an entire well may be flagged. As an example, a method can include rendering wells to a display along with class information, which may be shown via color coding, shading, blinking, etc.

As to equations, consider the following examples.

$$\tilde{\varepsilon} = \begin{pmatrix} \varepsilon_{xx} & \gamma_{xy} & \gamma_{xz} \\ \gamma_{yx} & \varepsilon_{yy} & \gamma_{yz} \\ \gamma_{zx} & \gamma_{zy} & \varepsilon_{zz} \end{pmatrix} \quad \text{Eq. 1}$$

$$\varepsilon' = [R_y(incl) \times R_z(azi)]^T \times \tilde{\varepsilon} = \begin{pmatrix} \varepsilon'_{xx} & \gamma'_{xy} & \gamma'_{xz} \\ \gamma'_{yx} & \varepsilon'_{yy} & \gamma'_{yz} \\ \gamma'_{zx} & \gamma'_{zy} & \varepsilon'_{zz} \end{pmatrix} \quad \text{Eq. 2}$$

As an example, axial and shear strain may be calculated at a defined sampling rate along a well's trajectory. As an example, a strain tensor (e.g., given in geographical coordinates) may be rotated onto a well's local coordinate system at a plurality of points.

As an example, consider the following example equations as to axial and shear strain proxies (E_Wa and E_Ws, respectively):

$$E\_Wa = \varepsilon'_{zz} \quad \text{Eq. 3}$$

$$E\_Ws = \sqrt{\gamma'^2_{xz} + \gamma'^2_{yz}} \quad \text{Eq. 4}$$

In the above equations, the shear strain per Eq. 4 is based on two terms, which are squared and summed. To determine the shear strain, the square root is taken of the sum. Such an approach may provide a proxy that can be used to assess risk of deformation with respect to a cross-section of a borehole, well, etc. For example, such a proxy can be used to assess one or more cross-sectional planes as to deformation that may cause an offset in a well path, shearing of a well path, a jog in a well path, a kink in a well path, etc.

As an example, a proxy may be based at least in part on a radial dimension or radial dimensions. As an example, a proxy may be calculated that characterizes deformation of a circle, for example, with respect to an ellipse defined by a major axis and a minor axis (e.g., or other type of geometric shape). In such an example, a cross-sectional area may be determined and analyzed with respect to flow of fluid, access via a tool, etc. Such an analysis may determine whether at least a portion of a well trajectory is suitable for an intended purpose.

As an example, survivability may be based on one or more of shortening, stretching and shearing values, optionally in comparison to one or more thresholds (e.g., a strain percentage threshold or thresholds). As an example, a value of a shortening or a stretching threshold in terms of percent strain may exceed the value of a shearing threshold in terms of percent strain. As an example, a method that includes classifying may include one or more shortening classes, one or more stretching classes, one or more shearing classes. For example, a portion of a well may be classified based on whether it is shown via simulation results to experience one or more of shortening, stretching and shearing (e.g., by comparing to one or more corresponding thresholds, etc.).

Referring again to the graphic 2110 of FIG. 21, it shows a field's coordinate system rotated onto a local point on a well's trajectory where it remains in relation to its top of hole (TOH). Above, Eq. 1 can represent the strain tensor in a model's geographical coordinate system where it can be rotated by the well's inclination and azimuth angles. Above, Eq. 2 represents rotation or transformation (e.g., transformation from one coordinate system to another) where ε' is the rotated strain tensor on a point along a well's trajectory. As an example, a proxy or proxies may be calculated via one or more equations such as, for example, one or more of Eq. 3 and Eq. 4 (e.g., or other equation(s)).

As a strain tensor is rotated based on its TOH, the zz component of the strain tensor can be aligned with a well's trajectory. As a result, the $\varepsilon'_{zz}$ in Eq. 2 is the axial strain at a given point along the well's trajectory. In such an example, a positive value can indicate an elongating strain and a negative value can represent a shortening strain; noting that strains may be understood according to a given sign convention (e.g., shortening may be positive and elongation may be negative).

As an example, measured shear strain at points along a well's trajectory can be substantially perpendicular to its axial strain. The shear components of $\gamma_{xz}$ and $\gamma_{yz}$ in Eq. 2 may be used to find a resultant shear strain. As an example, shear strains can be given in relation to a well's axis (z-axis) and can be used to determine resulting shear strain of a point along the well.

As an example, inclination, azimuth and strain tensor may be used given spacing of about a meter to about two meters (e.g., or optionally more). In such an example, axial and shear strain can be calculated at increments of about one to about two meters along at least a portion of a well. As an example, smaller sampling rates for calculation may be used, for example, which may increase computation time and/or computational resource demands to maintain a desired level of rapidity. As an example, a method may include a parameter such as a sampling rate parameter that may be selected, adjusted, etc. For example, such a parameter may take a value to achieve a balance between speed of processing whilst still capturing a desired level of detail of deforming rock masses.

As an example, a method can include accounting for one or more different types of casing and/or cement and, for example, optionally applied mud pressure, as mud may behave differently when affected by changing stresses. As an example, a method may include accounting for type of casing joints, casing centralizers, etc. As an example, stresses may impact portions of a centralizer. As an example, a method may include accounting for diameter, radius, annular thickness, etc., of a well, a casing, cement, etc. As an example, a method may include representing a well as a line, for example, in a multidimensional space.

As an example, a method can include inputting strain tensor over time into a geomechanics framework to produce axial strain and shear strain along at least a portion of a trajectory of a well in a field. As an example, such an approach may implement one or more threshold values. For example, consider one or more threshold values that correspond to onset of deformation. As an example, such values may be analyzed with respect to one or more of axial strain and shear strain results from a geomechanics framework. As an example, a method may include flagging one or more wells, one or more portions of a well, etc., for example, as may be at one or more depth intervals prone to deformation. Such flags may optionally be compared against observed and/or recorded casing deformations in a field. As an example, such information may be fed-back in an iterative manner to update one or more values (e.g., consider updating one or more threshold values).

As an example, a method may be applied to a particular field where, over time, information from the field may be utilized to update one or more aspects of the method (e.g., one or more thresholds, etc.). As an example, an updated model for a field may optionally be utilized to assess one or more future wells and/or proposed wells (e.g., candidate wells, etc.).

Figure 22:
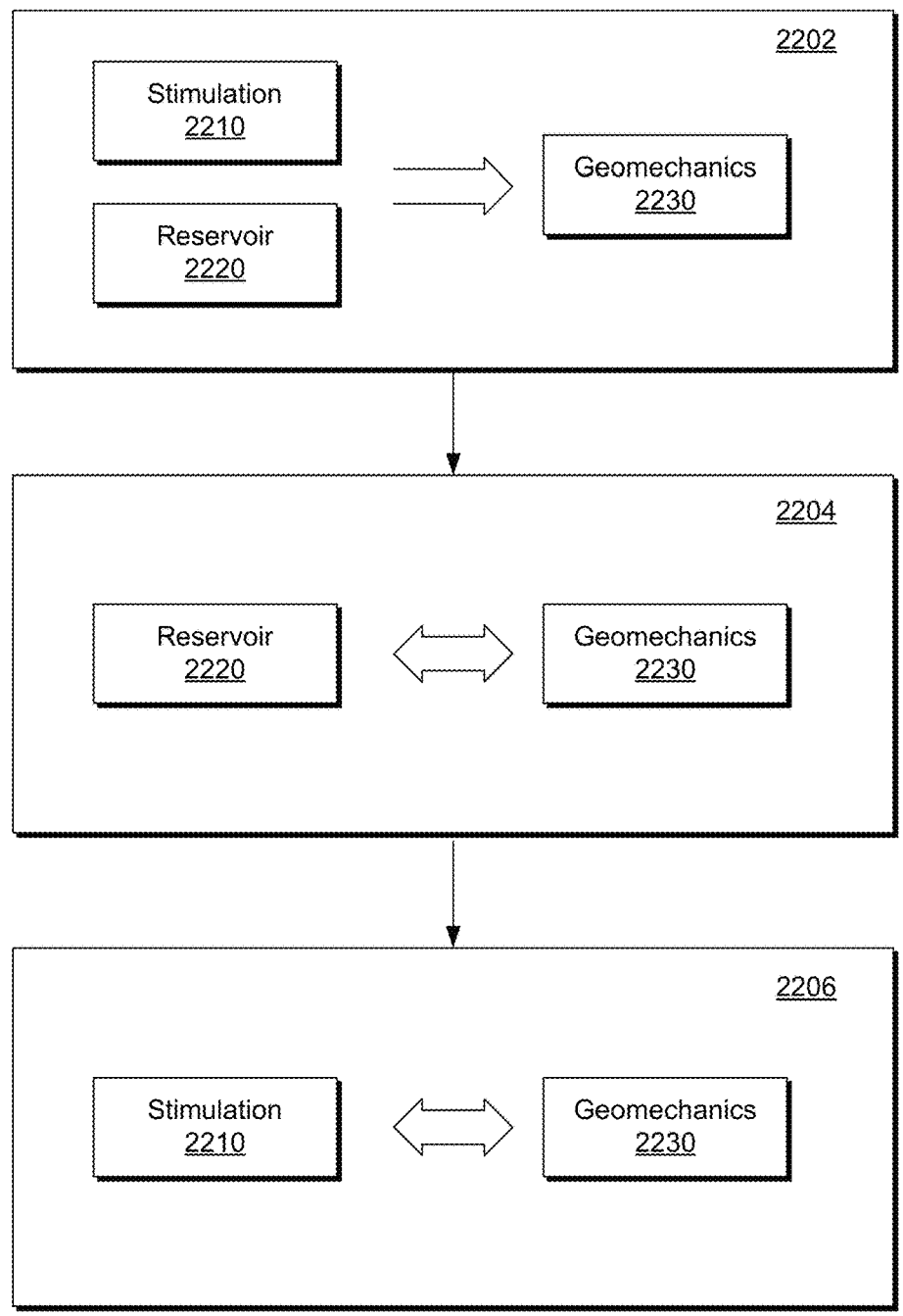
FIG. 22 illustrates an example of a method.

FIG. 22 shows an example of a method 2200 that includes blocks 2202, 2204 and 2206 in association with a stimulation modeling framework 2210, a reservoir modeling framework 2220 and a geomechanics modeling framework 2230.

As an example, the block 2202 can provide for transferring information from the stimulation modeling framework 2210 and the reservoir modeling framework 2220 to the geomechanics modeling framework 2230. As an example, the block 2204 can provide for transferring information from the reservoir modeling framework 2220 to the geomechanics modeling framework 2230 and, for example, from the geomechanics modeling framework 2230 to the reservoir modeling framework 2220. As an example, the block 2206 can provide for transferring information from the stimulation modeling framework 2210 to the geomechanics modeling framework 2230 and, for example, from the geomechanics modeling framework 2230 to the stimulation modeling framework 2210.

As an example, the block 2202 may provide for a one way coupling that allows for solving for stress in a manner that accounts for interactions with fractures, which can include hydraulic fractures and, for example, natural fractures that are activated (e.g., reactivated) via hydraulic fracturing. As an example, generation of stress simulation results via the geomechanics modeling framework 2230 (e.g., the VISAGE® framework, etc.) may be based at least in part on input from the stimulation modeling framework 2210 (e.g., the MANGROVE® framework, etc.). Such a process may include receiving information such as shape information of domain objects (e.g., as may be stored with respect to a tree structure of the PETREL® framework). Such information may be associated with the reservoir modeling framework 2220 (e.g., the INTERSECT® framework, the ECLIPSE® framework, etc.). As an example, stresses can be computed and output, for example, in relationship to natural fracture reactivation, microseismicity, etc. As an example, pressure related stress changes may be evaluated with respect to one or more operations, analyses, etc. For example, consider evaluation as to re-fracturing, another stage of fracturing, infill of a well, drilling, well survivability, etc.

As an example, a two-way coupling may be implemented, for example, via one or more pressure-dependent permeability proxies (e.g., via mechanical upscaling, etc.).

As an example, the block 2204 may provide for two-way coupling of the reservoir modeling framework 2220 and the geomechanics modeling framework 2230. The block 2204 may be implemented, for example, after performing one or more hydraulic fracturing operations. The block 2204 can include taking a reservoir production model as input and performing computations that allow for understanding of rock stresses under dynamic conditions. Such an approach can allow for analysis of one or more stress dependent parameters (e.g., consider fracture conductivity, etc.).

The block 2206 can include using stress results as inputs for one or more additional fracturing simulations. Such an approach may allow for generation of results that provide an understanding of how hydraulic fracturing can alter in-situ stresses and performance of one or more stimulation treatments (e.g., with respect to one or more nearby wells).

As an example, a method can include calculating reservoir pressures based at least in part on a production model that accounts for fracturing. In such an example, horizontal stress magnitude and direction (e.g., formation stresses) may be computed via a geomechanics model that accounts for the reservoir.

As an example, a method can include calculating reservoir pressures and fracture net pressures that can occur during hydraulic fracturing. In such an example, horizontal stress magnitude and direction (e.g., formation stresses) may be computed via a geomechanical model that accounts for the reservoir pressures and the fracture net pressures.

As an example, a method can include calculating reservoir pressures and fracture net pressures that can occur during production. In such an example, horizontal stress magnitude and direction (e.g., formation stresses) may be computed via a geomechanical model that accounts for the reservoir pressures and the fracture net pressures.

As an example, a method can include calculating pressures and formation stresses at one or more times. For example, at a first production time and at one or more additional production times, such pressures and formations stresses may be computed. As an example, where fracturing may be performed, a method may include calculating pressures and formation stresses before and/or after fracturing. As an example, a fracturing operation may be planned and/or performed in the field based at least in part on such information. As an example, a stimulation modeling framework may be used to simulate fracturing, for example, in a manner that accounts for predicted formation stresses, which may be at least in part due to depletion of fluid from a reservoir (e.g., drop in pressure in a drainage area, etc.).

As an example, a method that may utilize a stimulation modeling framework and/or results therefrom may include analyzing survivability of one or more wells. As an example, survivability may be analyzed with respect to fracturing. For example, survivability of a well may be analyzed based at least in part on a process that generates fractures (e.g., hydraulic fluid pressures, proppant characteristics, presence of chemicals, etc.). As an example, survivability of a well may be analyzed based at least in part on drainage from one or more fractures.

As an example, a method can include generating geometry of stimulated fractures (e.g., new fractures, stimulated natural fractures, etc.) as associated with a stimulation modeling framework and inputting such geometry into a geomechanics modeling framework. Such a method can include inputting one or more other stimulated fracture attributes such as, for example, pressure in a fracture, fracture width, proppant type, proppant amount, open pipe, etc.

As an example, a simulation may consider opening of a new fracture in a geologic environment where rock surrounding it can deform and develop stresses. Such a simulation may provide results as to deformation and stresses in the surrounding rock. For example, a geomechanics modeling framework may calculate stress perturbation in rock due at least in part to one or more fractures, fracturing operations, etc. As an example, calculated stress perturbations in rock may be due in part to opening and pressurization of fractures in a fracture network.

As an example, a simulation may provide results as to changes in pore pressures in rock, for example, as fluid may flow from the rock (e.g., drainage area) to fractures such that fluid in the rock may be depleted over time. As such changes in pore pressures can alter stress in rock, pore pressure information may be input to a geomechanics modeling framework to calculate stresses, strains, displacements, etc.

As an example, a method can include tracking strains over time for rock that is subjected to fracturing, which may occur via one or more stages (e.g., stages of hydraulic fracturing that generate one or more hydraulically fractured networks). As an example, a method can include tracking a drainage area with respect to time and calculating geomechanical information at one or more times with respect to changes in drainage area. For example, at a first time, a drainage area may be indicated by a pore pressure change from an initial pore pressure in rock in a fractured region. As drainage from the rock into fractures occurs, the drainage area can increase in size, which again may be indicated as a region of reduced pore pressure compared to that of surrounding rock. In such an example, a drainage area can increase over time and have a changing effect on geomechanics of a region.

As an example, where a geologic environment includes multiple reservoirs with at least one fractured reservoir, a method may include coupling reservoir modeling, stimulation modeling and geomechanical modeling to determine how operations performed with respect to one reservoir may affect one or more of the other reservoirs.

As an example, a method can include coupling stimulation modeling and geomechanical modeling, for example, to determine how stimulation such as hydraulic fracturing may affect geomechanics of a region. Such method may be performed, for example, prior to modeling of and/or actual production from a reservoir or reservoirs.

As an example, a method can include modelling hydraulic fracturing of a reservoir in a geologic environment via a stimulation modeling framework, inputting results of such modeling into a geomechanics modeling framework to model geomechanics of the geologic environment, building a production model for production of fluid from the hydraulically fractured reservoir and then modeling production of fluid from the hydraulically fractured reservoir at one or more times via a reservoir modeling framework. In such an example, one or more loops may exist for further modeling based at least in part on results of the reservoir modeling framework (e.g., to reveal effects of drainage on geomechanics, fractures, etc.).

As an example, as an example, a method can include updating porosity based at least in part on volumetric stain for purposes of reservoir fluid flow simulation. As an example, where information is known as to how permeabilities may depend on porosity, a method can include updating permeabilities for purposes of reservoir fluid flow simulation.

As an example, a method can include calculating a state of stress for a geologic environment and inputting the state of stress to a stimulation modeling framework. In such an example, consider a scenario where a first well is drilled in the geologic environment, where a stimulation treatment is applied via the first well such as, for example, hydraulic fracturing, and where the first well is in a production phase. After a period of time (e.g., months, a year, etc.), a second well may be drilled in the geologic environment where it may be in proximity to the first well. In such a scenario, as the stress field may be expected to change due to at least production via the first well, a geomechanical simulation may be performed to calculate an updated stress field. As an example, the updated stress field may be input to a stimulation modeling framework to model stimulation via the second well (e.g., hydraulic fracturing in the geologic environment as performed via the second well).

FIG. 23 shows examples of data acquisition techniques 2310 and 2330. The technique 2310 includes acquisition of image data such as image log data. The technique 2310 may acquire data that may indicate bedding features, structural features, fracture features (e.g., natural, stress-induced, hydraulic, etc.), etc. The technique 2330 includes acquisition of sonic data. The technique 2330 may acquire data that may indicate bedding features, layering features, crystalline features, cracks, fracture features, differential stress features, etc. As an example, the sonic data (e.g., seismic data) may be analyzed to provide information as to anisotropy of material or materials, for example, for anisotropy characterization (e.g., as to inputs of a model for analysis of borehole stability, instability, etc.).

As an example, a method may include analyzing how much stress given surfaces are shouldering (e.g., via fault plane, horizon, etc.). For example, a stress field, normal and shear stresses on a surface may be taken and oriented to resolve a stress state and flag one or more locations where high shear may be present. As an example, such a location may be amenable to reactivated, for example, where a well may be sheared apart.

As an example, a method can include acquiring data such as caliper data inside a borehole, a casing, etc. For example, caliper data may include radii measurements, diameter measurements, etc. Such data may be acquired with respect to orientation (e.g., azimuth) and analyzed as to characteristics of a borehole, a casing, etc. Such information may be utilized to assess survivability and to optionally update one or more parameters, etc. of a model.

As an example, a method can include acquiring information as to cement or other material that may be exterior to a casing in a borehole. For example, a scanner tool may be implemented to acquire information as to cement which may indicate whether cement is cracked, whether a microannulus exists, whether an interface is separating, etc. Such information may be utilized to assess survivability and to optionally update one or more parameters, etc. of a model.

Figure 24:
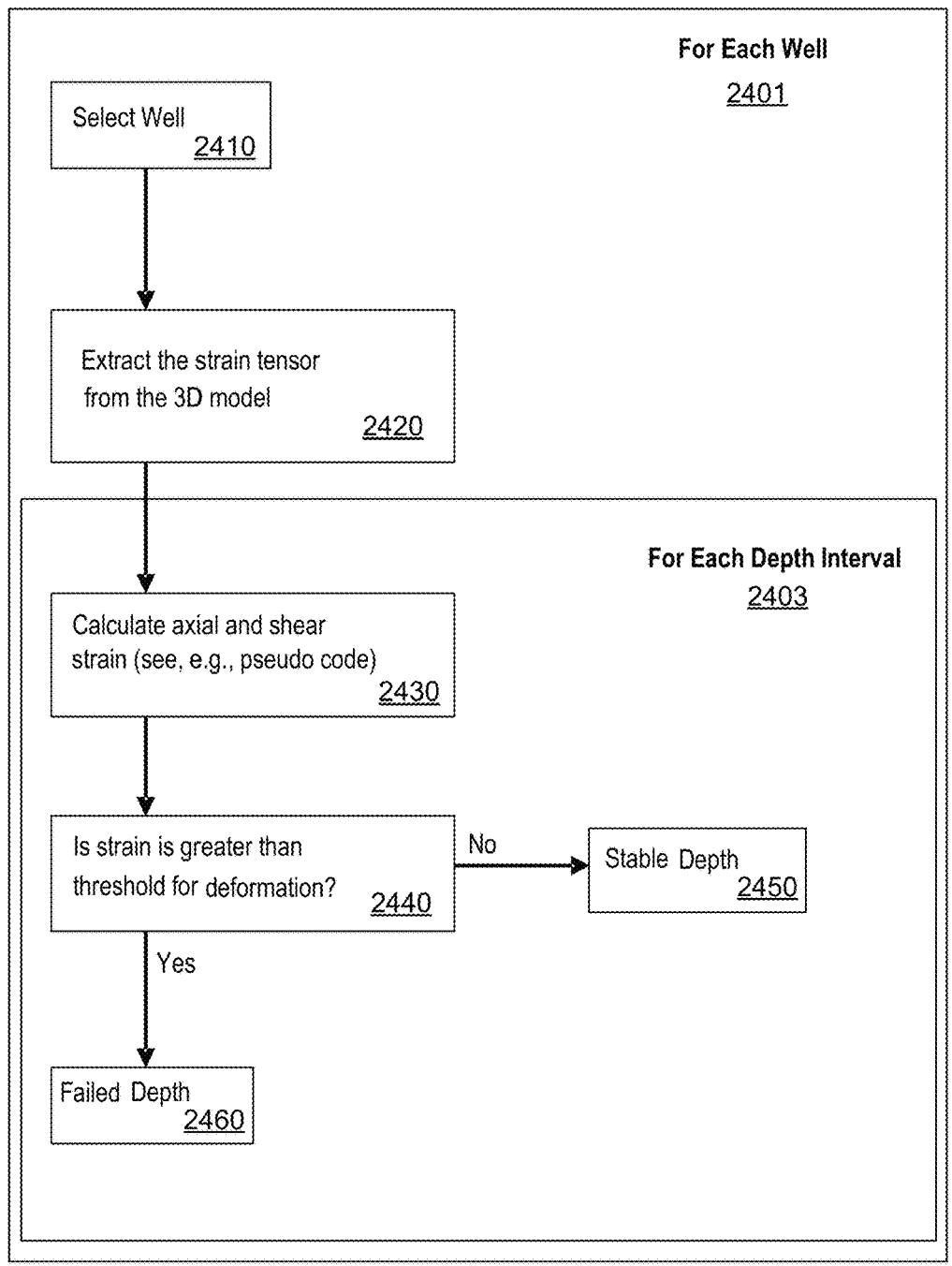
FIG. 24 illustrates an example of a method.

FIG. 24 shows an example of a method 2400 that includes an outer loop 2401 and an inner loop 2403. As shown, the method 2400 includes a selection block 2410 for selecting a well (e.g., a well trajectory), an extraction block 2420 for extracting a strain tensor from a 3D model (e.g., a MEM), a calculation block 2430 for calculating axial and shear strain (e.g., as proxy values), a decision block 2440 for deciding whether a strain value is greater than a threshold value for deformation, a stable depth output block 2450 (e.g., as to a stable depth or well trajectory location) and a failed depth output block 2460 (e.g., as to an unstable depth or well trajectory location).

An example of pseudo code follows. Such an example may optionally be implemented for calculating axial and shear strain proxies, for example, as in the calculation block 2430 of the method 2400 of FIG. 24.

```
function Well_Integrity_QL(well_W, SXX,SYY,SZZ,Txy,Tyz,Tzx)
            Inc = GetData(well_W,'INCL')
            Azi = GetData(well_W,'AZIM')
            AngleUnit='rad'
         Inc.Unit      =AngleUnit
            Azi.Unit     =AngleUnit
% Create output logs (unless they exist)
Sampling_log = CreateNew(well_W, Inc)
            E_Wa           = CreateNew(well_W, Sampling_log)
            E_Ws           = CreateNew(well_W, Sampling_log)
            E_Wa.Template          = 'Strain'
            E_Ws.emplate           = 'Strain'
% Generate well logs from grid cells - Output format controlled by right-hand
side's format
            SXX_Log = SXX * (1+0*Sampling_log)
            SXX_Log.Unit = SXX.Unit
            SXX_Log.Template = SXX.Template
            SYY_Log = SYY * (1+0*Sampling_log)
            SYY_Log.Unit = SYY.Unit
            SYY_Log.Template = SYY.Template
            SZZ_Log = SZZ * (1+0*Sampling_log)
            SZZ_Log.Unit = SZZ.Unit
            SZZ_Log.Template = SZZ.Template
            Txy_Log = Txy * (1+0*Sampling_log)
            Txy_Log.Unit = Txy.Unit
            Txy_Log.Template = Txy.Template
            Tyz_Log = Tyz * (1+0*Sampling_log)
            Tyz_Log.Unit = Tyz.Unit
            Tyz_Log.Template = Tyz.Template
            Tzx_Log = Tzx * (1+0*Sampling_log)
            Tzx_Log.Unit = Tzx.Unit
            Tzx_Log.Template = Tzx.Template
```

```
%Publish(SXX_Log,SYY_Log,SZZ_Log,Txy_Log,Tyz_Log,Tzx_Log,PP_Log,POI
SSONR_Log,TSTR_Log)
% Loop over the sampling log's depths
    for i=1:Sampling_log.Count
% Convert from X pointing East, Y pointing North and Z pointint upward
%        to X pointing North, Y pointing East and Z pointint downward
                XXI=SYY_Log(i)
                YYI=SXX_Log(i)
                ZZI=SZZ_Log(i)
                XYI=+1.0*Txy_Log(i)
                YZI=-1.0*Tzx_Log(i)
                ZXI=-1.0*Tyz_Log(i)
    %Calculate the strains axial and perpendicular to the well axis
        [E_Waxial, E_Wshear] =
Create_Well_strains(Inc(i),Azi(i),XXI,YYI,ZZI,XYI,YZI,ZXI)
                E_Wa(i)              = E_Waxial
                E_Ws(i)              = E_Wshear
        end
% Output results
                Output(E_Wa)
                Output(E_Ws)
end
```

As an example, a method can include receiving well path data and geomechanical simulation data for a geologic environment; rotating at least a portion of the geomechanical simulation data from geomechanical simulation coordinates to well coordinates associated with the well path data; determining at least one of an axial strain proxy and a shear strain proxy based at least in part on the rotating; and analyzing at least the one of the axial strain proxy and the shear strain proxy. In such an example, the well path data can include well location data and well orientation data. As an example, well orientation data can be or include angles. For example, consider inclination angle and azimuth angle. In the aforementioned method, analyzing can include assessing structural stability of well casing, well cement or well casing and well cement.

As an example, analyzing may include classifying at least a portion of a well as a member of a class by comparing an axial strain proxy to an axial strain threshold and/or classifying at least a portion of a well as a member of a class by comparing a shear strain proxy to a shear strain threshold. As an example, a method can include classifying at least a portion of a well as a member of a class by comparing an axial strain proxy to an axial strain threshold and by comparing a shear strain proxy to a shear strain threshold. As an example, a method can include updating an axial strain threshold based at least in part on field data, updating a shear strain threshold based at least in part on field data or updating an axial strain threshold and a shear strain threshold based at least in part on field data. In such an example, field data may be data indicative of a state of collapse of at least a portion of a well. For example, field data may be data acquired via a downhole tool, a lack of flow, pressure readings, etc.

As an example, a class may be associated with a risk or risks. For example, where an axial strain proxy at a location along a well path exceeds an axial strain threshold, that location may be at risk of collapse. In such an example, the risk may be classified qualitatively and/or quantitatively. For example, a risk may be low, medium or high. As an example, classifying may include determining an amount by which a proxy exceeds a corresponding threshold or by which proxies exceed corresponding thresholds. For example, where a proxy does not exceed a threshold, a class may be a low risk class, where a proxy exceeds a threshold by X percent, a class may be a medium risk class and where a proxy exceeds a threshold by Y percent, a class may be a high risk class.

As an example, geomechanical simulation data can include data associated with grid cells of a grid of a geomechanics simulator.

As an example, geomechanical simulation coordinates can be associated with a Cartesian coordinate system and the well coordinates can be associated with a cylindrical coordinate system or associated with a different Cartesian coordinate system (i.e., a Cartesian coordinate system that differs from that of the geomechanical simulation coordinates). As an example, a geomechanical simulation may be associated with spherical coordinates (e.g., depending on size of a geologic environment).

As an example, a method can include rotating a local strain tensor, for example, consider rotating a local strain tensor associated with a grid cell that is associated with a portion of geomechanical simulation data.

As an example, a method can include rotating a local strain tensor into a set of coordinate axes associated with a location of at least a portion of a path of a well. In such an example, the set of coordinate axes can include one axis aligned with a well axis of the well and two axes in a cross-sectional plane of the well.

As an example, geomechanical simulation data can be associated with a time where, for example, the time can be one of a past time, a current time or a future time. As an example, geomechanical simulation data may be associated with a period of time, which may be, for example, a period of time for production, a period of time associated with a stimulation treatment, etc. As an example, a method can include determining a proxy or proxies for a plurality of different times. In such an example, the method can include analyzing risks, etc., at one or more of the plurality of times.

As an example, a method can include performing a geomechanical simulation that outputs updated geomechanical simulation data; rotating at least a portion of the updated geomechanical simulation data from geomechanical simulation coordinates to well coordinates associated with well path data; determining at least one of an updated axial strain proxy and an updated shear strain proxy based at least in part on the rotating; and analyzing at least the one of the updated axial strain proxy and the updated shear strain proxy.

As an example, a method can include rendering information to a display based at least in part on analyzing one or more proxies.

As an example, well path data may include data for at least one well path. As an example, well coordinates may correspond to a single well.

As an example, a system can include a processor; memory; one or more modules stored in the memory where the modules include instructions executable by the processor to instruct the system and where the instructions include instructions to: receive well path data for a well path and geomechanical simulation data for a geologic environment; rotate at least a portion of the geomechanical simulation data from geomechanical simulation coordinates to well coordinates associated with the well path data; determine, for at least a portion of a well path, at least one of an axial strain proxy and a shear strain proxy; and analyze at least the one of the axial strain proxy and the shear strain proxy.

As an example, one or more computer-readable storage media (that are not signals) that include computer-executable instructions to instruct a computing system can include instructions to receive well path data for a well path and geomechanical simulation data for a geologic environment; rotate at least a portion of the geomechanical simulation data from geomechanical simulation coordinates to well coordinates associated with the well path; determine, for at least a portion of the well path, at least one of an axial strain proxy and a shear strain proxy; and analyze at least the one of the axial strain proxy and the shear strain proxy.

Figure 25:
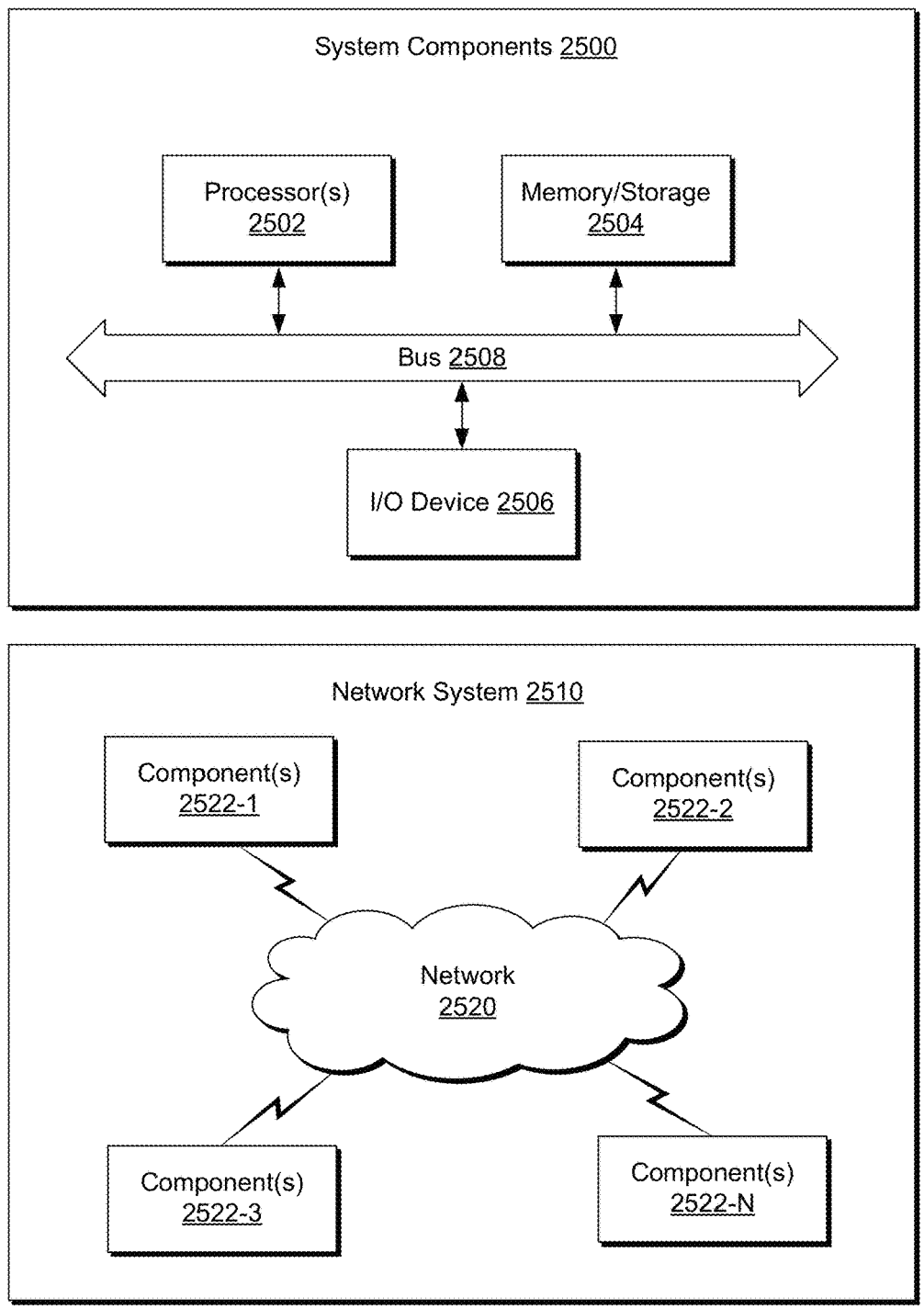
FIG. 25 illustrates example components of a system and a networked system.

FIG. 25 shows components of an example of a computing system 2500 and an example of a networked system 2510. The system 2500 includes one or more processors 2502, memory and/or storage components 2504, one or more input and/or output devices 2506 and a bus 2508. In an example embodiment, instructions may be stored in one or more computer-readable media (e.g., memory/storage components 2504). Such instructions may be read by one or more processors (e.g., the processor(s) 2502) via a communication bus (e.g., the bus 2508), which may be wired or wireless. The one or more processors may execute such instructions to implement (wholly or in part) one or more attributes (e.g., as part of a method). A user may view output from and interact with a process via an I/O device (e.g., the device 2506). In an example embodiment, a computer-readable medium may be a storage component such as a physical memory storage device, for example, a chip, a chip on a package, a memory card, etc. (e.g., a computer-readable storage medium).

In an example embodiment, components may be distributed, such as in the network system 2510. The network system 2510 includes components 2522-1, 2522-2, 2522-3, . . . , 2522-N. For example, the components 2522-1 may include the processor(s) 2502 while the component(s) 2522-3 may include memory accessible by the processor(s) 2502. Further, the component(s) 2502-2 may include an I/O device for display and optionally interaction with a method. The network may be or include the Internet, an intranet, a cellular network, a satellite network, etc.

As an example, a device may be a mobile device that includes one or more network interfaces for communication of information. For example, a mobile device may include a wireless network interface (e.g., operable via IEEE 802.11, ETSI GSM, BLUETOOTH®, satellite, etc.). As an example, a mobile device may include components such as a main processor, memory, a display, display graphics circuitry (e.g., optionally including touch and gesture circuitry), a SIM slot, audio/video circuitry, motion processing circuitry (e.g., accelerometer, gyroscope), wireless LAN circuitry, smart card circuitry, transmitter circuitry, GPS circuitry, and a battery. As an example, a mobile device may be configured as a cell phone, a tablet, etc. As an example, a method may be implemented (e.g., wholly or in part) using a mobile device. As an example, a system may include one or more mobile devices.

As an example, a system may be a distributed environment, for example, a so-called "cloud" environment where various devices, components, etc. interact for purposes of data storage, communications, computing, etc. As an example, a device or a system may include one or more components for communication of information via one or more of the Internet (e.g., where communication occurs via one or more Internet protocols), a cellular network, a satellite network, etc. As an example, a method may be implemented in a distributed environment (e.g., wholly or in part as a cloud-based service).

As an example, information may be input from a display (e.g., consider a touchscreen), output to a display or both. As an example, information may be output to a projector, a laser device, a printer, etc. such that the information may be viewed. As an example, information may be output stereographically or holographically. As to a printer, consider a 2D or a 3D printer. As an example, a 3D printer may include one or more substances that can be output to construct a 3D object. For example, data may be provided to a 3D printer to construct a 3D representation of a subterranean formation. As an example, layers may be constructed in 3D (e.g., horizons, etc.), geobodies constructed in 3D, etc. As an example, holes, fractures, etc., may be constructed in 3D (e.g., as positive structures, as negative structures, etc.).

Although only a few example embodiments have been described in detail above, those skilled in the art will readily appreciate that many modifications are possible in the example embodiments. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words "means for" together with an associated function.

What is claimed is:

1. A method comprising:
receiving well path data that defines a well path and geomechanical simulation strain data for a geologic environment that comprises a reservoir subject to a fluid flow operation;
rotating at least a portion of the strain data from geomechanical simulation coordinates to well coordinates for a plurality of positions along a length of the well path;
determining, for the plurality of positions, at least one of an axial strain proxy and a shear strain proxy based at least in part on the rotating of the stain data; and
rendering to a display the length of the well path and, for the plurality of positions, at least the one of the axial strain proxy and the shear strain proxy to indicate well integrity along the length of the well path in the geologic environment as subject to the fluid flow operation.

2. The method of claim 1 comprising assessing structural stability of well casing, well cement or well casing and well cement.

3. The method of claim 1 comprising classifying at least a portion of a well as a member of a class by comparing the axial strain proxy to an axial strain threshold.

4. The method of claim 1 comprising classifying at least a portion of a well as a member of a class by comparing the shear strain proxy to a shear strain threshold.

5. The method of claim 1 comprising classifying at least a portion of a well as a member of a class by comparing the axial strain proxy to an axial strain threshold and by comparing the shear strain proxy to a shear strain threshold.

6. The method of claim 5 comprising updating the axial strain threshold based at least in part on field data, updating the shear strain threshold based at least in part on field data or updating the axial strain threshold and the shear strain threshold based at least in part on field data.

7. The method of claim 1 the geomechanical simulation data comprises data associated with grid cells of a grid of a geomechanics simulator.

8. The method of claim 1 wherein the geomechanical simulation coordinates are associated with a Cartesian coordinate system and wherein the well coordinates are associated with a cylindrical coordinate system or associated with a different Cartesian coordinate system.

9. The method of claim 1 wherein the rotating comprises rotating a local strain tensor.

10. The method of claim 9 wherein the rotating comprises rotating a local strain tensor associated with a grid cell that is associated with a portion of the geomechanical simulation data.

11. The method of claim 1 wherein the rotating comprises rotating a local strain tensor into a set of coordinate axes associated with a location of at least a portion of a path of a well.

12. The method of claim 11 wherein the set of coordinate axes comprise one axis aligned with a well axis of the well and two axes in a cross-sectional plane of the well.

13. The method of claim 1 wherein the geomechanical simulation data are associated with a time wherein the time comprises one of a past time, a current time or a future time.

14. The method of claim 13 comprising repeating the receiving, rotating, determining and analyzing for a different time.

15. The method of claim 1 comprising performing a geomechanical simulation that outputs updated geomechanical simulation data; rotating at least a portion of the updated geomechanical simulation data from geomechanical simulation coordinates to well coordinates associated with the well path data; determining at least one of an updated axial strain proxy and an updated shear strain proxy based at least in part on the rotating; and analyzing at least the one of the updated axial strain proxy and the updated shear strain proxy.

16. The method of claim 1 wherein the well path data comprise data for at least one well path.

17. The method of claim 1 wherein the well coordinates correspond to a single well.

18. A system comprising:
a processor;
memory;
instructions stored in the memory and executable by the processor to instruct the system and wherein the instructions comprise instructions to:
receive well path data that defines a well path and geomechanical simulation strain data for a geologic environment that comprises a reservoir subject to a fluid flow operation;
rotate at least a portion of the strain data from geomechanical simulation coordinates to well coordinates for a plurality of positions along a length of the well path;
determine, for the plurality of positions, at least one of an axial strain proxy and a shear strain proxy based at least in part on the rotation of the stain data; and
render to a display the length of the well path and, for the plurality of positions, at least the one of the axial strain proxy and the shear strain proxy to indicate well integrity along the length of the well path in the geologic environment as subject to the fluid flow operation.

19. One or more non-transitory computer-readable storage media that comprise computer-executable instructions to instruct a computing system wherein the instructions comprise instructions to:
receive well path data that defines a well path and geomechanical simulation strain data for a geologic environment that comprises a reservoir subject to a fluid flow operation;
rotate at least a portion of the strain data from geomechanical simulation coordinates to well coordinates for a plurality of positions along a length of the well path;
determine, for the plurality of positions, at least one of an axial strain proxy and a shear strain proxy based at least in part on the rotation of the stain data; and
render to a display the length of the well path and, for the plurality of positions, at least the one of the axial strain proxy and the shear strain proxy to indicate well integrity along the length of the well path in the geologic environment as subject to the fluid flow operation.

* * * * *